US010756232B2

(12) United States Patent
Yamazaki et al.

(10) Patent No.: US 10,756,232 B2
(45) Date of Patent: Aug. 25, 2020

(54) SEMICONDUCTOR DEVICE INCLUDING SEMICONDUCTOR LAYER

(71) Applicant: Semiconductor Energy Laboratory Co., Ltd., Atsugi-shi, Kanagawa-ken (JP)

(72) Inventors: Shunpei Yamazaki, Tokyo (JP); Miyuki Hosoba, Kanagawa (JP); Suzunosuke Hiraishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/196,091

(22) Filed: Nov. 20, 2018

(65) Prior Publication Data
US 2019/0109259 A1    Apr. 11, 2019

Related U.S. Application Data

(63) Continuation of application No. 15/685,005, filed on Aug. 24, 2017, now Pat. No. 10,396,236, which is a (Continued)

(30) Foreign Application Priority Data

Nov. 27, 2009   (JP) ................. 2009-270784

(51) Int. Cl.
*H01L 33/00*   (2010.01)
*H01L 27/12*   (2006.01)
(Continued)

(52) U.S. Cl.
CPC ........ *H01L 33/0041* (2013.01); *H01L 27/124* (2013.01); *H01L 27/1225* (2013.01);
(Continued)

(58) Field of Classification Search
CPC ............. H01L 33/0041; H01L 27/3262; H01L 29/7869; H01L 27/124
See application file for complete search history.

(56) References Cited

U.S. PATENT DOCUMENTS 3,775,693 A    11/1973 Proebsting
4,242,700 A    12/1980 Weimer
(Continued)

FOREIGN PATENT DOCUMENTS

CN    002724266 Y    9/2005
CN    001751393 A    3/2006
(Continued)

OTHER PUBLICATIONS

Hatano.M et al., "A Novel Self-Aligned Gate-Overlapped LDD Poly-Si TFT With High Reliability and Performance", IEDM 97: Technical Digest of International Electron Devices Meeting, Dec. 7, 1997, pp. 523-526.
(Continued)

*Primary Examiner* — Quoc D Hoang
(74) *Attorney, Agent, or Firm* — Fish & Richardson P.C.

(57)                ABSTRACT

Disclosed is a semiconductor device comprising a thin film transistor and wirings connected to the thin film transistor, in which the thin film transistor has a channel formation region in an oxide semiconductor layer, and a copper metal is used for at least one of a gate electrode, a source electrode, a drain electrode, a gate wiring, a source wiring, and a drain wiring. The extremely low off current of the transistor with the oxide semiconductor layer contributes to reduction in power consumption of the semiconductor device. Additionally, the use of the copper metal allows the combination of the semiconductor device with a display element to provide a display device with high display quality and negligible defects,
(Continued)

which results from the low electrical resistance of the wirings and electrodes formed with the copper metal.

30 Claims, 40 Drawing Sheets

Related U.S. Application Data continuation of application No. 13/899,736, filed on May 22, 2013, now Pat. No. 9,748,436, which is a continuation of application No. 12/954,181, filed on Nov. 24, 2010, now Pat. No. 8,471,256.

(51) Int. Cl.
*H01L 29/786* (2006.01)
*G02F 1/1368* (2006.01)
*H01L 27/32* (2006.01)

(52) U.S. Cl.
CPC ........ *H01L 29/7869* (2013.01); *G02F 1/1368* (2013.01); *H01L 27/3262* (2013.01); *H01L 2924/0002* (2013.01)

(56) References Cited

U.S. PATENT DOCUMENTS

| | | |
|---|---|---|
| 4,447,272 A | 5/1984 | Saks |
| 4,800,303 A | 1/1989 | Graham et al. |
| 4,837,566 A | 6/1989 | Channing et al. |
| 5,039,883 A | 8/1991 | On |
| 5,153,690 A | 10/1992 | Tsukada et al. |
| 5,264,728 A | 11/1993 | Ikeda et al. |
| 5,366,922 A | 11/1994 | Aoki et al. |
| 5,415,920 A | 5/1995 | Satoh et al. |
| 5,434,520 A | 7/1995 | Yetter et al. |
| 5,583,067 A | 12/1996 | Sanchez |
| 5,620,910 A | 4/1997 | Teramoto |
| 5,623,157 A | 4/1997 | Miyazaki et al. |
| 5,661,751 A | 8/1997 | Johnson |
| 5,686,328 A | 11/1997 | Zhang et al. |
| 5,719,065 A | 2/1998 | Takemura et al. |
| 5,731,856 A | 3/1998 | Kim et al. |
| 5,744,864 A | 4/1998 | Cillessen et al. |
| 5,796,650 A | 8/1998 | Wik et al. |
| 5,851,866 A | 12/1998 | Son |
| 5,936,881 A | 8/1999 | Kawashima et al. |
| 5,980,092 A | 11/1999 | Merryman et al. |
| 6,049,883 A | 4/2000 | Tjandrasuwita |
| 6,078,194 A | 6/2000 | Lee |
| 6,171,910 B1 | 1/2001 | Hobbs et al. |
| 6,195,786 B1 | 2/2001 | Raghunathan et al. |
| 6,204,695 B1 | 3/2001 | Alfke et al. |
| 6,225,168 B1 | 5/2001 | Gardner et al. |
| 6,259,200 B1 * | 7/2001 | Morita .............. G02F 1/136286 313/498 |
| 6,266,269 B1 | 7/2001 | Karp et al. |
| 6,271,573 B1 | 8/2001 | Suguro |
| 6,281,710 B1 | 8/2001 | Poirier et al. |
| 6,294,274 B1 | 9/2001 | Kawazoe et al. |
| 6,304,122 B1 | 10/2001 | Gregor et al. |
| 6,359,320 B1 | 3/2002 | Yamazaki et al. |
| 6,479,900 B1 | 11/2002 | Shinogi et al. |
| 6,509,649 B1 | 1/2003 | Sugai |
| 6,515,365 B2 | 2/2003 | Higashi et al. |
| 6,563,174 B2 | 5/2003 | Kawasaki et al. |
| 6,573,564 B2 | 6/2003 | Yamazaki et al. |
| 6,573,602 B2 | 6/2003 | Seo et al. |
| 6,573,754 B2 | 6/2003 | Menczigar et al. |
| 6,576,926 B1 | 6/2003 | Yamazaki et al. |
| 6,600,524 B1 | 7/2003 | Ando et al. |
| 6,614,083 B1 | 9/2003 | Yamazaki et al. |
| 6,628,551 B2 | 9/2003 | Jain |
| 6,693,297 B2 | 2/2004 | Tsujimura et al. |
| 6,727,522 B1 | 4/2004 | Kawasaki et al. |
| 6,737,306 B2 | 5/2004 | Yamazaki et al. |
| 6,745,336 B1 | 6/2004 | Martonosi et al. |
| 6,765,270 B2 | 7/2004 | Chae |
| 6,808,971 B2 | 10/2004 | Bhattacharyya |
| 6,821,655 B1 | 11/2004 | Ohta |
| 6,822,478 B2 | 11/2004 | Elappuparackal |
| 6,933,533 B2 | 8/2005 | Yamazaki et al. |
| 6,953,951 B2 | 10/2005 | Yamazaki et al. |
| 6,987,059 B1 | 1/2006 | Burke et al. |
| 7,049,190 B2 | 5/2006 | Takeda et al. |
| 7,061,014 B2 | 6/2006 | Hosono et al. |
| 7,061,565 B2 | 6/2006 | Kwon et al. |
| 7,064,346 B2 | 6/2006 | Kawasaki et al. |
| 7,072,374 B2 | 7/2006 | Matsumura |
| 7,076,748 B2 | 7/2006 | Kapoor et al. |
| 7,105,868 B2 | 9/2006 | Nause et al. |
| 7,176,535 B2 | 2/2007 | Chae |
| 7,190,358 B2 | 3/2007 | Hiroki |
| 7,205,568 B2 | 4/2007 | Watanabe et al. |
| 7,211,825 B2 | 5/2007 | Shih et al. |
| 7,229,569 B1 | 6/2007 | Seki et al. |
| 7,282,782 B2 | 10/2007 | Hoffman et al. |
| 7,292,672 B2 | 11/2007 | Isono |
| 7,297,977 B2 | 11/2007 | Hoffman et al. |
| 7,323,356 B2 | 1/2008 | Hosono et al. |
| 7,327,169 B2 | 2/2008 | Osame |
| 7,385,224 B2 | 6/2008 | Ishii et al. |
| 7,402,506 B2 | 7/2008 | Levy et al. |
| 7,411,209 B2 | 8/2008 | Endo et al. |
| 7,442,324 B2 | 10/2008 | Seki et al. |
| 7,453,065 B2 | 11/2008 | Saito et al. |
| 7,453,087 B2 | 11/2008 | Iwasaki |
| 7,456,430 B1 | 11/2008 | Yamazaki et al. |
| 7,462,862 B2 | 12/2008 | Hoffman et al. |
| 7,468,304 B2 | 12/2008 | Kaji et al. |
| 7,495,644 B2 | 2/2009 | Hirakata |
| 7,501,293 B2 | 3/2009 | Ito et al. |
| 7,535,259 B2 | 5/2009 | Osame et al. |
| 7,576,394 B2 | 8/2009 | Furuta et al. |
| 7,576,582 B2 | 8/2009 | Lee et al. |
| 7,595,665 B2 | 9/2009 | Park et al. |
| 7,601,984 B2 | 10/2009 | Sano et al. |
| 7,615,495 B2 | 11/2009 | Fujikawa et al. |
| 7,652,740 B2 | 1/2010 | Hwang et al. |
| 7,674,650 B2 | 3/2010 | Akimoto et al. |
| 7,687,331 B2 | 3/2010 | Kim et al. |
| 7,700,495 B2 | 4/2010 | Doi et al. |
| 7,732,819 B2 | 6/2010 | Akimoto et al. |
| 7,737,517 B2 | 6/2010 | Kawamura et al. |
| 7,741,644 B2 | 6/2010 | Lyu et al. |
| 7,750,422 B2 | 7/2010 | Watanabe et al. |
| 7,767,106 B2 | 8/2010 | Chang |
| 7,776,662 B2 | 8/2010 | Wang et al. |
| 7,791,074 B2 | 9/2010 | Iwasaki |
| 7,821,065 B2 | 10/2010 | Murakami et al. |
| 7,855,380 B2 | 12/2010 | Yamazaki et al. |
| 7,863,607 B2 | 1/2011 | Lee et al. |
| 7,910,490 B2 | 3/2011 | Akimoto et al. |
| 7,915,650 B2 | 3/2011 | Lee et al. |
| 7,919,365 B2 | 4/2011 | Kim et al. |
| 7,932,521 B2 | 4/2011 | Akimoto et al. |
| 7,981,734 B2 | 7/2011 | Furuta et al. |
| 7,998,372 B2 | 8/2011 | Yano et al. |
| 8,003,449 B2 | 8/2011 | Akimoto et al. |
| 8,013,331 B2 | 9/2011 | Wakita |
| 8,017,459 B2 | 9/2011 | Yang et al. |
| 8,039,836 B2 | 10/2011 | Chang |
| 8,063,421 B2 | 11/2011 | Kang et al. |
| 8,071,981 B2 | 12/2011 | Yamazaki et al. |
| 8,129,721 B2 | 3/2012 | Yamazaki et al. |
| 8,134,156 B2 | 3/2012 | Akimoto |
| 8,143,115 B2 | 3/2012 | Omura et al. |
| 8,148,721 B2 | 4/2012 | Hayashi et al. |
| 8,158,464 B2 | 4/2012 | Akimoto |
| 8,178,926 B2 | 5/2012 | Nakayama |
| 8,183,102 B2 | 5/2012 | Yamazaki et al. |
| 8,207,756 B2 | 6/2012 | Shionoiri et al. |
| 8,258,023 B2 | 9/2012 | Lee |
| 8,274,077 B2 | 9/2012 | Akimoto et al. |

(56) References Cited

U.S. PATENT DOCUMENTS

| | | |
|---|---|---|
| 8,304,773 B2 | 11/2012 | Shimada |
| 8,344,379 B2 | 1/2013 | Fujikawa et al. |
| 8,354,674 B2 | 1/2013 | Kimura |
| 8,368,079 B2 | 2/2013 | Akimoto |
| 8,384,077 B2 | 2/2013 | Yano et al. |
| 8,399,313 B2 | 3/2013 | Akimoto et al. |
| 8,445,962 B2 | 5/2013 | Murakami et al. |
| 8,466,463 B2 | 6/2013 | Akimoto et al. |
| 8,471,256 B2 | 6/2013 | Yamazaki et al. |
| 8,476,633 B2 | 7/2013 | Yoo et al. |
| 8,497,507 B2 | 7/2013 | Yang |
| 8,525,165 B2 | 9/2013 | Akimoto |
| 8,629,069 B2 | 1/2014 | Akimoto et al. |
| 8,642,402 B2 | 2/2014 | Yano et al. |
| 8,669,550 B2 | 3/2014 | Akimoto et al. |
| 8,748,879 B2 | 6/2014 | Yano et al. |
| 8,790,959 B2 | 7/2014 | Akimoto et al. |
| 8,796,069 B2 | 8/2014 | Akimoto et al. |
| 8,847,316 B2 | 9/2014 | Murakami et al. |
| 8,946,005 B2 | 2/2015 | Lee et al. |
| 9,035,312 B2 | 5/2015 | Choi et al. |
| 9,130,045 B2 | 9/2015 | Lee |
| 9,153,604 B2 | 10/2015 | Murakami et al. |
| 9,748,436 B2 | 8/2017 | Yamazaki et al. |
| 2001/0013796 A1 | 8/2001 | Li et al. |
| 2001/0046027 A1 | 11/2001 | Tai et al. |
| 2002/0036529 A1 | 3/2002 | Furusawa et al. |
| 2002/0056838 A1 | 5/2002 | Ogawa |
| 2002/0119606 A1 | 8/2002 | Hamada et al. |
| 2002/0132454 A1 | 9/2002 | Ohtsu et al. |
| 2002/0163457 A1 | 11/2002 | Azami et al. |
| 2003/0027380 A1 | 2/2003 | Yamazaki |
| 2003/0036529 A1 | 2/2003 | Christianson et al. |
| 2003/0107023 A1* | 6/2003 | Chae ......... C23F 1/18 252/79.1 |
| 2003/0124778 A1 | 7/2003 | Doi et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0061542 A1 | 4/2004 | Osame et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0127380 A1 | 6/2005 | Kawasaki et al. |
| 2005/0140265 A1 | 6/2005 | Hirakata |
| 2005/0199959 A1 | 9/2005 | Chiang et al. |
| 2006/0035452 A1 | 2/2006 | Carcia et al. |
| 2006/0038582 A1 | 2/2006 | Peeters |
| 2006/0043377 A1 | 3/2006 | Hoffman et al. |
| 2006/0082400 A1 | 4/2006 | Isono |
| 2006/0086978 A1 | 4/2006 | Kobayashi |
| 2006/0091793 A1 | 5/2006 | Baude et al. |
| 2006/0108529 A1 | 5/2006 | Saito et al. |
| 2006/0108587 A1 | 5/2006 | Lee et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118793 A1 | 6/2006 | Yang et al. |
| 2006/0119394 A1 | 6/2006 | Dronavalli |
| 2006/0148141 A1 | 7/2006 | Seo et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0249733 A1 | 11/2006 | Yamazaki et al. |
| 2006/0261338 A1 | 11/2006 | Yamazaki et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024318 A1 | 2/2007 | Mamidipaka |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0115219 A1 | 5/2007 | Inoue |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0224791 A1 | 9/2007 | Takayama et al. |
| 2007/0235685 A1 | 10/2007 | Seki et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0032444 A1 | 2/2008 | Wu et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0150587 A1 | 6/2008 | Osame et al. |
| 2008/0165158 A1 | 7/2008 | Hotelling et al. |
| 2008/0166834 A1 | 7/2008 | Kim et al. |
| 2008/0179598 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277663 A1 | 11/2008 | Kang et al. |
| 2008/0283840 A1 | 11/2008 | Doi et al. |
| 2008/0284935 A1* | 11/2008 | Takahashi ......... G02F 1/136286 349/46 |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008638 A1 | 1/2009 | Kang et al. |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0098673 A1 | 4/2009 | Yang et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0173944 A1 | 7/2009 | Chen et al. |
| 2009/0186445 A1 | 7/2009 | Akimoto |
| 2009/0189153 A1 | 7/2009 | Iwasaki et al. |
| 2009/0189155 A1 | 7/2009 | Akimoto |
| 2009/0201077 A1 | 8/2009 | Osame et al. |
| 2009/0237000 A1 | 9/2009 | Inoue |
| 2009/0239335 A1 | 9/2009 | Akimoto et al. |
| 2009/0263965 A1 | 10/2009 | Gordon et al. |
| 2009/0269880 A1 | 10/2009 | Itagaki et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0025675 A1 | 2/2010 | Yamazaki et al. |
| 2010/0025679 A1 | 2/2010 | Yamazaki et al. |
| 2010/0051934 A1 | 3/2010 | Choung et al. |

(56) References Cited

U.S. PATENT DOCUMENTS

| | | |
|---|---|---|
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0102322 A1* | 4/2010 | Matsumura ......... H01L 27/1214 257/59 |
| 2010/0109002 A1 | 5/2010 | Itagaki et al. |
| 2010/0109004 A1* | 5/2010 | Arai ................. H01L 27/1225 257/43 |
| 2010/0136743 A1 | 6/2010 | Akimoto et al. |
| 2010/0193785 A1 | 8/2010 | Kimura |
| 2010/0276689 A1 | 11/2010 | Iwasaki |
| 2010/0279462 A1 | 11/2010 | Iwasaki |
| 2010/0289020 A1 | 11/2010 | Yano et al. |
| 2010/0295042 A1 | 11/2010 | Yano et al. |
| 2011/0006302 A1 | 1/2011 | Yamazaki et al. |
| 2011/0012106 A1 | 1/2011 | Yamazaki et al. |
| 2011/0012116 A1 | 1/2011 | Yamazaki et al. |
| 2011/0017995 A1 | 1/2011 | Yamazaki et al. |
| 2011/0031493 A1 | 2/2011 | Yamazaki et al. |
| 2011/0031497 A1 | 2/2011 | Yamazaki et al. |
| 2011/0032444 A1 | 2/2011 | Yamazaki et al. |
| 2011/0049518 A1 | 3/2011 | Noda |
| 2011/0062432 A1 | 3/2011 | Yamazaki et al. |
| 2011/0062436 A1 | 3/2011 | Yamazaki et al. |
| 2011/0068334 A1 | 3/2011 | Yamazaki et al. |
| 2011/0068335 A1 | 3/2011 | Yamazaki et al. |
| 2011/0068852 A1 | 3/2011 | Yamazaki et al. |
| 2011/0084264 A1 | 4/2011 | Yamazaki et al. |
| 2011/0084266 A1 | 4/2011 | Yamazaki et al. |
| 2011/0084267 A1 | 4/2011 | Yamazaki et al. |
| 2011/0084268 A1 | 4/2011 | Yamazaki et al. |
| 2011/0084269 A1 | 4/2011 | Yamazaki et al. |
| 2011/0084270 A1 | 4/2011 | Yamazaki |
| 2011/0084271 A1 | 4/2011 | Yamazaki et al. |
| 2011/0084272 A1 | 4/2011 | Miyanaga et al. |
| 2011/0089417 A1 | 4/2011 | Yamazaki et al. |
| 2011/0092017 A1 | 4/2011 | Akimoto et al. |
| 2011/0104851 A1 | 5/2011 | Akimoto et al. |
| 2011/0108834 A1 | 5/2011 | Yamazaki et al. |
| 2011/0108837 A1 | 5/2011 | Yamazaki et al. |
| 2011/0109351 A1 | 5/2011 | Yamazaki et al. |
| 2011/0114943 A1 | 5/2011 | Yamazaki et al. |
| 2011/0121290 A1 | 5/2011 | Akimoto et al. |
| 2011/0121878 A1 | 5/2011 | Kato et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0127579 A1 | 6/2011 | Yamazaki |
| 2011/0133180 A1 | 6/2011 | Yamazaki |
| 2011/0133191 A1 | 6/2011 | Yamazaki |
| 2011/0136301 A1 | 6/2011 | Yamazaki et al. |
| 2011/0147739 A1 | 6/2011 | Yamazaki et al. |
| 2011/0151618 A1 | 6/2011 | Yamazaki et al. |
| 2011/0156026 A1 | 6/2011 | Yamazaki et al. |
| 2011/0210325 A1 | 9/2011 | Sakakura et al. |
| 2011/0210328 A1 | 9/2011 | Yamazaki et al. |
| 2011/0210355 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2012/0168750 A1 | 7/2012 | Hayashi et al. |
| 2012/0168763 A1 | 7/2012 | Yamazaki et al. |
| 2013/0146452 A1 | 6/2013 | Yano et al. |
| 2019/0157499 A1* | 5/2019 | Yamazaki ............. H01L 27/124 |

FOREIGN PATENT DOCUMENTS

| | | |
|---|---|---|
| CN | 001786801 A | 6/2006 |
| CN | 101257048 A | 9/2008 |
| CN | 101335304 A | 12/2008 |
| EP | 1422798 A | 5/2004 |
| EP | 1650807 A | 4/2006 |
| EP | 1737044 A | 12/2006 |
| EP | 1770788 A | 4/2007 |
| EP | 1788633 A | 5/2007 |
| EP | 1950804 A | 7/2008 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 54-104272 A | 8/1979 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-197004 A | 7/1994 |
| JP | 07-326756 A | 12/1995 |
| JP | 08-264794 A | 10/1996 |
| JP | 10-229200 A | 8/1998 |
| JP | 11-505377 | 5/1999 |
| JP | 11-274504 A | 10/1999 |
| JP | 2000-044236 A | 2/2000 |
| JP | 2000-150900 A | 5/2000 |
| JP | 2000-353809 A | 12/2000 |
| JP | 2001-059191 A | 3/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-258226 A | 9/2003 |
| JP | 2004-103957 A | 4/2004 |
| JP | 2004-133422 A | 4/2004 |
| JP | 2004-163901 A | 6/2004 |
| JP | 2004-273614 A | 9/2004 |
| JP | 2004-273732 A | 9/2004 |
| JP | 2006-179878 A | 7/2006 |
| JP | 2006-191015 A | 7/2006 |
| JP | 2007-073700 A | 3/2007 |
| JP | 2007-073705 A | 3/2007 |
| JP | 2007-096055 A | 4/2007 |
| JP | 2007-123861 A | 5/2007 |
| JP | 2007-134496 A | 5/2007 |
| JP | 2007-142195 A | 6/2007 |
| JP | 2007-150158 A | 6/2007 |
| JP | 2007-157916 A | 6/2007 |
| JP | 2007-165860 A | 6/2007 |
| JP | 2007-284342 A | 11/2007 |
| JP | 2008-042067 A | 2/2008 |
| JP | 2008-166716 A | 7/2008 |
| JP | 2008-166789 A | 7/2008 |
| JP | 2008-535205 | 8/2008 |
| JP | 2008-219008 A | 9/2008 |
| JP | 2008-219882 A | 9/2008 |
| JP | 2009-021480 A | 1/2009 |
| JP | 2009-033145 A | 2/2009 |
| JP | 2009-070881 A | 4/2009 |
| JP | 2009-099887 A | 5/2009 |
| JP | 2009-105390 A | 5/2009 |
| JP | 2009-141001 A | 6/2009 |
| JP | 2009-152633 A | 7/2009 |
| JP | 2009-158940 A | 7/2009 |
| JP | 2009-198632 A | 9/2009 |
| JP | 2009-231664 A | 10/2009 |
| JP | 2009-235204 A | 10/2009 |
| JP | 2009-253204 A | 10/2009 |
| JP | 2009-260378 A | 11/2009 |
| JP | 2011-077116 A | 4/2011 |
| KR | 2002-0028430 A | 4/2002 |
| KR | 10-0382955 | 5/2003 |
| KR | 2008-0070313 A | 7/2008 |
| KR | 2008-0087744 A | 10/2008 |
| KR | 2008-0095603 A | 10/2008 |
| KR | 2008-0109998 A | 12/2008 |
| KR | 2008-0110059 A | 12/2008 |
| TW | 200625625 | 7/2006 |
| TW | I290372 | 11/2007 |
| TW | 200846991 | 12/2008 |

(56) References Cited

FOREIGN PATENT DOCUMENTS

| TW | 200915579 | 4/2009 |
|---|---|---|
| TW | 200937638 | 9/2009 |
| TW | 200941729 | 10/2009 |
| WO | WO-2004/073069 | 8/2004 |
| WO | WO-2004/114391 | 12/2004 |
| WO | WO-2007/029584 | 3/2007 |
| WO | WO-2007/058329 | 5/2007 |
| WO | WO-2007/089048 | 8/2007 |
| WO | WO-2007/108406 | 9/2007 |
| WO | WO-2007/148601 | 12/2007 |
| WO | WO-2008/069056 | 6/2008 |
| WO | WO-2008/069255 | 6/2008 |
| WO | WO-2008/096768 | 8/2008 |
| WO | WO-2008/133456 | 11/2008 |
| WO | WO-2008/136505 | 11/2008 |
| WO | WO-2009/034953 | 3/2009 |
| WO | WO-2009/035471 | 3/2009 |
| WO | WO-2009/072533 | 6/2009 |
| WO | WO-2009/075281 | 6/2009 |
| WO | WO-2009/093625 | 7/2009 |

OTHER PUBLICATIONS

Wolf.S, "4.5.6.3 Contact-Hole and Via Filling With Selective Electroless Metal Deposition", Silicon Processing for the VLSI Era, 1990, vol. 2, pp. 256-257, Lattice Press.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and GaZO3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor", Science, May 23, 2003, vol. 300, No. 5623, pp. 1269-1272.

Invitation to pay additional fees (application No. PCT/JP2010/069761) , International Searching Authority, dated Dec. 7, 2010.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID DIGEST '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.S et al., "42.3: Transparent ZnO Thin Film Transistor for the Application of High Aperture Ratio Bottom Emission AM-OLED Display", SID Digest '08 : SID Internationali Symposiunt Digest of Technical Papers, May 20, 2008, vol. 39, pp. 629-632.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Taiwanese Office Action (Application No. 99138827) dated Jan. 8, 2014.

Chinese Office Action (Application No. 201080053374.X) dated Jul. 3, 2014.

Korean Office Action (Application No. 2013-7020127) dated Jul. 29, 2014.

Chinese Office Action (Application No. 201310303972.3) dated Jun. 5, 2015.

Chinese Office Action (Application No. 201310303981.2) dated Jul. 31, 2015.

(56) References Cited

OTHER PUBLICATIONS

Taiwanese Office Action (Application No. 103124739) dated Dec. 3, 2015.
Chinese Office Action (Application No. 201310303972.3) dated Jan. 28, 2016.
Taiwanese Office Action (Application No. 105111844) dated Oct. 3, 2016.
Korean Office Action (Application No. 2012-7016417) dated Feb. 14, 2017.
Taiwanese Office Action (Application No. 106103516) dated Oct. 6, 2017.

* cited by examiner

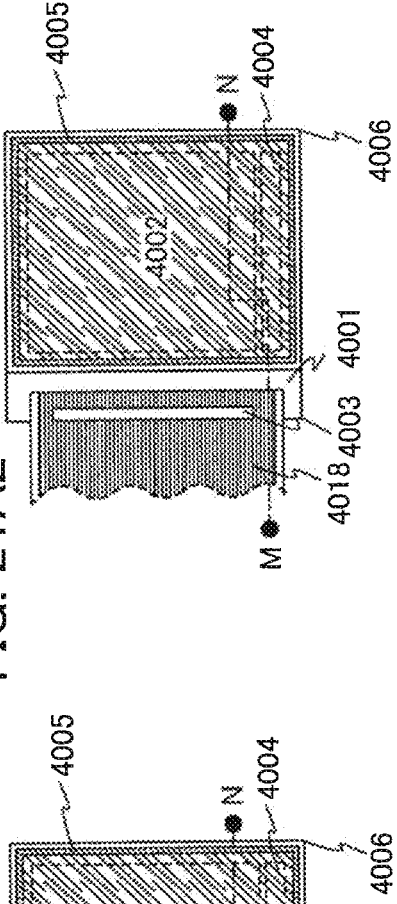
FIG. 21A1
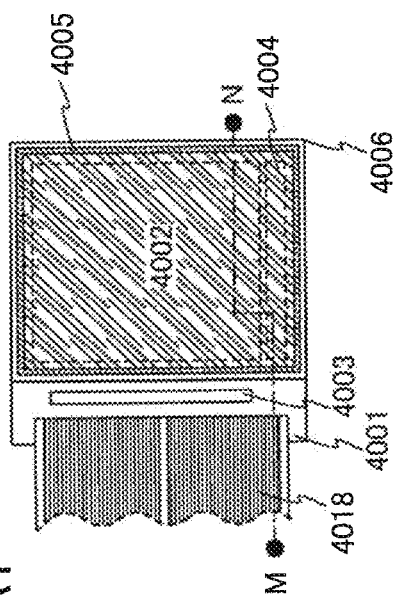
FIG. 21A2
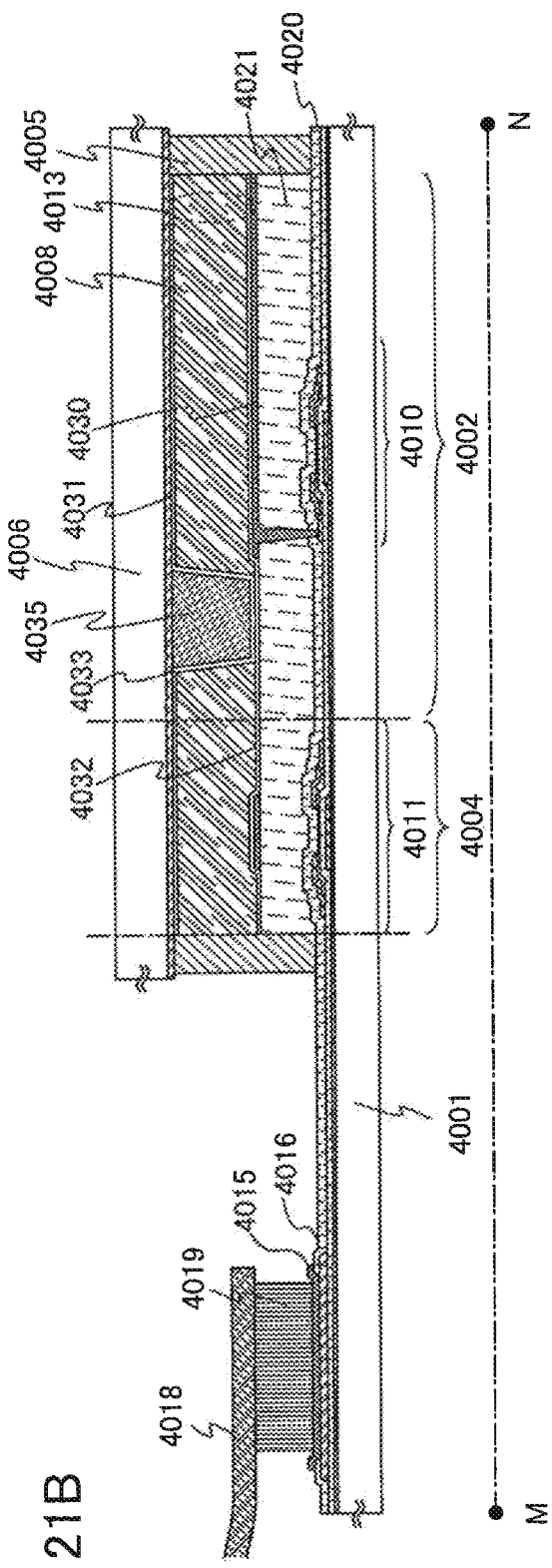
FIG. 21B

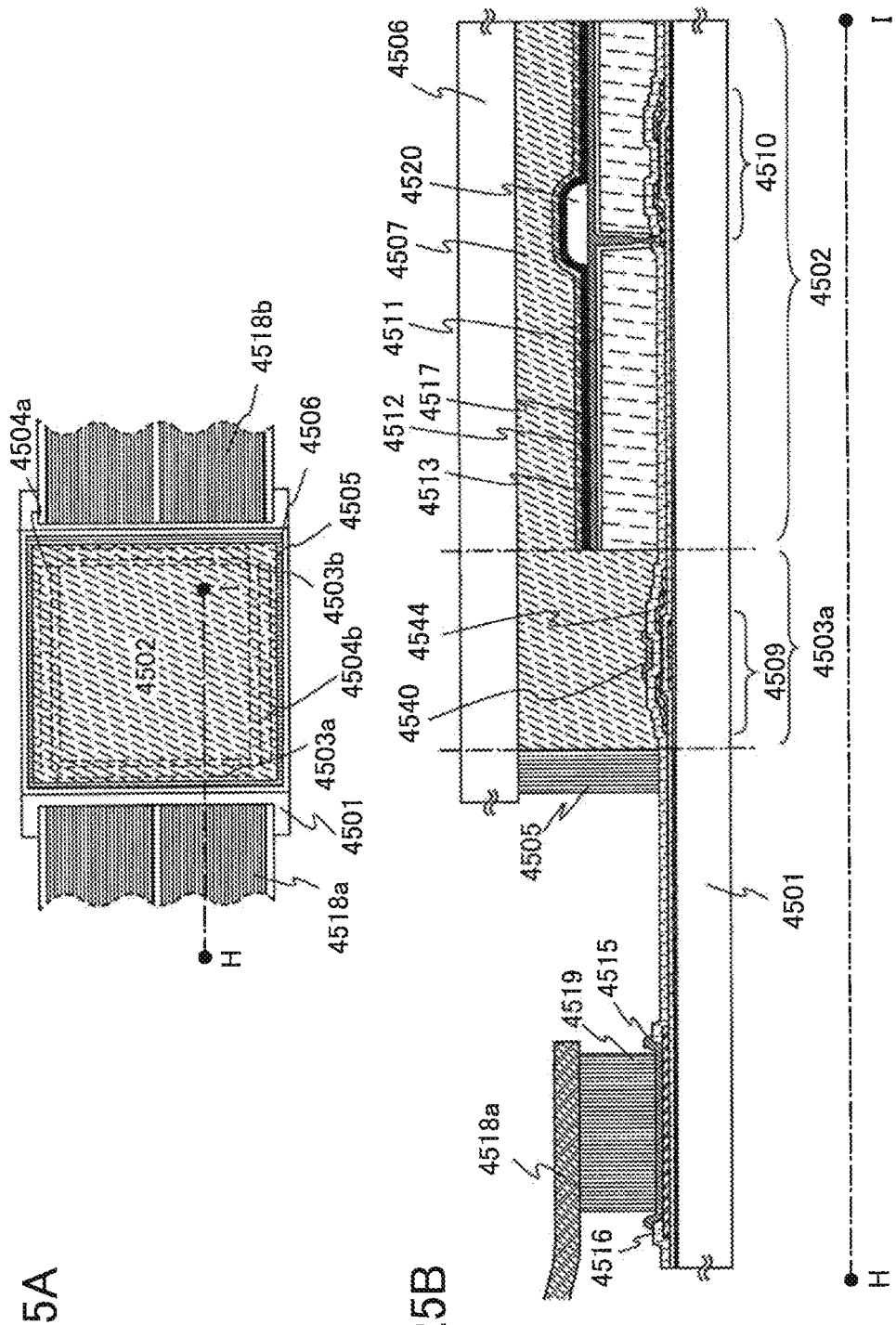

SEMICONDUCTOR DEVICE INCLUDING SEMICONDUCTOR LAYER

CROSS-REFERENCE TO RELATED APPLICATIONS

This application is a continuation of U.S. application Ser. No. 15/685,005, filed Aug. 24, 2017, now allowed, which is a continuation of U.S. application Ser. No. 13/899,736, filed May 22, 2013, now U.S. Pat. No. 9,748,436, which is a continuation of U.S. application Ser. No. 12/954,181, filed Nov. 24, 2010, now U.S. Pat. No. 8,471,256, which claims the benefit of a foreign priority application filed in Japan as Serial No. 2009-270784 on Nov. 27, 2009, all of which are incorporated by reference.

TECHNICAL FIELD

The present invention relates to a semiconductor device including a semiconductor element and a manufacturing method thereof.

Note that a semiconductor device in this specification indicates all the devices that can operate by using semiconductor characteristics, and semiconductor elements such as transistors; and electro-optical devices, semiconductor circuits, and electronic appliances which include the semiconductor element are all included in the category of the semiconductor devices.

BACKGROUND ART

In recent years, a technique by which transistors are manufactured using an oxide semiconductor as a semiconductor material and the transistors are applied to semiconductor circuits, ICs, electro-optical devices, electronic appliances and the like has attracted attention.

For example, Patent Document 1 and Patent Document 2 disclose a technique with which a thin film transistor (also referred to as a TFT) is manufactured using a semiconductor thin film (a thickness of about several nanometers to several hundreds nanometers) including zinc oxide, an In—Ga—Zn—O-based oxide semiconductor, or the like over a substrate having an insulating surface, and such a TFT is used for a switching element of an image display device.

The conventional transistor is manufactured mainly using a semiconductor material such as amorphous silicon or polycrystalline silicon. The TFT using amorphous silicon has a low electric field-effect mobility but can relatively easily respond to an increase in size of a manufacturing substrate such as a glass substrate. On the other hand, the TFT using polycrystalline silicon has a high electric field-effect mobility, but needs a crystallization step such as laser annealing and is not always adaptable to an increase in size of a manufacturing substrate such as a glass substrate.

In contrast, a TFT in which a channel formation region (also referred to as a channel region) is provided in an oxide semiconductor can have higher field-effect mobility than a TFT using amorphous silicon. Further, an oxide semiconductor film can be formed by a sputtering method or the like. A manufacturing process of the TFT using an oxide semiconductor is simpler than that of a TFT using polycrystalline silicon and easily responds to an increase in size of a manufacturing substrate.

An oxide semiconductor which can be used for a high-performance transistor over a glass substrate, a plastic substrate, or the like is expected to be applied to display devices such as a liquid crystal display, an electroluminescent display (also referred to as an EL display), and electronic paper.

In particular, there is a trend in an active matrix semiconductor device typified by a liquid crystal display device towards a larger screen, e.g., a 60-inch diagonal screen, and further, the development of an active matrix semiconductor device is aimed even at a screen size of a diagonal of 120 inches or more. In addition, a trend in resolution of a screen is toward higher definition, e.g., high-definition (HD) image quality (1366×768) or full high-definition (FHD) image quality (1920×1080), and a so-called 4K Digital Cinema display device, which has a resolution of 3840×2048 or 4096×2180, is also urgently developed.

As a display device has a larger size and a higher definition, the number of pixels needed for the display device is significantly increased. As a result, writing time for one pixel is required to be shortened, and thus a transistor arranged in a pixel is required to have high speed operation characteristics, large on current, and the like. In the meantime, a problem of energy depletion in recent years has caused demand for a display device whose power consumption is suppressed. Therefore, a transistor is also required to have low off current and suppressed unnecessary leakage current.

As described above, transistors having high ratio of on current to off current are desired. A technique of a transistor using an oxide semiconductor, in which the ratio of on current to off current is increased to about $10^3$, is disclosed in Patent Document 3.

Increase in screen size or definition tends to increase wiring resistance in a display portion. Increase in wiring resistance causes delay of signal transmission to an end portion of a signal line, drop in voltage of a power supply line, or the like. As a result, deterioration of display quality, such as display unevenness or a defect in grayscale, or increase in power consumption is caused.

In order to suppress increase in wiring resistance, the technique by which a low-resistance wiring layer is formed using copper (Cu) has been considered (for example, see Patent Document 4 or 5).

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2007-134496
[Patent Document 4] Japanese Published Patent Application No. 2004-133422
[Patent Document 5] Japanese Published Patent Application No. 2004-163901

DISCLOSURE OF INVENTION

In a semiconductor device in which delay due to resistance is recognized as a problem, like a large-sized display device, reduction in wiring resistance is needed, and for example, a method with use of a copper wiring is considered. However, in a transistor including an oxide semiconductor which easily responds to an increase in size of a manufacturing substrate and has high electric field-effect mobility, when the oxide semiconductor is connected to a copper wiring having low wiring resistance, a problem is caused that the ratio of on current to off current is not sufficient and remains in a figure of approximately $10^3$.

In addition, there is another problem in that an impurity enters the inside of the transistor from the outside after long-term use, resulting in change in transistor characteristics such as a threshold value.

An object of one embodiment of the present invention is to provide a semiconductor device in which a defect in signal writing to a transistor, which is caused by voltage drop or signal delay due to wiring resistance, is prevented. For example, one of objects is to provide a display device which achieves high display quality by preventing a defect in grayscale caused by a defect in writing to a transistor provided in a display of the display device.

Another object of one embodiment of the present invention is to realize high-speed operation of a semiconductor device.

Another object of one embodiment of the present invention is to realize reduction in power consumption of a semiconductor device.

Another object of one embodiment of the present invention is to provide a transistor which operates stably and a semiconductor device which includes the transistor.

Another object of one embodiment of the present invention is to realize a semiconductor device having excellent productivity.

Another object of one embodiment of the present invention is to realize a semiconductor device having higher reliability.

A transistor in which a wiring including copper with low wiring resistance is connected to a highly purified oxide semiconductor having a wide band gap and the reduced carrier concentration is manufactured. Use of an oxide semiconductor with a wide band gap enables off current of a transistor to be reduced. In addition, when such an oxide semiconductor is highly purified and has the reduced carrier concentration, a transistor has a positive threshold voltage. That is, with use of the highly purified oxide semiconductor with a wide band gap and the reduced carrier concentration, a so-called normally off transistor can be provided to make the ratio between off current and on current higher.

In order to achieve the above objects, in one embodiment of the present invention, is used a conductive film which includes copper with high electric conductivity as a main component for a source wiring, a gate wiring, and source and drain electrodes. In addition, the conductive film and an oxide semiconductor layer which is highly purified and has the reduced carrier concentration are connected. Further, the transistor including an oxide semiconductor may be sealed by surrounding with an insulating film.

One embodiment of the present invention is a semiconductor device which includes an insulating base film including silicon nitride over a substrate, a gate electrode formed using a first conductive layer over the base film, a first insulating layer including silicon nitride over the gate electrode, an oxide semiconductor layer which is highly purified over the first insulating layer, a source electrode and a drain electrode which have an end portion over and overlapping with the gate electrode and are formed using a second conductive layer in contact with the highly purified oxide semiconductor layer, a second insulating layer including silicon nitride over the second conductive layer and the highly purified oxide semiconductor layer, a gate wiring formed using the first conductive layer, and a source wiring formed using the second conductive layer. The first conductive layer includes a conductive layer including copper as a main component, and the second conductive layer includes a conductive layer including copper as a main component. The carrier concentration of the highly purified oxide semiconductor layer is lower than $1\times10^{12}$ cm$^{-3}$.

Further, one embodiment of the present invention is the above semiconductor device in which the conductive layer including copper as a main component which is included in the second conductive layer is connected to the highly purified oxide semiconductor layer with a metal nitride having conductivity interposed therebetween.

Further, one embodiment of the present invention is the above semiconductor device in which the gate wiring formed using the first conductive layer and the source wiring formed using the second conductive layer are intersected with each other with the highly purified oxide semiconductor layer interposed therebetween.

Further, one embodiment of the present invention is the above semiconductor device in which the base film and the first insulating layer are provided to surround the first conductive layer and be in contact with each other, and the first insulating layer and the second insulating layer are provided to surround the oxide semiconductor layer and the second conductive layer and be in contact with each other. The first insulating layer and the second insulating layer may contain the same material.

One embodiment of the present invention is a method for manufacturing a semiconductor device including the following steps of: forming an insulating base film including silicon nitride over a substrate; forming a gate electrode and a gate wiring which are formed using a first conductive layer over the base film; forming a first insulating layer including silicon nitride over the first conductive layer; forming an oxide semiconductor layer over the first insulating layer; heating the substrate over which the oxide semiconductor layer is provided in a nitrogen atmosphere to a temperature equal to or higher than 350° C. and equal to or lower than 700° C.; cooling the substrate over which the oxide semiconductor layer is provided in a dry air containing oxygen after the heating; forming a source electrode, a drain electrode, and a source wiring over the first insulating layer, the source and drain electrodes having an end portion over and overlapping with the gate electrode and being formed using a second conductive layer electrically connected to the oxide semiconductor layer; and forming a second insulating layer including silicon nitride over the second conductive layer and the oxide semiconductor layer.

Further, one embodiment of the present invention is the above method for manufacturing a semiconductor device in which: the substrate over which the oxide semiconductor layer is provided is heated in a nitrogen atmosphere so that a temperature of the substrate is equal to or higher than 350° C. and equal to or lower than 700° C.; after the heating, the substrate is cooled; the substrate is heated in a dry air containing oxygen so that a temperature of the substrate is equal to or higher than 350° C. and equal to or lower than 700° C.; and after the heating, the substrate is cooled.

Further, one embodiment of the present invention is the above method for manufacturing a semiconductor device in which: the substrate over which the oxide semiconductor layer is provided is heated in a nitrogen atmosphere so that a temperature of the substrate is equal to or higher than 350° C. and equal to or lower than 700° C.; the substrate is heated in a dry air containing oxygen while the temperature of the substrate is kept; and the substrate is cooled in the dry air containing oxygen.

Note that a gate in this specification refers to the entire gate electrode and gate wiring or part thereof. The gate wiring is a wiring for electrically connecting a gate electrode of at least one transistor to another electrode or another wiring, and includes a scan line in a display device in its category, for example.

The source refers to the entire source region, source electrode, and source wiring or part thereof. The source region indicates a region in a semiconductor layer, where the resistivity is equal to or less than a given value. The source electrode indicates part of a conductive layer, which is connected to the source region. The source wiring is a wiring for electrically connecting a source electrode of at least one transistor to another electrode or another wiring. For example, in the case where a signal line in a display device is electrically connected to a source electrode, the source wiring includes the signal line in its category.

The drain is the entire drain region, drain electrode, and drain wiring or part thereof. The drain region indicates a region in a semiconductor layer, where the resistivity is equal to or less than a given value. The drain electrode indicates part of a conductive layer, which is connected to the drain region. The drain wiring is a wiring for electrically connecting a drain electrode of at least one transistor to another electrode or another wiring. For example, in the case where a signal line in a display device is electrically connected to a drain electrode, the drain wiring includes the signal line in its category.

In addition, in this document (the specification, the scope of claims, the drawings), a source and a drain of a transistor are interchanged depending on the structure, the operating conditions, or the like of the transistor; therefore, it is difficult to determine which is the source and which is the drain. Therefore, in this document (the specification, the scope of claims, the drawings), one terminal which is freely selected from the source and the drain is referred to as one of the source and the drain, whereas the other terminal is referred to as the other of the source and the drain.

Note that in this specification, silicon nitride oxide refers to silicon that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

Note that in this specification, a "light-emitting device" ☐refers to an image display device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

According to the present invention, a semiconductor device having the high ratio between on current and off current and the reduced wiring resistance can be provided.

Further, a semiconductor device in which change in characteristics of transistors due to entry of impurities from the outside after long-term use is hardly caused can be provided.

Further, a semiconductor device typified by a display device having higher display quality, in which an adverse effect such as voltage drop, a defect in signal writing to a pixel, a defect in grayscale, and the like due to wiring resistance are prevented can be provided.

Furthermore, a semiconductor device which operates at high speed can be provided.

Furthermore, a semiconductor device whose power consumption is reduced can be provided.

Furthermore, a transistor which operates stably and a semiconductor device including the transistor can be provided.

Furthermore, a semiconductor device having excellent productivity can be provided.

Furthermore, a semiconductor device having higher reliability can be provided.

BRIEF DESCRIPTION OF DRAWINGS

FIGS. 21A1, 21A2, and 21B illustrate a semiconductor device according to one embodiment.

FIGS. 25A and 25B illustrate a semiconductor device according to one embodiment.

BEST MODE FOR CARRYING OUT THE INVENTION

Figure 1A:
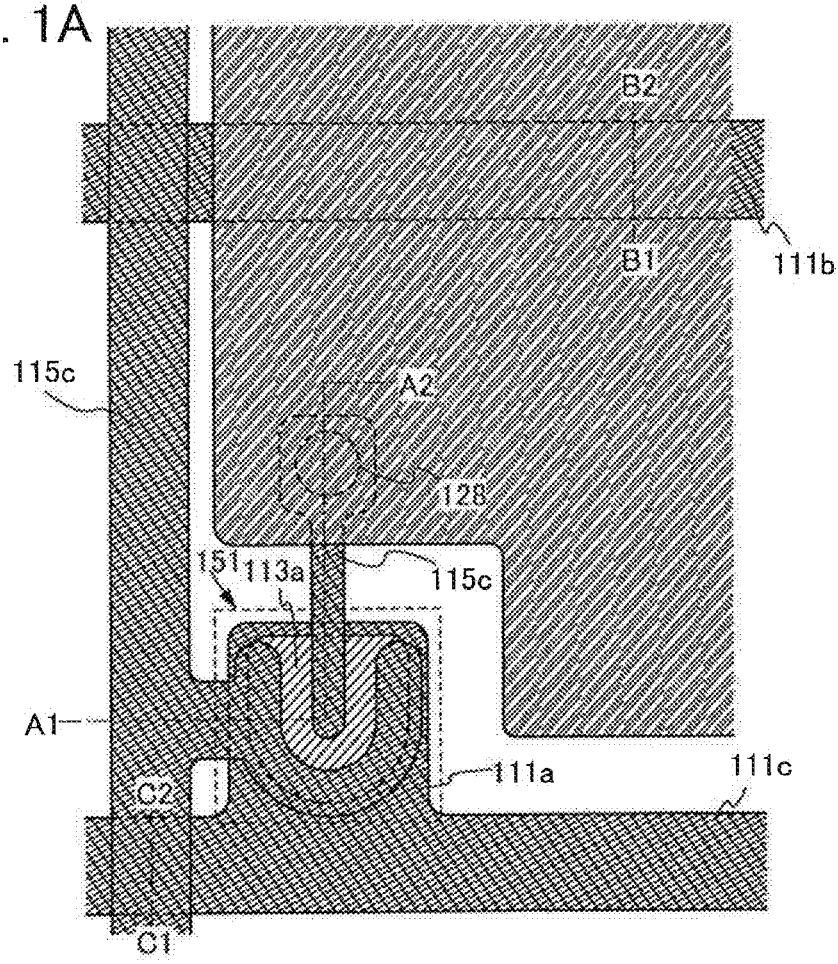
FIGS. 1A and 1B illustrate a semiconductor device according to an embodiment.

Embodiments will be described in detail with reference to the accompanying drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, one embodiment of a substrate provided with a circuit of a display device will be described as one embodiment of a semiconductor device, with reference to FIGS. 1A and 1B.

Figure 1B:
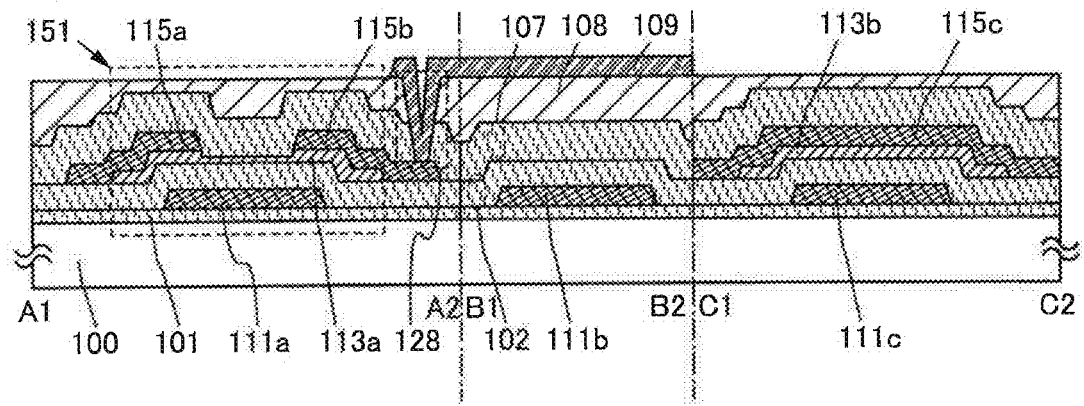

A structure of a pixel provided in the display device is illustrated in FIGS. 1A and 1B. FIG. 1A is a top view illustrating a plan structure of the pixel, and FIG. 1B is a cross-sectional view illustrating a stacked structure in the pixel. Note that chain lines A1-A2, B1-B2, and C1-C2 in FIG. 1A correspond to cross sections A1-A2, B1-B2, and C1-C2 in FIG. 1B, respectively.

In the cross section A1-A2, a stacked structure in a transistor 151 used in the pixel portion is illustrated. The transistor 151 is one embodiment of a transistor having a bottom gate structure.

In the cross section B1-B2, a stacked structure in a capacitor formed in the pixel portion is illustrated.

Further, in the cross section C1-C2, a stacked structure in a wiring intersection portion of a gate wiring and a source wiring is illustrated.

The transistor 151 includes a base film 101 over a substrate 100, a gate electrode 111a formed using a first conductive layer over the base film 101, and a first insulating layer 102 over the gate electrode 111a. Further, the transistor 151 includes an oxide semiconductor layer 113a including a channel formation region which is in contact with the first insulating layer 102 over the gate electrode 111a. Further, in the transistor 151, a first electrode 115a and a second electrode 115b are formed using a second conductive layer, each of which has an end portion over and overlapping with the gate electrode 111a and is in contact with the oxide semiconductor layer 113a. The first electrode 115a and the second electrode 115b function as a source electrode or a drain electrode of the transistor 151. Further, a second insulating layer 107 is provided over the first electrode 115a, the second electrode 115b, the first insulating layer 102, and the oxide semiconductor layer 113a. Furthermore, a third insulating layer 108 is provided over the second insulating layer 107, and a first pixel electrode 109 is provided over the third insulating layer 108. The first pixel electrode 109 is formed using a third conductive layer to be electrically connected to the second electrode 115b through a contact hole 128 which is formed in the second insulating layer 107 and the third insulating layer 108.

The capacitor formed in the pixel portion has a structure in which the first insulating layer 102, the second insulating layer 107, and the third insulating layer 108 are interposed between a capacitor wiring 111b formed using the first conductive layer and the first pixel electrode 109 formed using the third conductive layer.

The intersection portion of the gate wiring and the source wiring may have a structure in which the first insulating layer 102 and an oxide semiconductor layer 113b are interposed between a gate wiring 111c formed using the first conductive layer and a source wiring 115c formed using the second conductive layer. With the oxide semiconductor layer 113b interposed between the wirings, the distance between the wirings can be increased; thus, capacitance generated at the intersection of the wirings can be reduced.

In this embodiment, copper is used for the first conductive layer. As the first conductive layer, a single layer of a layer including copper as a main component or a stacked layer including a layer including copper as a main component and another conductive film can be used. The first conductive layer including copper as a main component has high conductivity and can reduce wiring resistance.

In addition, a layer including a refractory metal material such as Cr, Ta, Ti, Mo, or W or an alloy material layer including any of the metal materials may be stacked to be in contact with one of or both side surfaces of the layer including copper as a main component. Further, in the case of using an Al material to which an element such as Si, Ti, Ta, W, Mo, Cr, Nd, Sc, or Y, which prevents generation of hillocks or whiskers in an Al film, is added, heat resistance can be improved. Note that it is preferable that the conductive layer have enough heat resistance to withstand at least heat treatment.

Further, for example, a tantalum nitride film may be formed to overlap with the layer including copper as a main component, so that a barrier film which suppresses diffusion of copper is formed.

The first conductive layer including copper as a main component blocks light at a wavelength in the vicinity of 400 nm to 450 nm. When the gate electrode 111a overlapping with the oxide semiconductor layer is formed using the first conductive layer including copper as a main component, light at a wavelength in the vicinity of 400 nm to 450 nm can be prevented from entering the oxide semiconductor layer from the substrate 100 side. The oxide semiconductor layer has photosensitivity at a wavelength in the vicinity of 400 nm to 450 nm. Thus, the gate electrode 111a formed using the first conductive layer including copper as a main component can prevent electric characteristics of a transistor including an oxide semiconductor layer or operation of a semiconductor device including an oxide semiconductor layer from being unstable due to light at a wavelength in the vicinity of 400 nm to 450 nm.

The first conductive layer including copper as a main component is formed between the base film 101 and the first insulating layer 102.

Note that a wiring material may be selected as appropriate in accordance with the performance needed for the display device. For example, only the second conductive layer including the source wiring which needs to have a higher conduction property than the gate wiring may be formed using the wiring including Cu.

In this embodiment, a silicon nitride ($SiN_y$ (y>0)) layer is used for the base film 101. With use of the silicon nitride layer, a phenomenon in which copper diffuses from the first conductive layer including copper as a main component can be prevented. In addition, a phenomenon in which an impurity element diffuses from the substrate 100 into a semiconductor element can be prevented.

The base film 101 and the first insulating layer 102 each include at least a silicon nitride layer and may have a stacked layer including another insulating layer. As another insulating layer to be stacked, a silicon nitride oxide layer, a silicon oxynitride layer, or a silicon oxide layer may be used for example. Alternatively, a layer of one kind of oxide, nitride, oxynitride, and nitride oxide of aluminum, tantalum, yttrium, or hafnium; or a compound layer including at least two or more kinds of the above may be used.

In particular, it is preferred to use, as a gate insulating film, a combination of an insulating film having a higher permittivity than silicon nitride with a silicon nitride layer, because the property as the gate insulating film is improved.

Note that formation of the first conductive layer including copper as a main component between two silicon nitride layers can suppress diffusion of copper.

Note that the base film 101 and the first insulating layer 102 are preferably formed by a sputtering method, a CVD method, or a high-density plasma CVD method.

In this embodiment, an In—Ga—Zn—O-based oxide semiconductor which is highly purified to have a carrier concentration lower than $1\times10^{12}$ cm$^{-3}$ and has a wide band gap is used for the oxide semiconductor layer.

In a transistor including an oxide semiconductor layer which is highly purified to have a carrier concentration lower than $1\times10^{12}$ cm$^{-3}$, the threshold voltage is a positive value and a so-called normally off characteristic is provided. Further, the transistor including an oxide semiconductor with a wide band gap has small off current. Electric characteristics of the transistor including the oxide semiconductor with such characteristics are described at the end of this embodiment.

As an oxide semiconductor used for the oxide semiconductor layer, the following metal oxides can also be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor; an In—O-based oxide semiconductor; a Sn—O-based oxide semiconductor; and a Zn—O-based oxide semiconductor. Silicon oxide may be added to any of the above oxide semiconductor layers. Addition of silicon oxide ($SiO_x$ (x>0)) which hinders crystallization into the oxide semiconductor layer can suppress crystallization of the oxide semiconductor layer at the time when heat treatment is performed after formation of the oxide semiconductor layer in the manufacturing process.

Note that as the oxide semiconductor layer, a thin film expressed by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented by $InMO_3(ZnO)_m$ (m>0), which includes Ga as M, is referred to as an In—Ga—Zn—O-based oxide semiconductor, and a thin film of the In—Ga—Zn—O-based oxide semiconductor is also referred to as an In—Ga—Zn—O-based non-single-crystal film.

For the oxide semiconductor layer, the one which is subjected to dehydration or dehydrogenation at high temperature in a short time by an RTA (rapid thermal anneal) method or the like is used. The heating step makes a superficial portion of the oxide semiconductor layer have a crystal region including so-called nanocrystals with a grain size of greater than or equal to 1 nm and less than or equal to 20 nm, and the rest portion is amorphous or is formed of a mixture of amorphousness and microcrystals, where an amorphous region is dotted with microcrystals. Note that the size of the nanocrystal is just an example, and the present invention is not construed as being limited to the above range.

By using an oxide semiconductor layer which has such a structure, a change to an n-type caused by entry of moisture or elimination of oxygen to or from the superficial portion can be prevented because a dense crystal region including nanocrystals exists in the superficial portion. As a result, deterioration of electric characteristics due to a change to an n-type, specifically, an increase in off current, can be prevented.

Note that the crystal region may include another crystal grain other than the above crystal grains. The crystal structure of the crystal grains is not limited to the above structure, and the crystal region may include crystal grains of another structure. For example, in the case of using an In—Ga—Zn—O-based oxide semiconductor material, crystal grains of $InGaZnO_4$ may be included in addition to crystal grains of $In_2Ga_2ZnO_7$.

In this embodiment, copper is used for the second conductive layer. Further, a tantalum nitride film, for example, may be formed as a barrier film which suppresses diffusion of copper over the layer including copper as a main component.

Note that the second conductive layer includes at least a layer including copper as a main component, like the first conductive layer, and may have a single layer structure or a stacked-layer structure including the layer including copper as a main component and another conductive layer. The second conductive layer including copper as a main component has high conductivity and can reduce wiring resistance.

In the structure where the layer including copper as a main component which is included in the second conductive layer is in contact with the oxide semiconductor layer, copper oxide is formed in some cases between the layer including copper as a main component and the oxide semiconductor layer due to performance of heat treatment which is necessary for the oxide semiconductor layer to be highly purified. The copper oxide formed between the layer including copper as a main component and the oxide semiconductor layer is a semiconductor, which does not disturb electrical connection between the oxide semiconductor layer and the second conductive layer.

Note that in the structure where the layer including copper as a main component is in contact with the oxide semiconductor layer, copper diffuses to the oxide semiconductor layer in some cases. However, characteristics of the oxide semiconductor layer is hardly influenced by diffusion of a heavy atom typified by copper or the like, which is different from a silicon semiconductor.

The second conductive layer may include another conductive layer which is additionally provided between the layer including copper as a main component and the oxide semiconductor layer.

The another conductive layer provided between the layer including copper as a main component and the oxide semiconductor layer is preferably formed using a material including metal with high oxygen affinity. As the metal with high oxygen affinity, one or more materials including metal selected from titanium (Ti), manganese (Mn), magnesium (Mg), zirconium (Zr), beryllium (Be), thorium (Th), and the like are preferable.

When the oxide semiconductor layer and the conductive layer with high oxygen affinity are formed in contact with each other, the carrier density in the vicinity of the interface is increased and a low-resistance region is formed, whereby the contact resistance between the oxide semiconductor layer and the conductive layer can be reduced. This is because the conductive layer with high oxygen affinity extracts oxygen from the oxide semiconductor layer, and thus either or both a layer which includes an excessive amount of metal in the oxide semiconductor layer (such a layer is referred to as a composite layer) and an oxidized conductive film are formed in the interface between the oxide semiconductor layer and the conductive layer.

For example, in a structure where an In—Ga—Zn—O-based oxide semiconductor layer is in contact with a titanium film, an indium-excess layer and a titanium oxide layer are formed in some cases in the vicinity of the interface between the oxide semiconductor layer and the titanium film. In other cases, one of the indium-excess layer and the titanium oxide layer is formed in the vicinity of the interface where the oxide semiconductor layer is in contact with the titanium film. The indium-excess layer which is an oxygen-deficient In—Ga—Zn—O-based oxide semiconductor layer has high electric conductivity; therefore, the contact resistance between the oxide semiconductor layer and the conductive layer can be reduced.

Note that a titanium film or a titanium oxide film having conductivity may be used as the conductive film which is in contact with the oxide semiconductor layer. In that case, in the structure where the In—Ga—Zn—O-based oxide semiconductor layer is in contact with the titanium oxide film, an indium-excess layer might be formed in the vicinity of the interface where the oxide semiconductor layer is in contact with the titanium oxide film.

Alternatively, as another conductive layer provided between the layer including copper as a main component and the oxide semiconductor layer, a conductive layer including a low electronegativity metal is preferable. As the low electronegativity metal, one or more of materials selected from titanium, magnesium, yttrium, aluminum tungsten, molybdenum, and the like are preferable.

By removing an impurity such as moisture or hydrogen from the oxide semiconductor layer by providing the conductive layer including a low electronegativity metal between the layer including copper as a main component and the oxide semiconductor layer, an intrinsic (i-type) semiconductor or a substantially i-type semiconductor can be formed. As a result, deterioration in characteristics of a transistor, such as shift in the threshold voltage due to the above impurity, can be prevented; thus, off current can be reduced.

An impurity such as hydrogen or water absorbed by the conductive layer including a low electronegativity metal tends to be combined with the low electronegativity metal. An impurity chemically bonded to metal in the conductive layer has the stable bond with the metal. After once the impurity is absorbed into the conductive layer, the impurity is less likely to diffuse to the oxide semiconductor layer.

Therefore, since a state where an impurity such as hydrogen or water is captured in the conductive layer including a low electronegativity metal is held, the hydrogen concentration in the conductive layer including a low electronegativity metal is higher than that of the oxide semiconductor layer. Specifically, the hydrogen concentration in the first electrode 115a and the second electrode 115b is 1.2 times or more as high as that of the oxide semiconductor layer, preferably, 5 times or more as high as that of the oxide semiconductor layer.

The concentration of hydrogen in the conductive layer is measured by secondary ion mass spectroscopy (SIMS).

The analysis of the hydrogen concentrations in the oxide semiconductor layer and the conductive layer is described here. The hydrogen concentrations in the oxide semiconductor layer and the conductive layer are measured by secondary ion mass spectroscopy (SIMS). It is known that it is difficult to obtain data accurately in the proximity of a surface of a sample or in the proximity of an interface between stacked films formed using different materials by the SIMS analysis in principle. Thus, in the case where distributions of the hydrogen concentrations of the layers in thickness directions are analyzed by SIMS, an average value which is constant and does not largely vary in a region where the layers are provided is employed as the hydrogen concentration. Further, in the case where the thickness of the layer is small, a region showing a constant value cannot be found in some cases due to the influence of the adjacent layers. In this case, the maximum value or the minimum value of the hydrogen concentration of a region where the layers are provided is employed as the hydrogen concentration of the layer. Furthermore, in the case where a maximum peak and a minimum peak do not exist in the region where the layers are provided, the value of the inflection point is employed as the hydrogen concentration.

Note that in the above-described low electronegativity metal, titanium, molybdenum, and tungsten have low contact resistance with the oxide semiconductor layer. Thus, the first electrode 115*a* and the second electrode 115*b* with low contact resistance with the oxide semiconductor layer can be formed. Further, when the conductive layer in contact with the oxide semiconductor layer is formed using any of titanium, molybdenum, and tungsten, an impurity in the oxide semiconductor layer can be reduced.

Alternatively, the another conductive layer provided between the layer including copper as a main component and the oxide semiconductor layer can be formed using a metal material such as Al, Cr, Ta, Ti, Mo, or W, or an alloy material including any of the metal materials.

Further alternatively, a conductive metal oxide can be used. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or the above metal oxide material to which silicon or silicon oxide is added may be used.

The conductive layer is not limited to a single layer and may be a stack of two or more layers. Note that it is preferable that the conductive layer have enough heat resistance to withstand at least heat treatment.

Note that a layer including refractory metal such as Cr, Ta, Ti, Mo, or W may be stacked to be in contact with one of or both side surfaces of the layer including copper as a main component. Further, in the case of using an Al material to which an element such as Si, Ti, Ta, W, Mo, Cr, Nd, Sc, or Y, which prevents generation of hillocks or whiskers in an Al film, is added, heat resistance can be improved.

In this embodiment, the second insulating layer 107 is a silicon nitride ($SiN_y$ (y>0)) layer.

The second insulating layer 107 does not include impurities such as moisture, hydrogen ions, or OH⁻ and is formed using an inorganic insulating film which prevents entry of these from the outside. With use of the silicon nitride layer, diffusion of copper from the first conductive layer and the second conductive layer including copper as a main component can be prevented.

In this embodiment, the first insulating layer 102 and the second insulating layer 107 are each formed using silicon nitride. In addition, the first insulating layer 102 and the second insulating layer 107 are in contact with each other. In such a manner, the inorganic insulating layers which are of the same kind are provided to be in contact with each other so as to surround the transistor 151, whereby the transistor can be sealed more tightly. In the case where the same kinds of inorganic insulating layers are in contact with each other, the above-described inorganic insulating layer can be used; in particular, a silicon nitride film is preferable because it can block impurities effectively.

The second insulating layer 107 includes at least a silicon nitride layer and may have a stacked-layer structure including the silicon nitride layer and another insulating layer. As the another insulating layer to be stacked, an inorganic insulating layer such as an oxide insulating layer, an oxynitride insulating layer, a nitride insulating layer, or a nitride oxide insulating layer can be used. For example, a silicon nitride oxide layer, a silicon oxynitride layer, a silicon oxide layer, or the like can be stacked.

Further, when an oxide insulating film is provided to be in contact with the oxide semiconductor layer and a silicon nitride ($SiN_y$ (y>0)) layer is stacked over the oxide insulating film, oxygen deficiency in the oxide semiconductor layer can be lowered. Specifically, in the second insulating layer 107, a silicon oxide ($SiO_x$ (x>0)) layer may be formed on the side in contact with the oxide semiconductor layer and a silicon nitride layer may be stacked thereover. Further, when the second conductive layer including copper as a main component is covered with a silicon nitride layer, diffusion of copper can be suppressed.

The second insulating layer 107 is preferably formed by a sputtering method so as to prevent the oxide semiconductor layer from being contaminated with an impurity such as moisture, a hydrogen ion, or OH⁻.

The third insulating layer 108 can be provided. The third insulating layer 108 is formed with a single layer or a stacked layer and functions to planarize unevenness caused by a structural body such as the transistor formed below to form a planar surface. The third insulating layer 108 can be formed, for example, using a heat-resistant organic material, such as a polyimide, an acrylic resin, a benzocyclobutene-based resin, a polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the third insulating layer 108 may be formed by stacking a plurality of insulating films formed using the above materials.

The first pixel electrode 109 is electrically connected to the transistor and used for a pixel of the display device. The first pixel electrode 109 functions as an electrode for a display element and is formed using a conductive film transmitting visible light.

For the conductive film transmitting visible light, a light-transmitting conductive material such as indium tin oxide (hereinafter, referred to as ITO), indium zinc oxide, or indium tin oxide containing silicon oxide can be used.

Described below is the effect that the oxide semiconductor layer is highly purified to have a carrier concentration lower than $1 \times 10^{12}$ cm⁻³ and has a wide band gap.

<Intrinsic Oxide Semiconductor>

Although many researches on properties of an oxide semiconductor such as density of states (DOS) have been conducted, they do not include the idea of sufficiently reducing the localized levels itself. According to one embodiment of the disclosed invention, a highly purified oxide semiconductor is formed by removing water or hydrogen which might affect the DOS in the energy gap, so that an intrinsic (i-type) oxide semiconductor is formed. This is based on the idea of sufficiently reducing the localized level itself. Thus, excellent industrial products can be manufactured.

Note that oxygen may be removed while hydrogen, water, or the like is being removed. Therefore, it is preferable to realize a purified (i-type) oxide semiconductor in such a manner that oxygen is supplied to metal dangling bonds that results from oxygen deficiency so that the localized levels due to oxygen deficiency are reduced. For example, an oxygen-excess oxide film is formed in contact with a channel formation region and heat treatment is performed at a temperature of 200° C. to 400° C., typically 250° C., whereby oxygen can be supplied from the oxide film and the localized levels due to oxygen deficiency can be reduced.

Factors of deterioration in characteristics of an oxide semiconductor are considered to be attributed to levels of 0.1 eV to 0.2 eV under the conduction band due to excessive hydrogen, deep levels due to shortage of oxygen, or the like.

Hydrogen is thoroughly removed and oxygen is sufficiently supplied to eliminate such a defect.

An oxide semiconductor is generally considered as an n-type semiconductor; however, according to an embodiment of the disclosed invention, an i-type oxide semiconductor is realized by removing an impurity such as water or hydrogen and supplying oxygen which is a constituent element of the oxide semiconductor. In this respect, it can be said that an embodiment of the disclosed invention includes a novel technical idea which is far from an idea that an i-type semiconductor is obtained by adding an impurity in the case of silicon and the like.

<Electrical Conduction Mechanism of Transistor Including Oxide Semiconductor>

A transistor including an oxide semiconductor has some characteristics. Here, electrical conduction mechanism of the transistor is described with reference to FIG. 2, FIGS. 3A and 3B, FIGS. 4A and 4B, and FIG. 5. Note that the following description is based on the assumption of an ideal situation for easy understanding and does not necessarily reflect a real situation. Note also that the following description is just a consideration and does not affect the validity of the invention.

Figure 2:
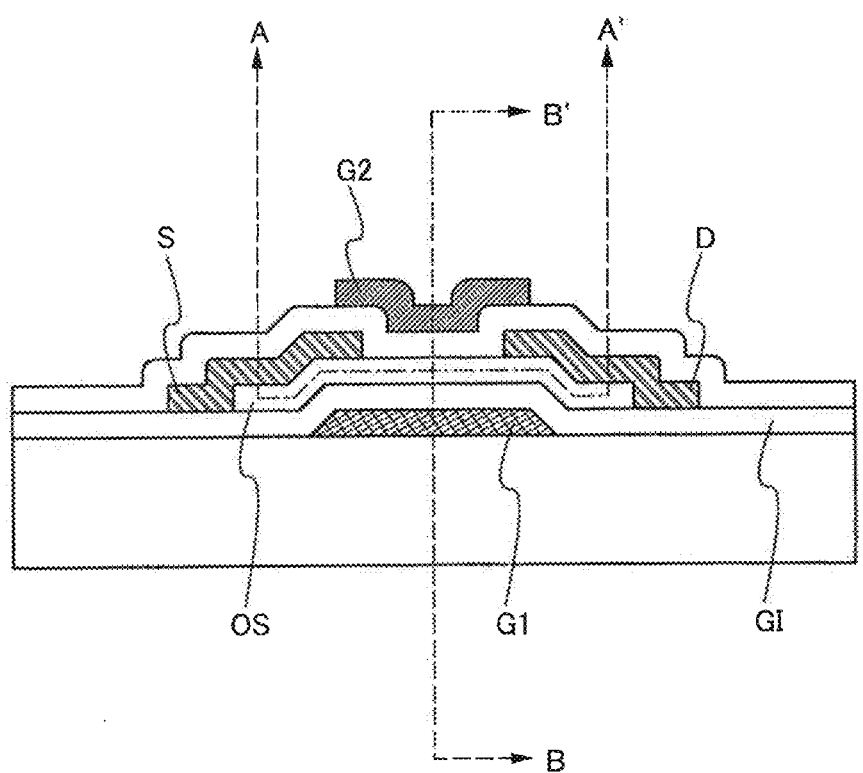
FIG. 2 is a longitudinal cross-sectional view of an inverted staggered transistor which includes an oxide semiconductor.

FIG. 2 is a cross-sectional view of an inverted-staggered transistor including an oxide semiconductor. An oxide semiconductor layer (OS) is provided over a gate electrode layer (G1) with a gate insulating layer (GI) therebetween, and a source electrode (S) and a drain electrode (D) are formed thereover. Further, a back gate (G2) is provided over the source electrode and the drain electrode with an insulating layer interposed therebetween.

Figure 3A:
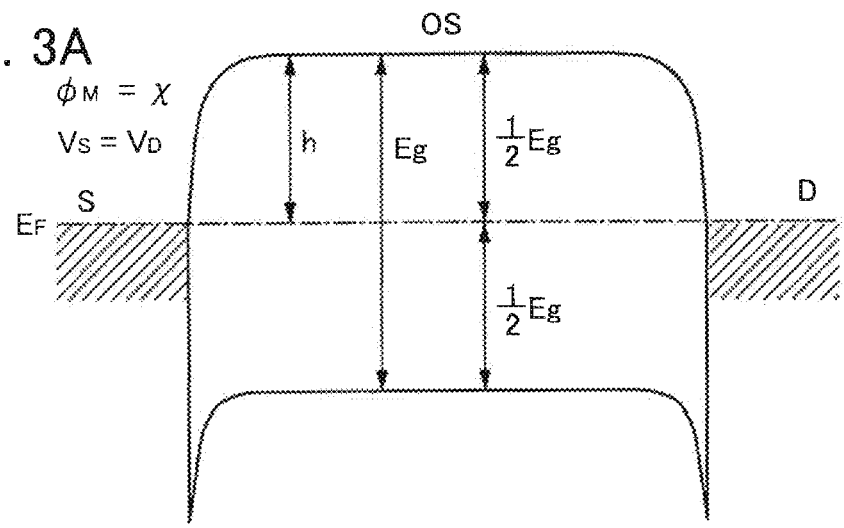
FIGS. 3A and 3B are each an energy band diagram (schematic diagram) of a cross section along A-A' in FIG. 2.
Figure 3B:
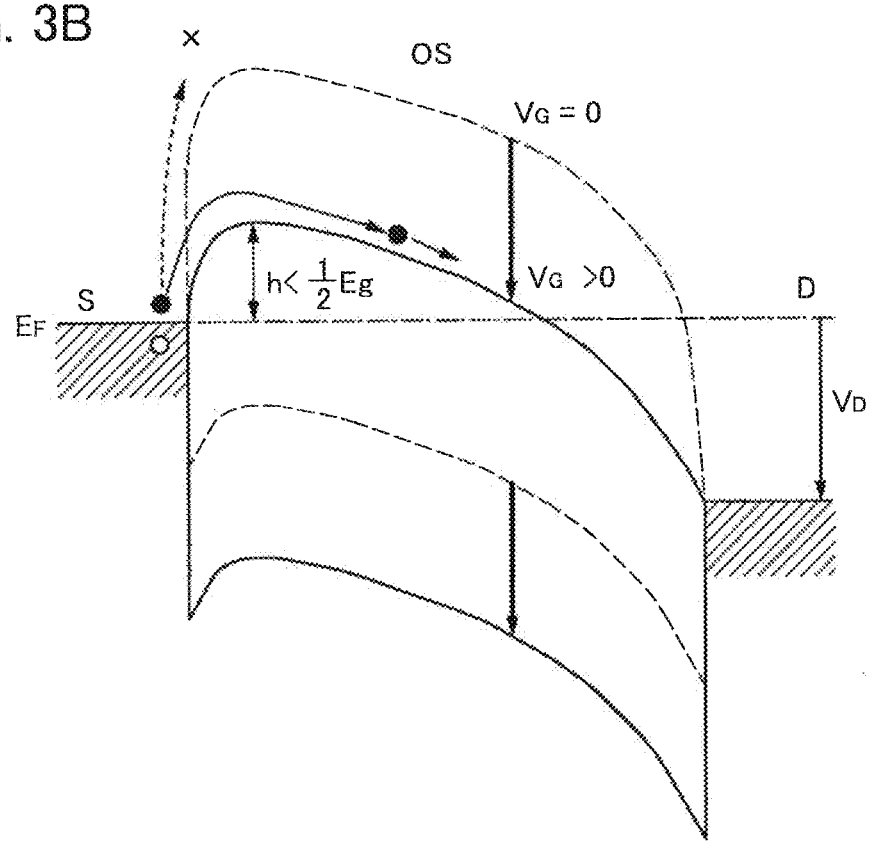

FIGS. 3A and 3B are energy band diagrams (schematic diagrams) of a cross-section taken along line A-A' in FIG. 2. FIG. 3A illustrates the case where the potential difference between the source and the drain is zero (the source and the drain have the same potential, $V_D=V_S=0$ V). FIG. 3B illustrates the case where the potential of the drain is higher than that of the source ($V_D>V_S$).

Figure 4A:
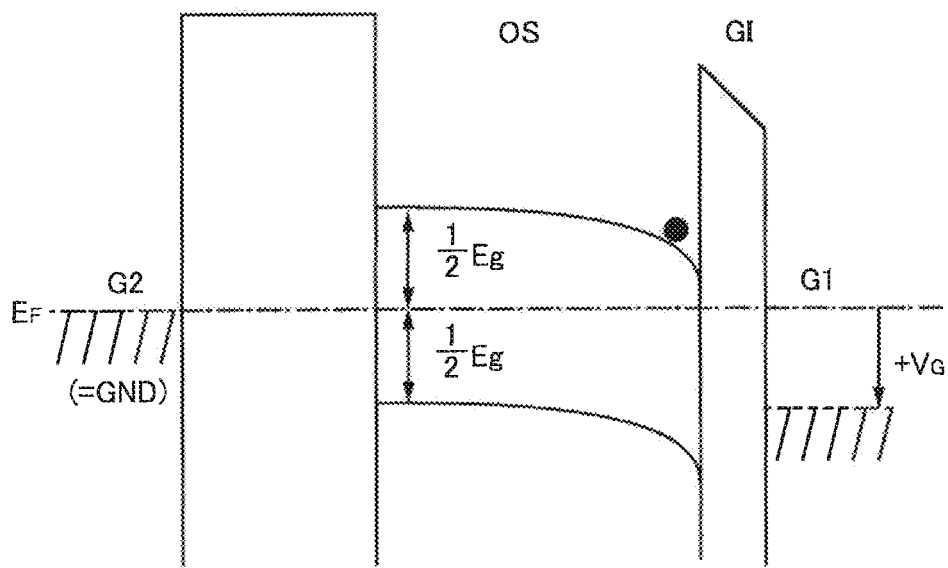
FIG. 4A illustrates a state in which a positive potential ($+V_G$) is applied to a gate (G1)
Figure 4B:
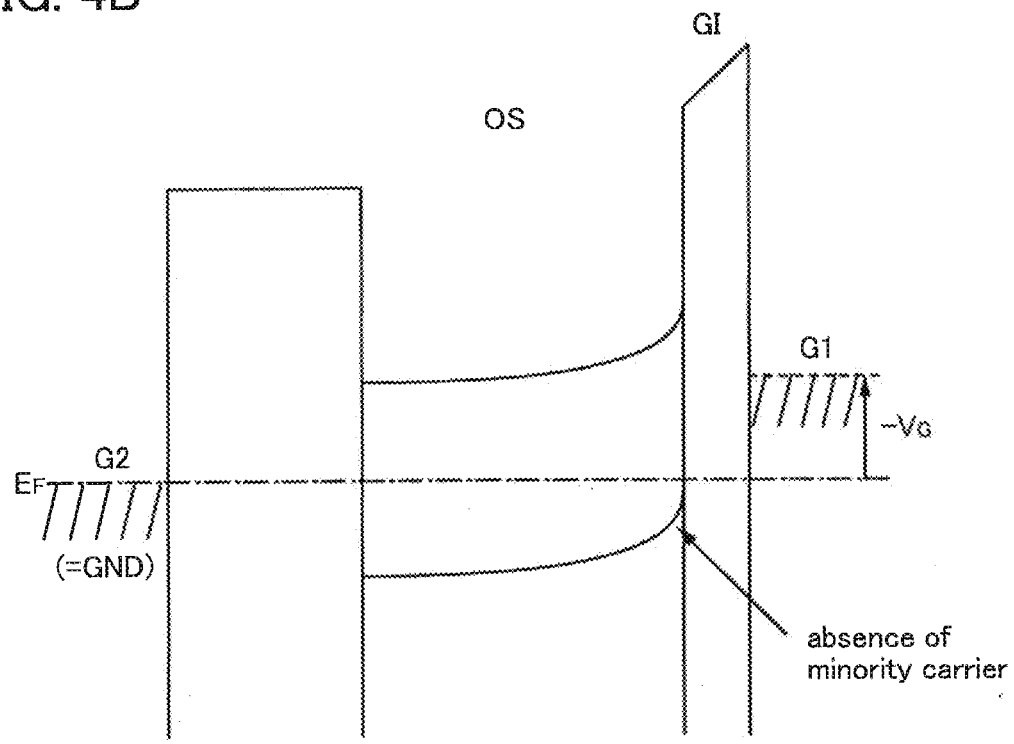
FIG. 4B illustrates a state in which a negative potential ($-V_G$) is applied to the gate (G1).

FIGS. 4A and 4B are energy band diagrams (schematic diagrams) of the cross section B-B' in FIG. 2. FIG. 4A illustrates a state where a positive voltage ($V_G>0$) is applied to the gate electrode (G1), that is, an on state where a carrier (electron) flows between the source and the drain. FIG. 4B illustrates a state where a negative voltage ($V_G<0$) is applied to the gate electrode (G1), that is, an off state (where a minority carrier does not flow).

Figure 5:
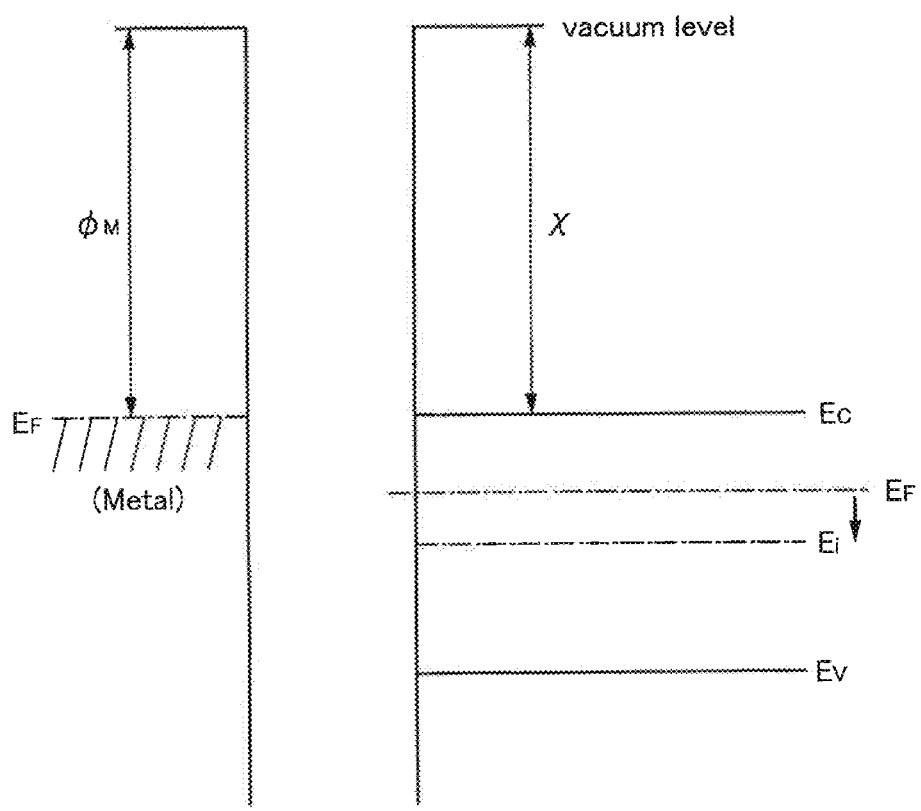
FIG. 5 is a diagram illustrating a relation between a vacuum level and work function ($\phi_M$) of a metal and a relation between a vacuum level and electron affinity ($\chi$) of an oxide semiconductor.

FIG. 5 is a diagram illustrating a relation between a vacuum level and work function ($\phi_M$) of metal and a relation between a vacuum level and electron affinity ($\chi$) of an oxide semiconductor.

Electrons in metal at room temperature are degenerated, and the Fermi level is located in a conduction band. Meanwhile, a conventional oxide semiconductor is n-type, and the Fermi level ($E_F$) is distant from the intrinsic Fermi level ($E_i$) in the center of the band gap and is located near the conduction band. Note that it is known that part of hydrogen in an oxide semiconductor serves as a donor, which is one of the factors that make the oxide semiconductor an n-type semiconductor.

In contrast, an oxide semiconductor according to an embodiment of the disclosed invention is an oxide semiconductor that is made to be intrinsic (i-type) or to be close to intrinsic in the following manner: hydrogen, which is the cause to produce an n-type oxide semiconductor, is removed from the oxide semiconductor for high purification, so that the oxide semiconductor includes an element (impurity element) other than the main component of the oxide semiconductor as little as possible. In other words, the oxide semiconductor according to one embodiment of the invention disclosed herein is a highly purified i-type (intrinsic) semiconductor or a substantially intrinsic semiconductor obtained by removing impurities such as hydrogen and water as much as possible, not by adding an impurity element. Thus, the Fermi level ($E_F$) can be comparable with the intrinsic Fermi level ($E_i$).

The band gap (Eg) of an oxide semiconductor is said to 3.15 eV, and the electron affinity ($\chi$) is said to be 4.3 V. The work function of copper (Cu) included in the source electrode and the drain electrode is 4.6 eV and slightly lower than the electron affinity ($\chi$) of the oxide semiconductor. The work function of titanium (Ti) is substantially equal to the electron affinity ($\chi$) of the oxide semiconductor. In that case, a high Schottky barrier for electrons is not formed at an interface between the metal and the oxide semiconductor.

In the case where the work function of metal ($\phi_M$) and the electron affinity ($\chi$) of the oxide semiconductor are substantially equal to each other and the metal and the oxide semiconductor are in contact with each other, an energy band diagram (a schematic diagram) as illustrated in FIG. 3A is obtained.

In FIG. 3B, a black dot (•) indicates an electron. In addition, a dashed line indicates the case where a voltage is not applied to the gate ($V_G=0$) when a positive voltage ($V_D>0$) is applied to the drain, and a solid line indicates the case where a positive voltage ($V_G>0$) is applied to the gate and a positive voltage ($V_D>0$) is applied to the drain. When a positive potential ($V_G>0$) is supplied to the gate and a positive potential is applied to the drain, the electron crosses over a barrier (h) to be injected into the oxide semiconductor, and flows to the drain. The height of the barrier (h) depends on a gate voltage and a drain voltage. When a positive voltage ($V_G>0$) is supplied to the gate and a positive drain voltage is applied, the height of the barrier (h) is lower than the height of the barrier (h) in FIG. 3A where a voltage is not applied, that is, the height of the barrier (h) is smaller than half of the band gap (Eg). In the case where a voltage is not applied to the gate, a carrier (electron) is not injected to the oxide semiconductor side from an electrode because of high potential barrier, so that a current does not flow, which means an off state. On the other hand, when a positive voltage is applied to the gate, a potential barrier is reduced and thus a current flows, which means an on state.

At this time, as illustrated in FIG. 4A, the electron injected to the oxide semiconductor travels in the vicinity of the interface between the gate insulating layer and the highly purified oxide semiconductor (the lowest part of the oxide semiconductor, which is energetically stable).

As illustrated in FIG. 4B, when a negative potential (reverse bias) is supplied to the gate electrode (G1), a hole which is a minority carrier does not exist substantially. Thus, the current value is substantially close to zero.

In such a manner, the oxide semiconductor layer becomes intrinsic (an i-type semiconductor) or substantially intrinsic by being highly purified so as to contain an element (i.e., an impurity element) other than its main element as little as possible. Thus, characteristics of the interface between the oxide semiconductor and the gate insulating layer causes large influence. For that reason, the gate insulating layer needs to form a favorable interface with the oxide semiconductor. Specifically, it is preferable to use the following insulating layer, for example: an insulating layer formed by a CVD method using high-density plasma generated with a power supply frequency in the range of the VHF band to the microwave band, or an insulating layer formed by a sputtering method.

When the interface between the oxide semiconductor and the gate insulating layer is made favorable while the oxide semiconductor is highly purified, in the case where the transistor has a channel width (W) of $1\times10^4$ μm and a channel length (L) of 3 μm, for example, it is possible to realize an off-state current of $1\times10^{-13}$ A or less and a subthreshold swing (S value) of 0.1 V/dec at room temperature (with a 100-nm-thick gate insulating layer).

When the oxide semiconductor is highly purified as described above so as to contain an element (i.e., an impurity element) other than its main element as little as possible, the transistor can operate in a favorable manner.

<Resistance of Transistor Including Oxide Semiconductor to Hot Carrier Degradation>

Next, the resistance of a transistor including an oxide semiconductor to hot carrier degradation will be described with reference to FIG. 6, FIG. 7, and FIG. 8. Note that the following description is based on the assumption of an ideal situation for easy understanding and does not necessarily reflect a real situation. Note also that the following description is just a consideration.

Main causes of hot carrier degradation are channel hot electron injection (CHE injection) and drain avalanche hot carrier injection (DAHC injection). Note that only electrons are considered below for simplicity.

CHE injection refers to a phenomenon in which electrons having gained energy higher than the barrier of a gate insulating layer are injected from a semiconductor layer into the gate insulating layer or the like. Electrons gain energy by being accelerated by low electric field.

DAHC injection refers to a phenomenon in which electrons that receives energy caused by collision of electrons accelerated by a high electric field are injected to a gate insulating layer or the like. A difference between DAHC injection and CHE injection is whether or not they involve avalanche breakdown caused by impact ionization. Note that DAHC injection requires electrons having a kinetic energy higher than a band gap of a semiconductor.

Figure 6:
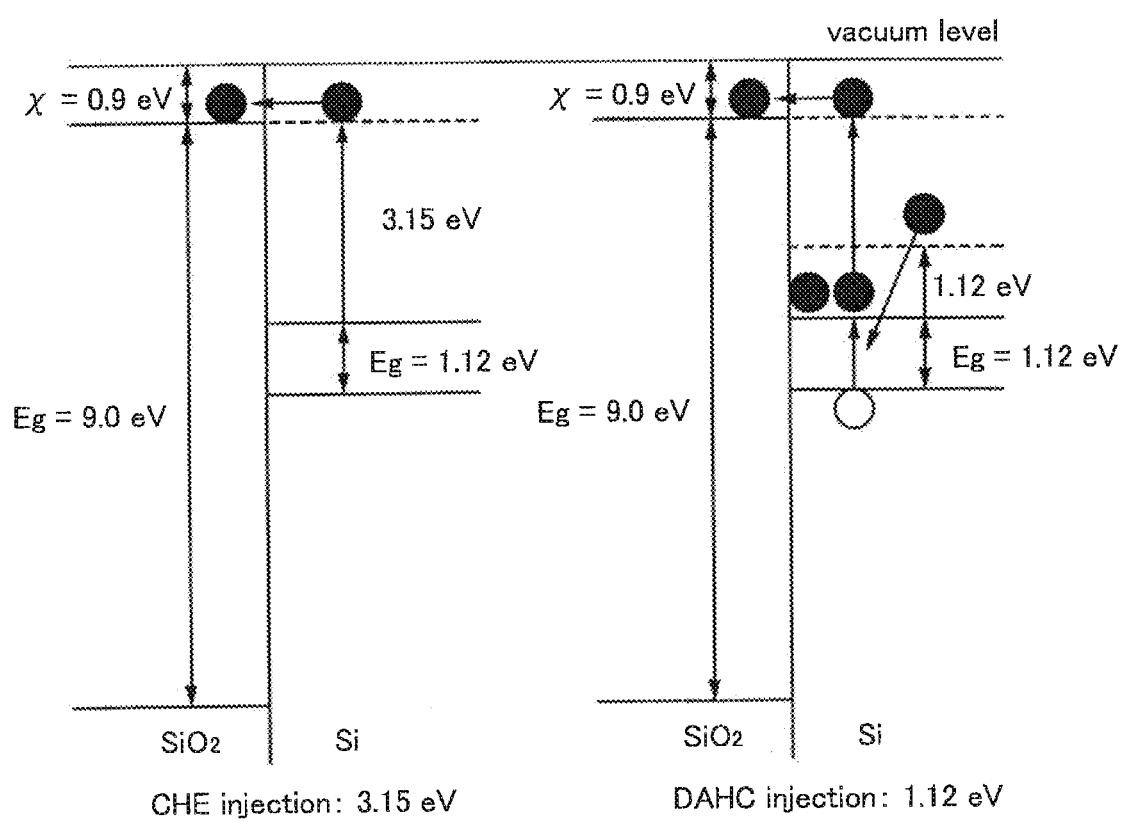
FIG. 6 is a diagram illustrating energy needed for injection of hot carriers in silicon (Si).
Figure 7:
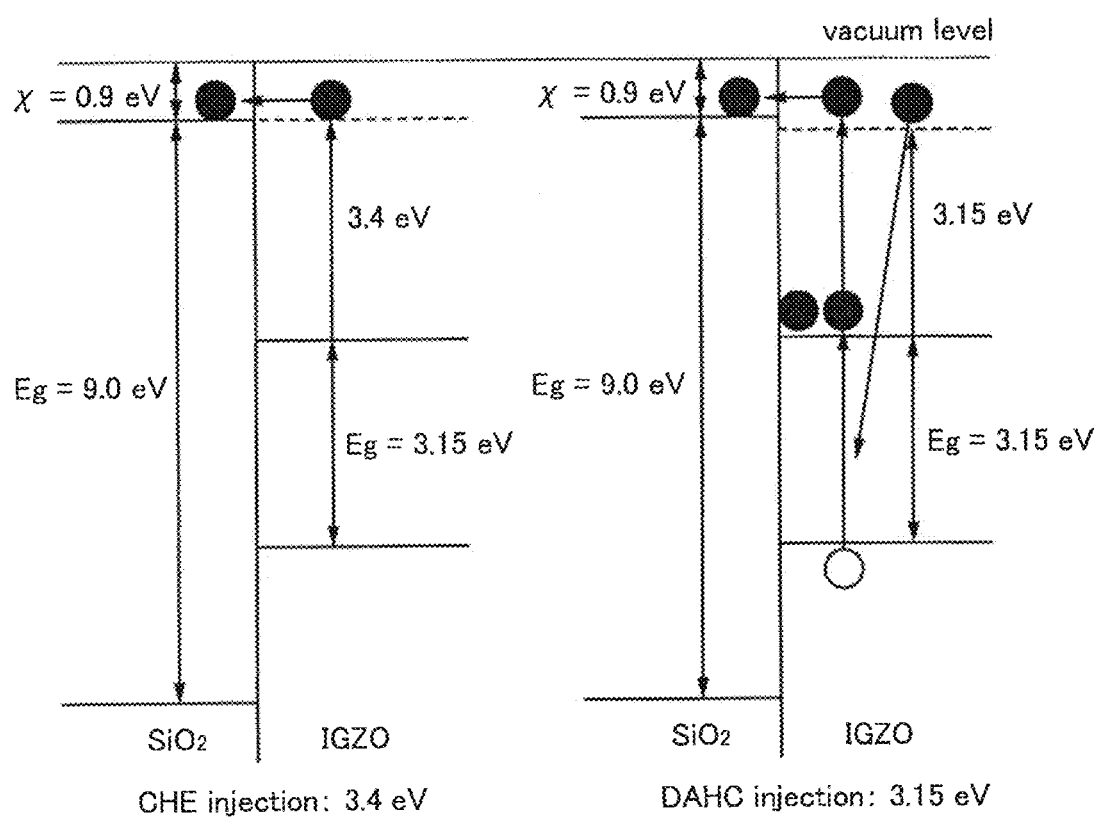
FIG. 7 is a diagram illustrating energy needed for injection of hot carriers in an In—Ga—Zn—O-based oxide semiconductor (IGZO).
Figure 8:
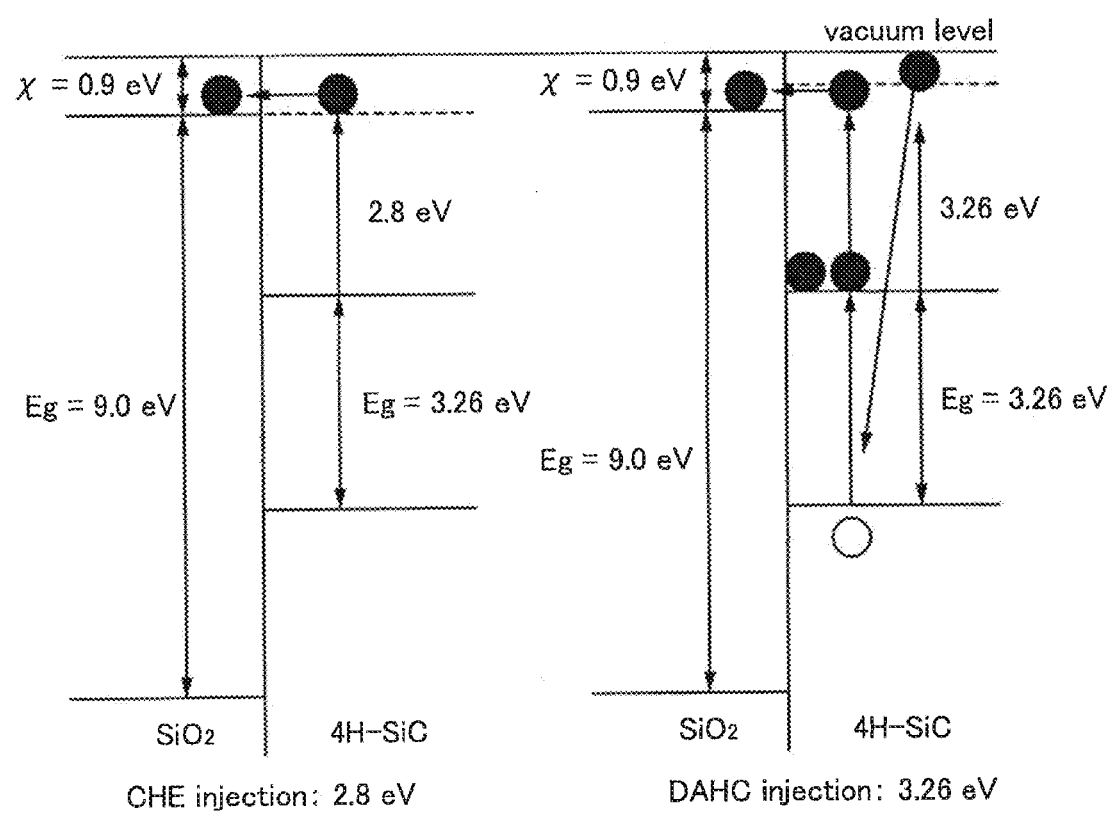
FIG. 8 is a diagram illustrating energy needed for injection of hot carriers in silicon carbide (4H—SiC).

FIG. 6 illustrates energy required for each hot carrier injection which is estimated from the band structure of silicon (Si), and FIG. 7 illustrates energy required for each hot carrier injection which is estimated from the band structure of an In—Ga—Zn—O-based oxide semiconductor (IGZO). In each of FIG. 6 and FIG. 7, the left part shows CHE injection, and the right part shows DAHC injection.

Regarding silicon, degradation caused by DAHC injection is more serious than that caused by CHE injection. This results from the fact that carriers (e.g., electrons) which are accelerated without colliding are very few in silicon whereas silicon has a narrow band gap and avalanche breakdown readily occurs therein. The avalanche breakdown increases the number of electrons capable of travelling over the barrier of the gate insulating layer, and the probability of DAHC injection readily becomes higher than that of CHE injection.

Regarding an In—Ga—Zn—O-based oxide semiconductor, the energy required for CHE injection does not greatly differ from that in the case of silicon, and the probability of CHE injection is still low. In addition, the energy required for DAHC injection is substantially equal to the energy required for CHE injection due to a wide band gap.

In other words, in an In—Ga—Zn—O-based oxide semiconductor, the probabilities of both CHE injection and DAHC injection are low and the resistance to hot carrier degradation is higher than that of silicon.

Meanwhile, the band gap of an In—Ga—Zn—O-based oxide semiconductor is comparable to that of silicon carbide (SiC) which attracts attention as a material having a high withstand voltage. FIG. 8 illustrates energy required for each hot carrier injection regarding 4H—SiC. FIG. 8 shows the CHE injection and the DAHC injection. Regarding CHE injection, an In—Ga—Zn—O-based oxide semiconductor has a slightly higher threshold and can be said to have an advantage.

As described above, it can be seen that an In—Ga—Zn—O-based oxide semiconductor has significantly higher resistance to hot carrier degradation and higher resistance to source-drain breakdown than silicon. It can also be said that a withstand voltage comparable to that of silicon carbide can be obtained.

<Short-Channel Effect in Transistor Including Oxide Semiconductor>

Next, a short-channel effect in a transistor including an oxide semiconductor will be described with reference to FIG. 9 and FIG. 10. Note that the following description is based on the assumption of an ideal situation for easy understanding and does not necessarily reflect a real situation. Note also that the following description is just a consideration.

The short-channel effect refers to degradation of electric characteristics which becomes obvious with miniaturization of a transistor (a reduction in channel length (L)). The short-channel effect results from the effect of a drain on a source. Specific examples of the short-channel effect are a decrease in threshold voltage, an increase in subthreshold swing (S value), an increase in leakage current, and the like.

Here, a structure capable of suppressing a short-channel effect is examined by device simulation. Specifically, four kinds of models each having a different carrier concentration and a different thickness of an oxide semiconductor layer were prepared, and the relationship between a channel length (L) and a threshold voltage ($V_{th}$) was evaluated. As the models, bottom-gate transistors were employed, each of which included an oxide semiconductor layer whose carrier concentration was $1.7\times10^{-8}/cm^3$ or $1.0\times10^{15}/cm^3$ and thickness was 1 μm or 30 nm. Note that an In—Ga—Zn—O-based oxide semiconductor was used for the oxide semiconductor layer, and a silicon oxynitride film with a thickness of 100 nm was used as a gate insulating layer. The oxide semiconductor was assumed to have a band gap of 3.15 eV, an electron affinity of 4.3 eV, a relative permittivity of 15, and an electron mobility of 10 $cm^2/Vs$. The relative permittivity of the silicon oxynitride film was assumed to be 4.0. The calculation was performed using device simulation software "ATLAS" produced by Silvaco Inc.

Note that there was no significant difference in calculation results between a top-gate transistor and a bottom-gate transistor.

Figure 9:
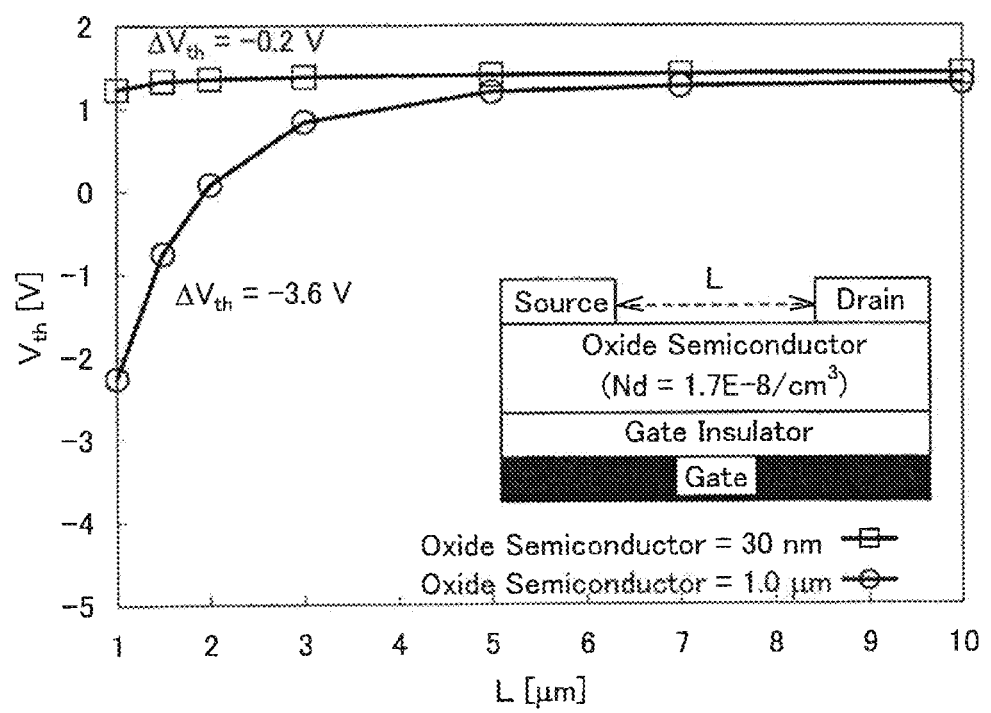
FIG. 9 shows results of device simulation relating to the short channel effect.
Figure 10:
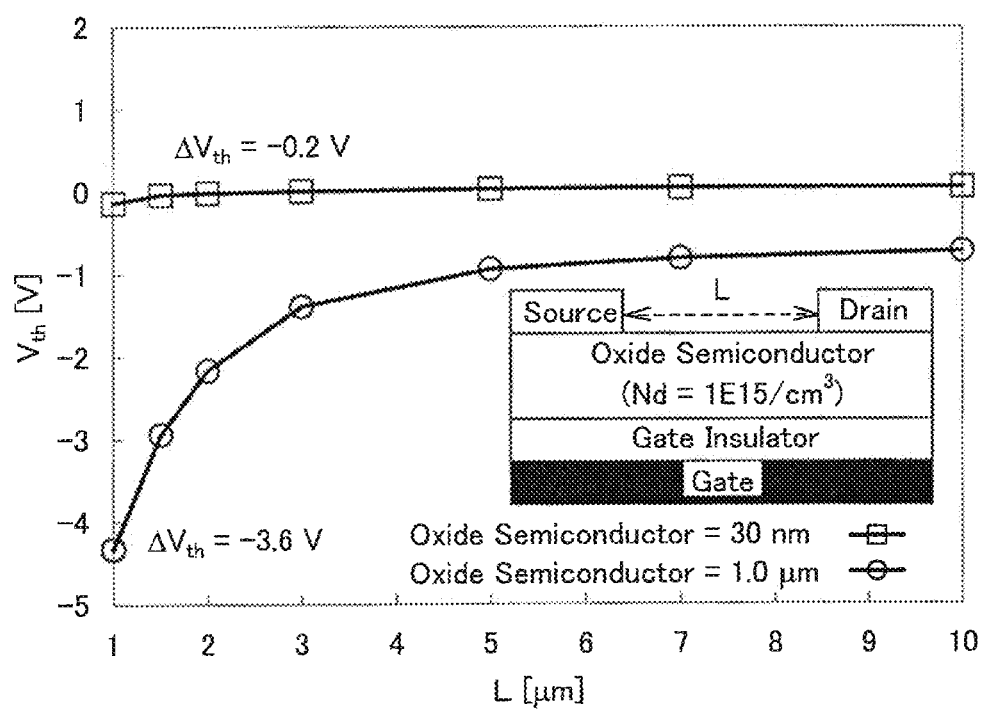
FIG. 10 shows results of device simulation relating to the short channel effect.

FIG. 9 and FIG. 10 show calculation results. FIG. 9 shows the case where the carrier concentration is $1.7\times10^{-8}/cm^3$ and FIG. 10 shows the case where the carrier concentration is $1.0\times10^{15}/cm^3$. FIG. 9 and FIG. 10 each show the amount of shift ($\Delta V_{th}$) in threshold voltage ($V_{th}$) when a transistor whose channel length (L) is 10 μm was used as a reference and channel lengths (L) varied from 10 μm to 1 μm. As shown in FIG. 9, in the case where the carrier concentration in the oxide semiconductor was $1.7\times10^{-8}/cm^3$ and the thickness of the oxide semiconductor layer was 1 μm, the amount of shift ($\Delta V_{th}$) in threshold voltage was −3.6 V. As shown in FIG. 9, in the case where the carrier concentration in the oxide semiconductor was $1.7\times10^{-8}/cm^3$ and the thickness of the oxide semiconductor layer was 30 nm, the amount of shift ($\Delta V_{th}$) in threshold voltage was −0.2 V. As shown in FIG. 10, in the case where the carrier concentration in the oxide semiconductor was $1.0 \times 10^{15}/cm^3$ and the thickness of the oxide semiconductor layer was 1 μm, the amount of shift ($\Delta V_{th}$) in threshold voltage was −3.6 V. As shown in FIG. 10, in the case where the carrier concentration in the oxide semiconductor was $1.0 \times 10^{15}/cm^3$ and the thickness of the oxide semiconductor layer was 30 nm, the amount of shift ($\Delta V_{th}$) in threshold voltage was −0.2 V. The results show that a short-channel effect can be suppressed in a transistor including an oxide semiconductor by a reduction in thickness of an oxide semiconductor layer. For example, in the case where the channel length (L) is approximately 1 μm, even with an oxide semiconductor layer having sufficiently high carrier concentration, it can be understood that a short-channel effect can be sufficiently suppressed when the thickness of the oxide semiconductor layer is set to approximately 30 nm.

<Carrier Concentration>

A technical idea according to the disclosed invention is to make an oxide semiconductor layer as close as possible to an intrinsic (i-type) oxide semiconductor layer by sufficiently reducing the carrier concentration thereof. A method for calculating the carrier concentration and an actually measured carrier concentration will be described with reference to FIG. 11 and FIG. 12.

First, a method for calculating the carrier concentration is briefly explained. The carrier concentration can be calculated in such a manner that a MOS capacitor is manufactured and the results of C-V (capacitance-voltage) measurement (C-V characteristics) of the MOS capacitor are evaluated.

Specifically, carrier concentration Nd can be calculated in the following manner: C-V characteristics are obtained by plotting the relationship between the gate voltage $V_G$ and capacitance C of a MOS capacitor; a graph of the relationship between the gate voltage $V_G$ and $(1/C)^2$ is obtained from the C-V characteristics; a differential value of $(1/C)^2$ in a weak inversion region of the graph is found; and the differential value is substituted into Formula 1. Note that e, co, and E in Formula 1 represent elementary electric charge, vacuum permittivity, and relative permittivity of an oxide semiconductor, respectively.

$$N_d = -\left(\frac{2}{e\varepsilon_0\varepsilon}\right) / \frac{d(1/C)^2}{dV} \quad (1)$$

Next, carrier concentration actually measured by the above method is described. A sample (a MOS capacitor) used for the measurement was formed as follows: a titanium film was formed to a thickness of 300 nm over a glass substrate; a titanium nitride film was formed to a thickness of 100 nm over the titanium film; an oxide semiconductor layer including an In—Ga—Zn—O-based oxide semiconductor was formed to a thickness of 2 μm over the titanium nitride film; a silicon oxynitride film was formed to a thickness of 300 nm over the oxide semiconductor layer; and a silver film was formed to a thickness of 300 nm over the silicon oxynitride film. Note that the oxide semiconductor layer was formed using a metal oxide target for depositing an oxide semiconductor including In, Ga, and Zn (In:Ga:Zn=1:1:0.5 [atomic ratio]) by a sputtering method. Further, an atmosphere in which the oxide semiconductor layer was formed was a mixed atmosphere of argon and oxygen (with a flow ratio of $Ar:O_2$=30 (sccm):15 (sccm)).

Figure 11:
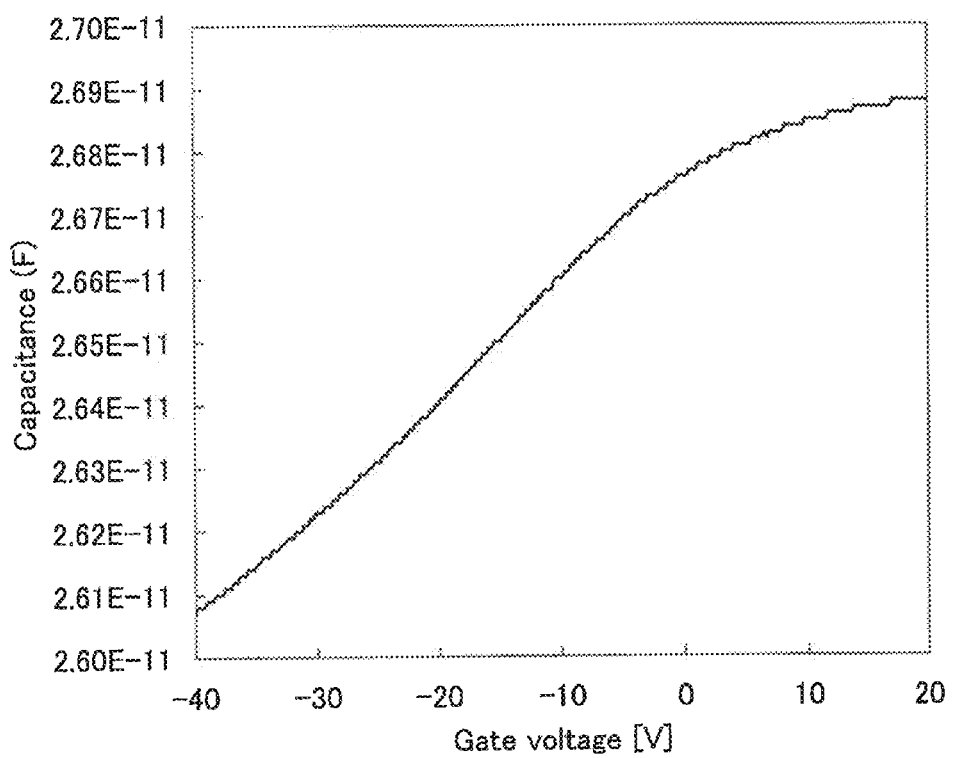
FIG. 11 is a graph showing C-V characteristics.
Figure 12:
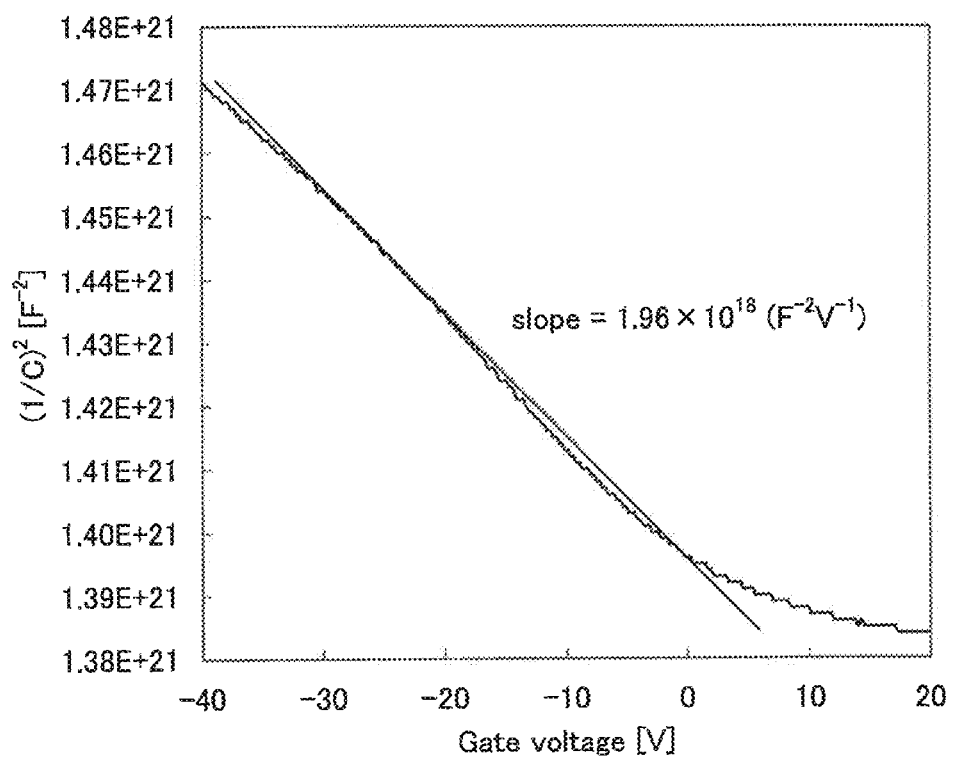
FIG. 12 is a graph showing a relation between Vg and $(1/C)^2$.

FIG. 11 and FIG. 12 illustrate the C-V characteristics and the relationship between $V_G$ and $(1/C)^2$, respectively. Calculation using Formula 1 with the differential value of $(1/C)^2$ in a weak inversion region of the graph of FIG. 12 led to the carrier concentration of $6.0 \times 10^{10}/cm^3$.

In this manner, by using an i-type or substantially i-type oxide semiconductor (for example, with a carrier concentration of lower than $1 \times 10^{12}/cm^3$, preferably lower than or equal to $1 \times 10^{11}/cm^3$, further preferably lower than $1.4 \times 10^{10}/cm^3$), a transistor with excellent off-state current characteristics can be obtained.

In this embodiment, the first conductive layer and the second conductive layer each include a conductive layer including copper as a main component, whereby a semiconductor device in which wiring resistance is reduced can be provided. When the semiconductor device described in this embodiment is applied to a display device with a large screen or a display device with high definition, delay of signal transmission to an end portion of a signal line, drop in voltage of a power supply line, or the like is hardly caused. As a result, a display device in which deterioration of display quality such as display unevenness or a defect in grayscale is suppressed to improve display quality can be provided.

Further, with use of an oxide semiconductor layer which is highly purified to have a carrier concentration lower than $1 \times 10^{12}$ $cm^{-3}$, a switching element having the positive threshold voltage, that is, a so-called normally off characteristic can be realized.

Furthermore, when an oxide semiconductor having a wide band gap which is larger than 2 eV is used for a transistor, off current can be reduced. For example, in the case where a reverse bias is applied to a MOSFET in which an In—Ga—Zn—O-based oxide semiconductor having a band gap of 3.15 eV is used and a channel length is 10 μm, the leakage current is $1 \times 10^{-16}$ A/μm (per micrometer in the channel width) or lower. In addition, the ratio of on current to off current is $10^{10}$ or higher, which is sufficiently high.

As a result, a power-saving semiconductor device in which power is not consumed in an off state and leakage current is suppressed can be provided. Further, a semiconductor device with a high ratio between the on current and the off current can be provided. Further, a display device with high contrast and high display quality can be provided.

With use of a highly purified oxide semiconductor layer, a semiconductor device which has high electron field-effect mobility and operates at high speed can be provided.

Further, since a wiring including copper as a main component is sealed with nitride films, diffusion of copper is suppressed, so that a semiconductor device with higher reliability can be provided.

This embodiment can be freely combined with any of the other embodiments in this specification.

Embodiment 2

In this embodiment, a manufacturing process of the semiconductor device described in Embodiment 1 will be described with reference to FIGS. 13A to 13E. Note that cross sections A1-A2, B1-B2, and C1-C2 in FIGS. 13A to 13E are cross-sectional views taken along chain lines A1-A2, B1-B2, and C1-C2 in FIG. 1A, respectively.

First, the base film 101 including silicon nitride is formed to a thickness greater than or equal to 50 nm and less than or equal to 300 nm, preferably greater than or equal to 100 nm and less than or equal to 200 nm over the substrate 100. As the substrate 100, other than a glass substrate or a ceramic substrate, a plastic substrate or the like with heat resistance which can withstand a process temperature in this manufacturing process can be used. In the case where the substrate does not need a light-transmitting property, a metal substrate such as a stainless steel alloy substrate, provided with an insulating film on its surface may be used. As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further, as the substrate 100, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm).

In this embodiment, aluminoborosilicate glass is used for the substrate 100.

The base film 101 can be formed as a single layer or a stacked layer of a silicon nitride film and/or a silicon nitride oxide film. The base film 101 can be formed by a sputtering method, a CVD method, a coating method, a printing method, or the like as appropriate. Note that the film may be doped with phosphorus (P) or boron (B).

In this embodiment, as the base film 101, a silicon nitride film is formed to a thickness of 100 nm by a PCVD method.

Next, the gate electrode 111a, the storage capacitor wiring 111b, and the gate wiring 111c are formed. First, over the base film 101, the first conductive layer including Cu is formed to a thickness greater than or equal to 100 nm and less than or equal to 500 nm, preferably greater than or equal to 200 nm and less than or equal to 300 nm, by a sputtering method, a vacuum evaporation method, or a plating method. A mask is formed over the conductive layer by a photolithography method, an ink jet method, or the like, and the first conductive layer is etched with use of the mask, so that the gate electrode 111a, the storage capacitor wiring 111b, and the gate wiring 111c are formed. In order to improve adhesion between the base film 101 and the first conductive layer, a layer including metal such as W, Ta, Mo, Ti, Cr, or the like, an alloy layer including any of these in combination, or a layer of a nitride or an oxide of any of these may be formed in the first conductive layer to be in contact with the base film 101.

Formation of the resist mask by an inkjet method needs no photomask; thus, manufacturing cost can be reduced. Alternatively, the gate electrode 111a, the storage capacitor wiring 111b, and the gate wiring 111c can be formed at low cost by discharging a conductive nanopaste of copper or the like over the substrate by an inkjet method and baking the conductive nanopaste.

In this embodiment, a Cu film is formed with a thickness of 250 nm over the base film 101, and the Cu film is selectively etched with use of a resist mask formed by a first photolithography step, so that the gate electrode 111a, the storage capacitor wiring 111b, and the gate wiring 111c are formed.

Next, the first insulating layer 102 is formed. The first insulating layer 102 which functions as a gate insulating layer is formed to a thickness greater than or equal to 50 nm and less than or equal to 800 nm, preferably greater than or equal to 100 nm and less than or equal to 600 nm, over the first conductive layer and the base film 101.

In this embodiment, a silicon nitride ($SiN_y$ (y>0)) layer is deposited over the first conductive layer and the base film 101 by a sputtering method, so that the first insulating layer 102 with a thickness of 100 nm is formed.

Note that an interface with the gate insulating layer is important because an oxide semiconductor which becomes an i-type or substantially i-type oxide semiconductor (an oxide semiconductor which is highly purified) by removal of an impurity is extremely sensitive to an interface state density or an interface electric charge. Thus, higher quality is demanded for the insulating layer in contact with the highly purified oxide semiconductor.

For example, high-density plasma CVD with use of microwaves (2.45 GHz) is preferably employed because formation of a dense and high-quality insulating film having high withstand voltage is possible. When the highly purified oxide semiconductor and the high-quality gate insulating film are in contact with each other, the interface state density can be reduced and favorable interface characteristics can be obtained.

In addition, since the insulating film formed using the high-density plasma CVD apparatus can have a uniform thickness, the insulating film has excellent step coverage. In addition, in the insulating film formed using the high-density plasma CVD apparatus, the thickness of a thin film can be controlled precisely. Note that in this specification, a high-density plasma CVD apparatus refers to an apparatus which can realize a plasma density higher than or equal to $1 \times 10^{11}/cm^3$.

Needless to say, if an insulating film that is favorable as a gate insulating film can be formed, other film formation methods such as a sputtering method and a plasma CVD method can be employed. Alternatively, an insulating film whose film quality and characteristics of the interface with the oxide semiconductor are improved by heat treatment performed after formation of the insulating film may be used. In any case, any insulating film can be employed as long as it has a reduced interface state density of the interface with the oxide semiconductor and can form a favorable interface as well as having a favorable film quality for a gate insulating film.

Next, an oxide semiconductor film 103 is formed. The oxide semiconductor film 103 is formed to a thickness greater than or equal to 5 nm and less than or equal to 200 nm inclusive, preferably, greater than or equal to 10 nm and less than or equal to 20 nm inclusive, over the first insulating layer 102 (see FIG. 13A).

In this embodiment, as the oxide semiconductor film, a 15-nm-thick In—Ga—Zn—O-based non-single-crystal film is formed by a sputtering method using an In—Ga—Zn—O-based oxide semiconductor target.

Note that before the oxide semiconductor film 103 is formed, reverse sputtering in which plasma is generated by introduction of an argon gas is preferably performed to remove dust attached to a surface of the first insulating layer 102. The reverse sputtering refers to a method in which an RF power supply is used for application of a voltage to a substrate side in an argon atmosphere to generate plasma to modify a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used. After the reverse sputtering, the oxide semiconductor film is formed without being exposed to air, whereby dust or moisture can be prevented from attaching to an interface between the oxide semiconductor film 103 and the first insulating layer 102.

As the oxide semiconductor film, the following oxide semiconductors which are also described in Embodiment 1 can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In-A1-Zn-0-based oxide semiconductor, a Sn—Ga—Zn—O-based oxide semiconductor, an Al—Ga—Zn—O-based oxide semiconductor, and a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor; an In—O-based oxide semiconductor; a Sn—O-based oxide semiconductor; and a Zn—O-based oxide semiconductor. Silicon oxide may be added to any of the above oxide semiconductors. As the oxide semiconductor film, a thin film represented by $InMO_3(ZnO)_m$ (m>0) which is described above can be used.

Alternatively, the oxide semiconductor film can be formed by a sputtering method in a rare gas (typically argon) atmosphere, an oxygen atmosphere, or an atmosphere including a rare gas (typically argon) and oxygen. In the case of using a sputtering method, film deposition may be performed using a target containing $SiO_2$ at greater than or equal to 2 percent by weight and less than or equal to 10 percent by weight and $SiO_x$ (x>0) which inhibits crystallization may be contained in the oxide semiconductor film.

Here in this embodiment, the oxide semiconductor film is formed using an oxide semiconductor target, which contains In, Ga, and Zn (the ratio of $In_2O_3$ to $Ga_2O_3$ to ZnO is 1:1:1 or 1:1:2 in molar ratio) under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%). Note that it is preferable to use a pulsed direct-current (DC) power source as a power source, with which dusts can be reduced and a thickness distribution can be reduced.

In that case, the oxide semiconductor film is preferably formed while removing moisture remaining in the treatment chamber. This is for preventing hydrogen, a substance having a hydroxyl group, or moisture from being contained in the oxide semiconductor film.

A multi-chamber sputtering apparatus used in this embodiment is provided with a target of silicon or silicon oxide (artificial quarts), and a target for the oxide semiconductor film. A deposition chamber provided with the target for the oxide semiconductor film is further provided with at least a cryopump as an evacuation unit. Note that a turbo molecular pump may be used instead of the cryopump, and a cold trap may be provided so that moisture or the like may be adsorbed onto an inlet of the turbo molecular pump.

From the chamber in which evacuation is performed with the use of a cryopump, a hydrogen atom, a compound including a hydrogen atom such as water ($H_2O$), a carbon atom, a compound including a carbon atom, or the like, for example, is evacuated. Accordingly, the concentration of an impurity included in the oxide semiconductor film formed in the deposition chamber can be reduced.

In addition, it is preferable that the oxide semiconductor film be successively formed over the first insulating layer 102.

As a sputtering gas used for deposition of the oxide semiconductor film, a high-purity gas is preferably used, in which an impurity such as hydrogen, water, a substance containing a hydroxyl group, or a hydride is reduced to such a degree that the impurity concentration level is represented by the unit "ppm" or "ppb".

The oxide semiconductor film may be formed under a condition where the substrate is heated. At this time, the substrate temperature is set at higher than or equal to 100° C. and lower than or equal to 600° C., preferably higher than or equal to 200° C. and lower than or equal to 400° C. Film formation is performed while the substrate is being heated, whereby the concentration of an impurity contained in the formed oxide semiconductor film can be reduced.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, by performance of a second photolithography step, a resist mask is formed, and the oxide semiconductor film 103 formed from an In—Ga—Zn—O-based non-single-crystal film is etched into an island shape. In etching, for example, organic acid such as citric acid or oxalic acid can be used for etchant. In the case where etching is performed so that the end portions of the island-shaped oxide semiconductor layer have tapered shapes, breakage of a wiring due to a step shape can be prevented. Note that etching here is not limited to wet etching and dry etching may also be performed.

Then, first heat treatment is performed on the substrate over which the island-shaped oxide semiconductor layer is provided, so that the island-shaped oxide semiconductor layer is dehydrated or dehydrogenated.

Note that in this specification, heat treatment in an atmosphere of an inert gas such as nitrogen, a rare gas, or the like is referred to as heat treatment for dehydration or dehydrogenation. In this specification, "dehydrogenation" does not indicate elimination of only $H_2$ by heat treatment. For convenience, elimination of H, OH, and the like is called "dehydration or dehydrogenation".

In this embodiment, as first heat treatment, the temperature of the substrate over which the island-shaped oxide semiconductor layer is provided is heated to a temperature T. The temperature T is equal to or lower than 700° C. (or the temperature equal to or lower than a strain point of a glass substrate), preferably, equal to or higher than 350° C.

and equal to or lower than 500° C., and the first heat treatment is performed for about 1 minute to 10 minutes by RTA (rapid thermal anneal) treatment.

Figure 14A:
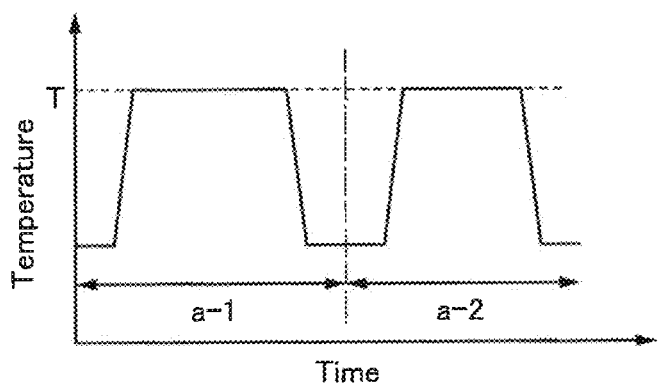
FIGS. 14A and 14B are diagrams describing a heating process according to one embodiment.

In the first heat treatment, the temperature of the substrate is changed over time as shown in FIG. 14A.

In a period (a-1), the atmosphere including the substrate is a nitrogen atmosphere, the substrate temperature is increased to the temperature T and then kept at the temperature T, and after that, the substrate temperature is decreased in a nitrogen atmosphere. In the subsequent period (a-2), the atmosphere including the substrate is changed from a nitrogen atmosphere to an oxygen atmosphere or a dry air atmosphere. Then, the substrate temperature is increased to the temperature T and kept at the temperature T, and after that, the substrate temperature is decreased in an oxygen atmosphere or a dry air atmosphere.

Note that the process during the period (a-1) and the process during the period (a-2) may be performed in different apparatuses from each other. When the processes are concurrently performed with the different apparatuses, the process time can be shortened.

Figure 14B:
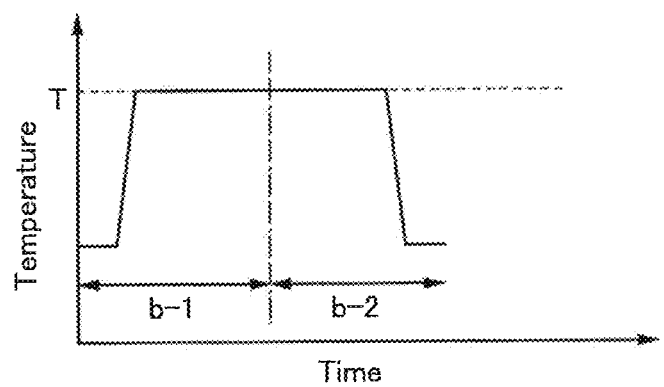

Alternatively, in the first heat treatment, the substrate temperature may be changed over time as shown in FIG. 14B.

In a period (b-1), the atmosphere including the substrate is a nitrogen atmosphere, and the substrate temperature is increased to the temperature T and kept at the temperature T. In the subsequent period (b-2), the atmosphere including the substrate is changed from a nitrogen atmosphere to an oxygen atmosphere or a dry air atmosphere while keeping the substrate temperature at the temperature T, and then the substrate temperature is held at the temperature T. After that, the substrate temperature may be decreased in an oxygen atmosphere or a dry air atmosphere.

Note that, when the process during the period (b-1) and the process during the period (b-2) are performed in one apparatus, the time for delivering the substrate can be shortened, which is preferable.

The inert gas atmosphere used in the first heat treatment is preferably an atmosphere which contains nitrogen or a rare gas (e.g., helium, neon, or argon) as its main component and does not contain water, hydrogen, or the like. Alternatively, the purity of an inert gas which is introduced into a heat treatment apparatus is preferably 6N (99.9999%) or more, more preferably 7N (99.99999%) or more (that is, the impurity concentration is 1 ppm or less, preferably 0.1 ppm or less).

Further, oxygen or dry air introduced into the heat treatment apparatus is preferably a high-purity oxygen gas or an ultra dry air (having a dew point of −40° C. or lower, preferably −60° C. or lower), respectively.

When the oxide semiconductor layer is dehydrated or dehydrogenated, it is important not to expose the oxide semiconductor layer to air and not to enter water or hydrogen into the oxide semiconductor layer.

The heat treatment apparatus used for the first heat treatment may be an electric furnace, an apparatus that heats an object with thermal conduction or thermal radiation given by a medium such as a heated gas, or the like. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

Since dehydration or dehydrogenation can be performed in a short time with a RTA method, the first heat treatment can be performed even at a temperature over the strain point of a glass substrate. A GRTA apparatus is an apparatus for performing heat treatment using a high-temperature gas.

Note that the timing of the first heat treatment is not limited to this timing and may be performed plural times, for example, before and after the photolithography step or the deposition step.

In the oxide semiconductor layer which is sufficiently dehydrated or dehydrogenated under the above conditions, at least one of the two peaks at around 250° C. to 300° C. in spectra which show discharge of moisture is not detected with thermal desorption spectroscopy (TDS) even when the temperature of the dehydrated or dehydrogenated oxide semiconductor layer is increased to 450° C.

The oxide semiconductor layer which is in a just deposited state is an amorphous layer having many dangling bonds. By performance of the first heat treatment for the dehydration or dehydrogenation, dangling bonds within a short distance are bonded to each other, so that the oxide semiconductor layer can have an ordered amorphous structure. As ordering proceeds, the oxide semiconductor layer comes to be formed of a mixture of amorphousness and microcrystals, where an amorphous region is dotted with microcrystals.

Further, by the first heat treatment in a nitrogen atmosphere, the oxide semiconductor layer becomes of oxygen-deficient type, as well as being dehydrated or dehydrogenated, and resistance of the oxide semiconductor layer is reduced, so that the oxide semiconductor layer becomes a n-type (such as $n^-$-type or $n^+$-type) layer. For example, by performance of the first heat treatment in a nitrogen atmosphere, the carrier concentration of the oxide semiconductor layer is higher than that of the oxide semiconductor layer which is just after deposition, which is preferably $1 \times 10^{18}/cm^3$ or higher.

The oxide semiconductor layer which is of n-type (such as $n^-$-type or $n^+$-type) is subjected to treatment in which heating and sequential cooling are performed in an oxygen atmosphere or a dry air atmosphere, whereby oxygen is supplied to the oxygen-deficient portion. The oxide semiconductor layer in which oxygen is supplied to the oxygen-deficient portion has increased resistance; that is, the oxide semiconductor layer becomes an i-type layer.

Through the above steps, the oxide semiconductor layers 113a and 113b which are highly purified are obtained. A transistor including the highly purified oxide semiconductor layer 113a has a positive threshold voltage and realizes a so-called normally off switching element.

Among the electric characteristics of the transistor, the threshold voltage ($V_{th}$) is particularly important. When the threshold voltage value is high or is on the minus side even when the field effect mobility is high, it is difficult to control the circuit. In the case of a transistor where the threshold voltage is high and an absolute value of the threshold voltage is large, the transistor cannot function as a switching and might be a load when the transistor is driven at low voltage.

In the case of an n-channel transistor, it is desirable that only after a positive voltage is applied as a gate voltage, a channel be formed and a drain current flows. A transistor in which a channel is not formed unless the driving voltage is increased and a transistor in which a channel is formed and drain current flows even in the case of the negative voltage state are unsuitable for a transistor used for a circuit. If the threshold voltage of the transistor is negative, it tends to be normally on; in other words, current flows between the source electrode and the drain electrode even when the gate voltage is 0 V.

As for an active-matrix display device, electric characteristics of a transistor included in a circuit are significantly important and performance of the display device depends on the electric characteristics. In the case of using the transistor for a display device, it is desirable for a display device that a channel be formed by apply of a positive threshold voltage which is as close to 0V as possible to a gate.

The first heat treatment of the oxide semiconductor layer can be performed on the oxide semiconductor film 103 which has not yet been processed into the island-shaped oxide semiconductor layer. In that case, after performance of the first heat treatment, the substrate is taken out from the heat apparatus, and then a photolithography step is performed to process the oxide semiconductor film into the island-shaped oxide semiconductor layer.

Further, before formation of a second conductive layer including Cu, the first insulating layer 102 may be selectively etched, so that a contact hole reaching the first conductive layer is formed. In the case where the second conductive layer is formed after the contact hole reaching the first conductive layer is formed, the first conductive layer and the second conductive layer can be connected to each other not through another conductive layer but directly. When the number of contact holes needed for a connection is small, electric resistance can be reduced and the area occupied by the contact hole can also be reduced.

Next, the second conductive layer including Cu is formed. The second conductive layer including Cu is formed to have a thickness greater than or equal to 100 nm and less than or equal to 500 nm, preferably greater than or equal to 200 nm and less than or equal to 300 nm over the oxide semiconductor layers 113a and 113b and the first insulating layer by a sputtering method, a vacuum evaporation method, or a plating method. Then, a mask is formed by a photolithography method, an inkjet method, or the like over the conductive layer, and the second conductive layer is etched with use of the mask, so that the first electrode 115a and the second electrode 115b which function as source and drain electrodes and the source wiring 115c are formed.

In this embodiment, a 250-nm-thick Cu film is formed over the oxide semiconductor layers 113a and 113b and the first insulating layer. Then, the Cu film is selectively etched with use of a resist mask formed by a third photolithography step, so that the first electrode 115a and the second electrode 115b which function as source and drain electrodes and the source wiring 115c are formed.

Note that an exposed region of the oxide semiconductor layer is sometimes etched in the third photolithography step depending on the etching conditions. In that case, the oxide semiconductor layer in a region over the gate electrode 111a which does not overlap with the first electrode 115a or the second electrode 115b has a thickness smaller than the oxide semiconductor layer in a region which overlaps with the first electrode 115a or the second electrode 115b (see FIG. 13C).

Note that copper oxide is generated on a surface of a Cu film which is in contact with the oxide semiconductor layer, by heat applied in a manufacturing step of a semiconductor device described in this embodiment. However, copper oxide does not block electrical connection because it is a semiconductor.

Next, the second insulating layer 107 is formed. The second insulating layer 107 includes at least a silicon nitride film and is formed with use a method by which an impurity such as water or hydrogen is not incorporated (e.g., a sputtering method or the like) so as not to contaminate the highly purified oxide semiconductor layer.

In this embodiment, a silicon nitride (SiN$_y$ (y>0)) layer is formed as the second insulating layer 107 to be in contact with the first electrode 115a and the second electrode 115b, the source wiring 115c, the first insulating layer 102, and the oxide semiconductor layer. The silicon nitride (SiN$_y$ (y>0)) layer is formed, for example, by an RF sputtering method with use of a silicon nitride target in a rare gas (such as an argon gas) to have a thickness of 400 nm.

Deposition of a silicon nitride film is performed by a sputtering method with use of a high-purity gas and a sputtering apparatus provided with a cryopump. Note that a nitride insulating film formed by a sputtering method is distinctively dense and even a single layer of the nitride insulating film can be used as a protective film for suppressing a phenomenon in which an impurity is diffused into a layer in contact therewith.

At this stage, a region where the oxide semiconductor layer and the second insulating layer 107 are in contact with each other is formed. A region of the oxide semiconductor layer which overlaps with the gate electrode and is in contact with and interposed between the first insulating layer 102 and the second insulating layer 107 is a channel formation region. Further, the second insulating layer 107 functions as a channel protective layer (see FIG. 13D).

Next, second heat treatment is performed in an inert gas atmosphere or an oxygen gas atmosphere. The temperature of the heat treatment is higher than or equal to 200° C. and lower than or equal to 400° C., preferably higher than or equal to 250° C. and lower than or equal to 350° C. For example, the heat treatment may be performed in a nitrogen atmosphere at 250° C. for one hour. The second heat treatment can reduce variation in electric characteristics of the transistor. Note that in this embodiment, the second heat treatment is performed after the second insulating layer 107 is formed; however, the timing of performance of the second heat treatment is not particularly limited as long as it is performed after the first heat treatment.

Next, the third insulating layer 108 is formed to a thickness greater than or equal to 50 nm and less than or equal to 300 nm, preferably greater than or equal to 100 nm and less than or equal to 200 nm. The method for the formation of the third insulating layer 108 is not limited to a particular method, and the following method can be used depending on the material: a sputtering method, an SOG method, spin coating, dip coating, spray coating, a droplet discharge method (e.g., an inkjet method, screen printing, or offset printing), or the like.

In the case where the third insulating layer 108 is formed by coating a material solution and performing baking, the second heat treatment (at higher than or equal to 200° C. and lower than or equal to 400° C., preferably higher than or equal to 250° C. and lower than or equal to 350° C.) may be performed in this baking step. When the baking of the third insulating layer 108 and the annealing of the oxide semiconductor layer are performed at the same time, a semiconductor device can be manufactured efficiently.

Next, a contact hole 128 for connecting the second electrode 115b and the first pixel electrode 109 is formed in the second insulating layer 107 and the third insulating layer 108. The contact hole is formed by forming a mask over the third insulating layer 108 by a photolithography method, an inkjet method, or the like, and then selectively etching the second insulating layer 107 and the third insulating layer 108 using the mask. In this embodiment, the second insulating layer 107 and the third insulating layer 108 are selectively etched using a resist mask formed by a fourth photolithography step, whereby the contact hole 128 is formed.

Then, the first pixel electrode 109 is formed. First, a conductive film transmitting visible light is formed with a thickness greater than or equal to 30 nm and less than or equal to 200 nm, preferably greater than or equal to 50 nm and less than or equal to 100 nm by a sputtering method, a vacuum evaporation method, or the like to be in contact with the third insulating layer 108 and the second electrode 115b through the contact hole 128. A mask is formed over the conductive film by a photolithography method, an inkjet method, or the like, and the conductive film is etched with use of the mask, so that the first pixel electrode 109 is formed.

Figure 13A:
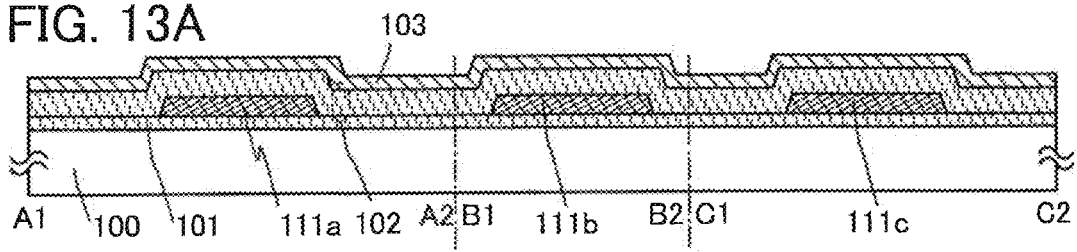
FIGS. 13A to 13E illustrate a method for manufacturing a semiconductor device according to one embodiment.
Figure 13B:
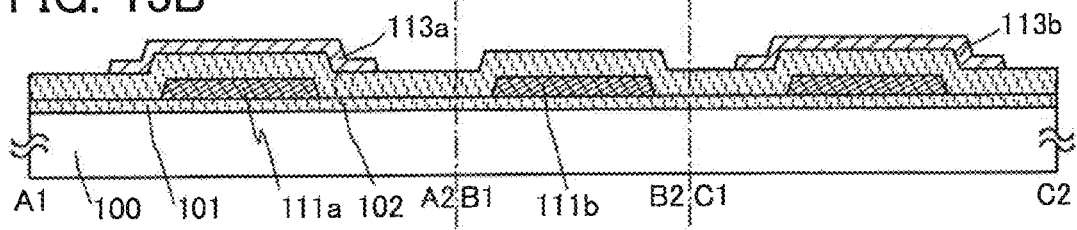
Figure 13C:
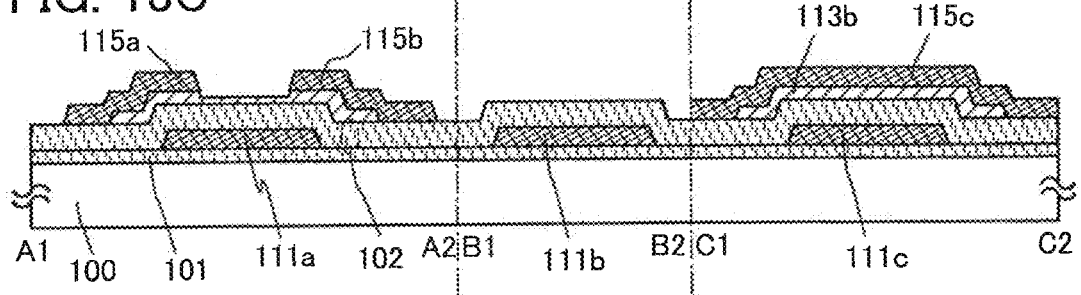
Figure 13D:
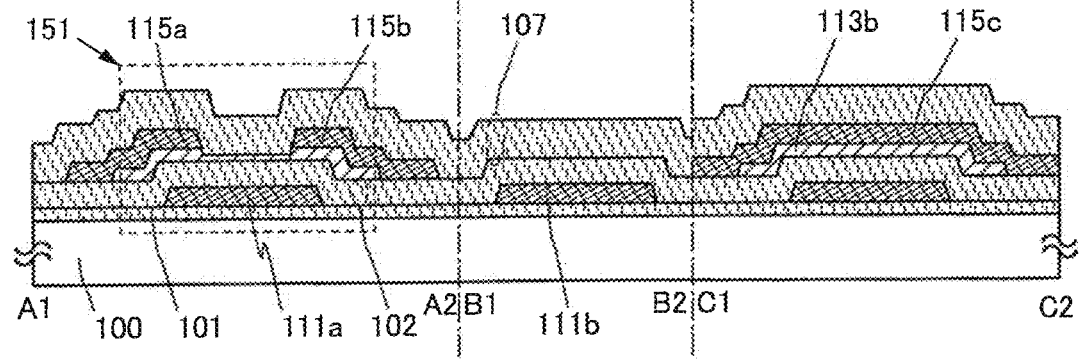
Figure 13E:
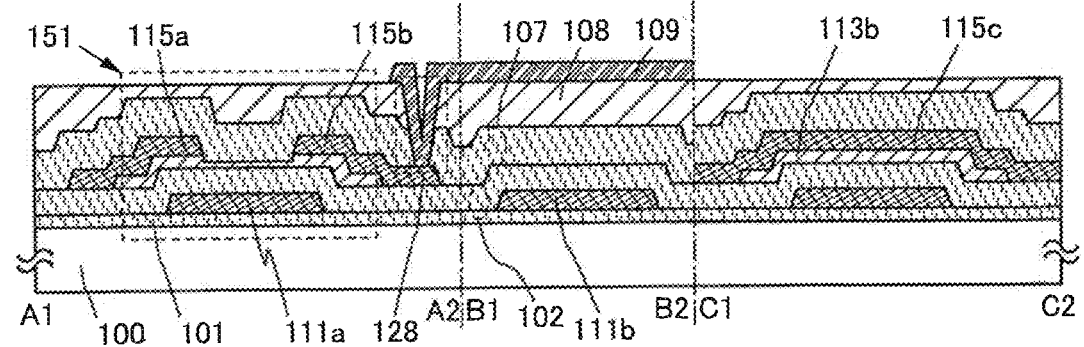

In this embodiment, a 80-nm-thick indium tin oxide (hereinafter, also referred to as ITO) film is formed as the conductive film transmitting visible light, and then the conductive film transmitting visible light is selectively etched using a resist mask formed by a fifth photolithography step, whereby the first pixel electrode 109 is formed (see FIG. 13E).

For the conductive film transmitting visible light, a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added can be used.

Alternatively, the conductive film transmitting visible light can be formed using a conductive composition including a conductive high molecule (also referred to as a conductive polymer). The pixel electrode formed using a conductive composition desirably has a sheet resistance of less than or equal to 10000 ohms per square and a light transmittance of more than or equal to 70% at a wavelength of 550 nm. Further, the resistivity of the conductive high molecule included in the conductive composition is preferably less than or equal to 0.1 Ω·cm.

In this embodiment, an oxide semiconductor layer from which an impurity typified by a hydrogen atom or a compound including a hydrogen atom such as $H_2O$ is removed with use of a high-purity gas, a cryopump, and the like is formed, and the oxide semiconductor layer is subjected to first heat treatment to be highly purified, so that an oxide semiconductor layer in which the carrier concentration is further reduced can be formed. As a result, a transistor can be formed by using an intrinsic or substantially intrinsic oxide semiconductor (for example, in which the carrier concentration is lower than $1\times10^{12}/cm^3$, preferably $1\times10^{11}/cm^3$ or lower), whereby a transistor with a significantly excellent off current characteristic can be provided.

In addition, in this embodiment, dehydration or dehydrogenation which is performed by the first heat treatment in an inert gas atmosphere, and supply of oxygen to the oxygen-deficient portion which is performed in an oxygen atmosphere or a dry air atmosphere are conducted in succession, whereby the process time can be shortened.

This embodiment can be freely combined with any of the other embodiments in this specification.

Embodiment 3

In this embodiment, one embodiment of a substrate provided with a circuit of a display device which has a structure different from that of Embodiment 1 will be described with reference to FIGS. 15A and 15B.

Figure 15A:
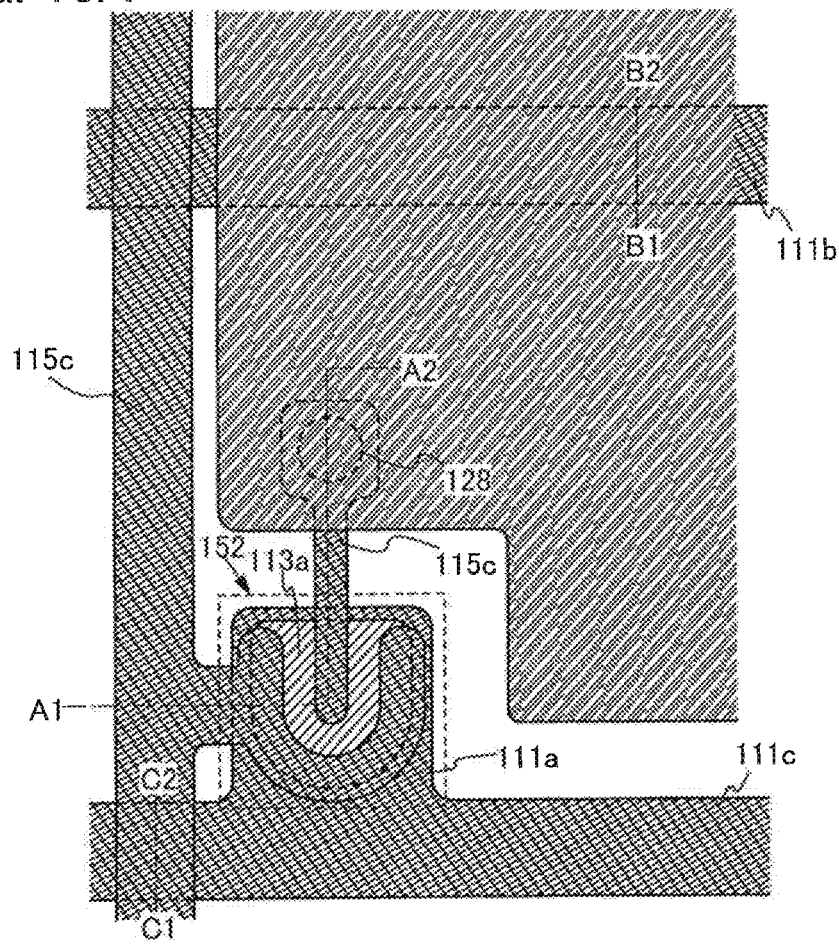
FIGS. 15A and 15B illustrate a semiconductor device according to one embodiment.
Figure 15B:
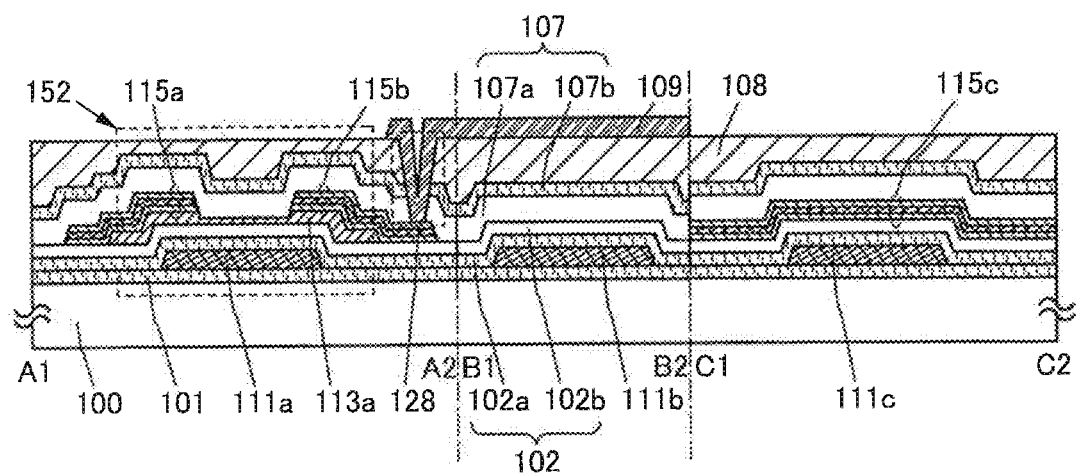

A structure of a pixel in the display device is illustrated in FIGS. 15A and 15B. FIG. 15A is a top view illustrating a plan structure of the pixel, and FIG. 15B is a cross-sectional view illustrating a stacked structure in the pixel. Note that chain lines A1-A2, B1-B2, and C1-C2 in FIG. 15A correspond to cross sections A1-A2, B1-B2, and C1-C2 in FIG. 15B, respectively.

In the cross section A1-A2, a stacked structures in a transistor 152 used in the pixel portion is illustrated. The transistor 152 is one embodiment of a transistor having a bottom gate structure.

In the cross section B1-B2, a stacked structure in a capacitor formed in the pixel portion is illustrated.

Further, in the cross section C1-C2, a stacked structure in an intersection portion of a gate wiring and a source wiring is illustrated.

The substrate provided with a circuit of a display device described in this embodiment has a difference in structures of the first insulating layer 102, the second insulating layer 107, and the second conductive layer from those of the substrate provided with a circuit of a display device described in Embodiment 1. In addition, a structure of the intersection portion of the gate wiring and the source wiring is different.

Specifically, the first insulating layer 102 is a stacked layer of an insulating layer 102a and an insulating layer 102b, and the second insulating layer 107 is a stacked layer of an insulating layer 107a and an insulating layer 107b. A layer including copper as a main component which is included in the second conductive layer is in contact with a barrier layer. In the intersection portion of the gate wiring and the source wiring, the first insulating layer 102 is interposed between the gate wiring 111c formed using the first conductive layer and the source wiring 115c formed using the second conductive layer.

The substrate provided with a circuit of a display portion described in this embodiment has the same structure as the substrate provided with a circuit of a display portion described in Embodiment 1 except for the first insulating layer 102, the second insulating layer 107, the barrier layer in contact with a layer including copper as a main component which is included in the second conductive layer, and the structure of the intersection portion of the gate wiring and the source wiring; thus, the detailed description is omitted.

In this embodiment, the first insulating layer 102 includes two layers. A silicon nitride ($SiN_y$ (y>0)) layer is used for the insulating layer 102a which is in contact with the first conductive layer including copper as a main component and the base film 101, and a silicon oxide ($SiO_x$ (x>0)) layer is used for the insulating layer 102b which is in contact with the oxide semiconductor layer. The thickness of the first insulating layer 102 is 100 nm.

The first insulating layer 102 functions as a gate insulating layer and is formed over the first conductive layer and the base film 101 to have a thickness greater than or equal to 50 nm and less than or equal to 800 nm, preferably greater than or equal to 100 nm and less than or equal to 600 nm.

The first conductive layer including copper as a main component is formed between two silicon nitride films which are the base film 101 and the insulating layer 102a, whereby diffusion of copper can be suppressed.

The oxide semiconductor which becomes an i-type or becomes substantially i-type semiconductor (an oxide semiconductor which is highly purified) due to removal of an impurity is extremely sensitive to an interface state density or an interface electric charge; thus, an interface with the gate insulating film is important. Therefore, the insulating layer 102b that is in contact with the highly purified oxide semiconductor needs to have higher quality.

For example, high-density plasma CVD with use of microwaves (2.45 GHz) is preferably employed since formation of a dense and high-quality insulating film having high withstand voltage is possible. When the purified oxide semiconductor and the high-quality gate insulating film are in contact with each other, the interface state density can be reduced and favorable interface characteristics can be obtained.

In addition, since the insulating film formed with use of the high-density plasma CVD apparatus can have a uniform thickness, the insulating film has excellent step coverage. In addition, in the insulating film formed with use of the high-density plasma CVD apparatus, the thickness of a thin film can be controlled precisely.

If an insulating film that is favorable as a gate insulating film can be formed, other film formation methods such as a sputtering method and a plasma CVD method can be employed. Alternatively, an insulating film whose film quality and characteristics of the interface with the oxide semiconductor are improved by heat treatment performed after formation of the insulating film may be used. In any case, any insulating film can be employed as long as it has a reduced interface state density of the interface with the oxide semiconductor and can form a favorable interface as well as having a favorable film quality for a gate insulating film.

In this embodiment, in the case where the insulating layer 102b is formed with use of a high-density plasma CVD apparatus (in this specification, the high-density plasma CVD apparatus indicates a device which can achieve the plasma density of $1\times10^{11}/cm^3$ or higher), plasma is generated by application of a microwave power of 3 kW to 6 kW, for example, so that the insulating film is formed.

A monosilane gas ($SiH_4$), nitrous oxide ($N_2O$), and a rare gas are introduced into a chamber as a source gas to generate high-density plasma at a pressure of 10 Pa to 30 Pa so that an insulating film is formed over a substrate having an insulating surface, such as a glass substrate. After that, the supply of a monosilane gas is stopped, and nitrous oxide ($N_2O$) and a rare gas are introduced without exposure to air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

In forming the insulating layer 102b, the flow ratio of a monosilane ($SiH_4$) gas to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon which is inexpensive is preferably used.

In addition, since the insulating film formed by using the high-density plasma apparatus can have uniform thickness, the insulating film has excellent step coverage. Further, in the insulating film formed by using the high-density plasma apparatus, the thickness of a thin film can be controlled precisely.

The insulating film formed through the above process procedure is greatly different from the insulating film formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating film formed using the high-density plasma apparatus is a dense film.

Alternatively, a silicon oxide layer formed by CVD using an organosilane gas can be used for the insulating layer 102b. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

In this embodiment, the layer including copper as a main component which is included in the second conductor layer is in contact with the barrier layers, and tantalum nitride which is a conductive metal nitride is used for the barrier layers. Specifically, the first electrode 115a, the second electrode 115b, and the source wiring 115c which are formed using the second conductive layer each have a structure in which a layer including copper as a main component is stacked between tantalum nitride layers.

The barrier layer may be formed using a material which suppresses diffusion of copper, particularly, metal nitride. Note that if the first insulating layer 102 or the second insulating layer 107 which is in contact with the layer including copper as a main component is formed using metal nitride, such insulating layers may function as a barrier layer.

In particular, the barrier layer which is in contact with the oxide semiconductor layer 113a is formed using a metal nitride having conductivity. For example, titanium nitride, tantalum nitride, tungsten nitride, or the like can be used for the barrier layer. The oxide semiconductor layer 113a and the layer including copper as a main component which is included in the second conductive layer are stacked with the conductive barrier layer interposed therebetween, whereby diffusion of copper can be suppressed and the oxide semiconductor layer 113a and the layer including copper as a main component which is included in the second conductive layer can be electrically connected.

The barrier layer of the second conductive layer is formed over the oxide semiconductor layers 113a and the first insulating layer 102, and the layer including copper as a main component is formed to be in contact with the barrier layer. The second conducive layer is formed to a thickness greater than or equal to 100 nm and less than or equal to 500 nm, preferably greater than or equal to 200 nm and less than or equal to 300 nm, by a sputtering method, a vacuum evaporation method, a plating method, or the like.

Next, a mask is formed over the second conductive layer by a photolithography method, an inkjet method, or the like, and the etching is performed with use of the mask, so that the first electrode 115a and the second electrode 115b which function as source and drain electrodes and the source wiring 115c are formed.

In this embodiment, the second insulating layer 107 has a stacked layer of the insulating layer 107a and the insulating layer 107b. The insulating layer 107a in contact with the barrier layer of the second conductive layer and the oxide semiconductor layer is formed using a silicon oxide ($SiO_x$ (x>0)) layer, and the insulating layer 107b in contact with the insulating layer 107a is formed using a silicon nitride ($SiN_y$ (y>0)) layer with a thickness of 400 nm.

As a method for forming the second insulating layer 107, a method by which an impurity such as water or hydrogen is not incorporated (e.g., a sputtering method or the like) is selected so as not to contaminate the highly purified oxide semiconductor layer.

The insulating layer 107a is formed by a pulsed DC sputtering method using a columnar polycrystalline silicon target doped with boron (the resistivity is 0.01 Ωcm) with a purity of 6 N under conditions where the distance between the substrate and the target (T–S distance) is 89 mm, the pressure is 0.4 Pa, the direct-current (DC) power is 6 kW, and the atmosphere is an oxygen atmosphere (the proportion of the oxygen flow is 100%). The thickness thereof is 300 nm.

The substrate temperature in film formation may be higher than or equal to room temperature and lower than or equal to 300° C. and in this embodiment, is 100° C.

Formation of the silicon oxide layer by a sputtering method is performed with use of a high-purity gas and a sputtering apparatus provided with a cryopump. The sputtering method can be carried out in a rare gas (typically argon) atmosphere, an oxygen atmosphere, or an atmosphere including a rare gas (typically argon) and oxygen. Note that the oxide insulating film formed by a sputtering method is distinctively dense, and even a single layer of the oxide insulating film can be used as a protective film for suppressing a phenomenon in which an impurity is diffused into a layer in contact therewith.

As a target, a silicon oxide target or a silicon target may be used. In addition, a target doped with phosphorus (P) or boron (B) can be used so that phosphorus (P) or boron (B) is added to the oxide insulating film.

Note that in the case where the oxide insulating film is used for the insulating layer 107a in contact with the oxide semiconductor layer, for example, in the case where a silicon oxide ($SiO_x$ (x>0)) layer with a thickness of 1 nm or more is formed, a silicon target is preferably used. A silicon oxide film formed by sputtering in an oxygen and rare gas atmosphere by using the silicon target contains a large number of dangling bonds of silicon atoms or oxygen atoms.

The impurity left in the oxide semiconductor layer diffuses into the insulating layer 107a including a large number of dangling bonds of silicon atoms or oxygen atoms and is fixed. Specifically, a hydrogen atom, a compound including a hydrogen atom such as $H_2O$, or the like in the oxide semiconductor layer is likely to diffuse and move into the insulating layer 107a and fixed in the insulating layer 107a.

At this stage, a region where the oxide semiconductor layer is in contact with the insulating layer 107a is formed. A region of the oxide semiconductor layer, which overlaps with the gate electrode and sandwiched between and in contact with the insulating layer 102b and the insulating layer 107a, functions as a channel formation region. Further, the second insulating layer 107 functions as a channel protective layer.

Note that in this embodiment, the insulating layer 107b is formed by an RF sputtering method.

In this embodiment, the layer including copper as a main component which is included in the second conductive layer is in contact with the barrier layer; thus, diffusion of copper is suppressed. In addition, the oxide semiconductor layer and the layer including copper as a main component which is included in the second conductive layer are stacked with the conductive barrier layer interposed therebetween, whereby diffusion of copper can be suppressed and the oxide semiconductor layer can be electrically connected to the layer including copper as a main component which is included in the second conductive layer.

An oxide insulating layer is used for the second insulating layer which is on the side in contact with the oxide semiconductor layer, whereby oxygen deficiency in the oxide semiconductor layer can be reduced.

This embodiment can be freely combined with any of the other embodiments in this specification.

Embodiment 4

In this embodiment, with reference to FIGS. 16A to 16C, described is an example in which an inverter circuit is formed using two transistors with four-terminal structure in which a pair of electrode layers are provided over and below a channel formation region of an oxide semiconductor layer with insulating films therebetween. A transistor illustrated in FIG. 16A can be manufactured by the same method as the transistor 151 illustrated in FIGS. 1A and 1B in Embodiment 1. Note that the inverter circuit of this embodiment can be used for a driver circuit for driving a pixel portion.

The driver circuit for driving a pixel portion is provided in the periphery of the pixel portion, for example, and formed using an inverter circuit, a capacitor, a resistor, and the like. As one of embodiments of the inverter circuit, the inverter circuit is formed by combination of two n-channel transistors. For example, there are an inverter circuit having a combination of an enhancement type transistor and a depletion type transistor (hereinafter, referred to as an EDMOS circuit) and an inverter circuit having a combination of two enhancement type transistors (hereinafter, referred to as an EEMOS circuit).

Figure 16A:
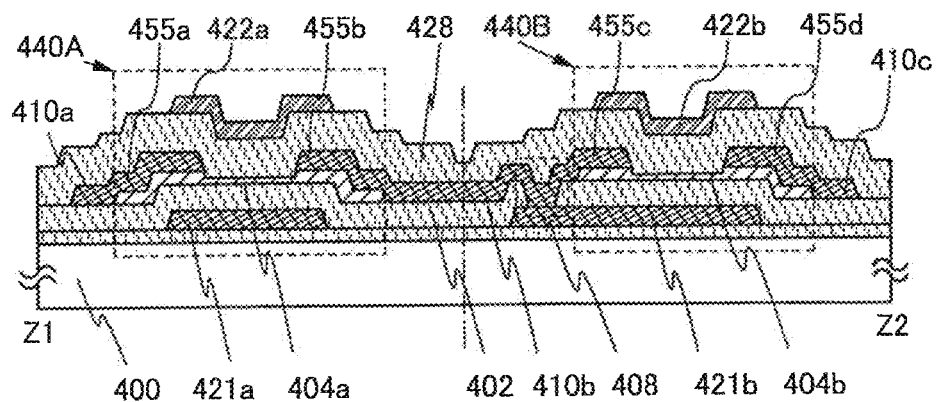
FIGS. 16A to 16C illustrate an inverter circuit according to one embodiment.

FIG. 16A illustrates a cross-sectional structure of the inverter circuit of the driver circuit. A first transistor 440A includes a base film over a substrate 400, a gate electrode 421a formed using a first conductive layer over the base film, and an oxide semiconductor layer 404a including a channel formation region which is over the gate electrode 421a and in contact with a first insulating layer 402. In addition, the first transistor 440A includes a first electrode 455a and a second electrode 455b formed using a second conductive layer, each of which has an end portion over and overlapping with the gate electrode 421a and is in contact with the oxide semiconductor layer 404a. Note that the first electrode 455a and the second electrode 455b each serve as a source electrode or a drain electrode of the first transistor 440A. Moreover, a second insulating layer 428 is provided over the first electrode 455a, the second electrode 455b, the first insulating layer 402, and the oxide semiconductor layer 404a, and an electrode 422a formed using a third conductive layer is provided over the second insulating layer 428.

A second transistor 440B includes a base film over the substrate 400, a gate electrode 421b formed using the first conductive layer over the base film, and an oxide semiconductor layer 404b including a channel formation region which is over the gate electrode 421b and in contact with the first insulating layer 402. In addition, the second transistor 440B includes a third electrode 455c and a fourth electrode 455d formed using the second conductive layer, each of which has an end portion over and overlapping with the gate electrode 421b and is in contact with the oxide semiconductor layer 404b. Note that the third electrode 455c and the fourth electrode 455d each serve as a source electrode or a drain electrode of the second transistor 440B. Moreover, the second insulating layer 428 is provided over the third electrode 455c, the fourth electrode 455d, the first insulating layer 402, and the oxide semiconductor layer 404b, and an electrode 422b formed using the third conductive layer is provided over the second insulating layer 428.

Note that in the first transistor 440A and the second transistor 440B, the second electrode 455b and the third electrode 455c are connected through a second wiring 410b. The third electrode 455c is connected to the gate electrode 421b of the second transistor 440B through a contact hole 408.

The first transistor 440A and the second transistor 440B can be formed in a manner similar to the transistor described in Embodiment 2; thus, the detailed description of the manufacturing method is omitted. Note that after the contact hole 408 is formed in the first insulating layer 402, the second conductive layer is provided, whereby the second wiring 410b connected to the third electrode 455c is directly connected to the gate electrode 421b through the contact hole 408. Such a structure is preferable. Since the number of contact holes needed for a connection is small, electric resistance is reduced and the area occupied by the contact hole can also be reduced. Note that the second electrode 455b, the third electrode 455c, and the second wiring 410b are formed using the second conductive layer and electrically connected to one another.

A first wiring 410a connected to the first electrode 455a of the first transistor 440A is a power supply line to which a negative voltage VDL is applied (a negative power supply line). This power supply line may be a power supply line with a ground potential (a ground potential power supply line).

A third wiring 410c connected to the fourth electrode 455d of the second transistor 440B is a power supply line to which a positive voltage VDH is applied (a positive power supply line).

Figure 16B:
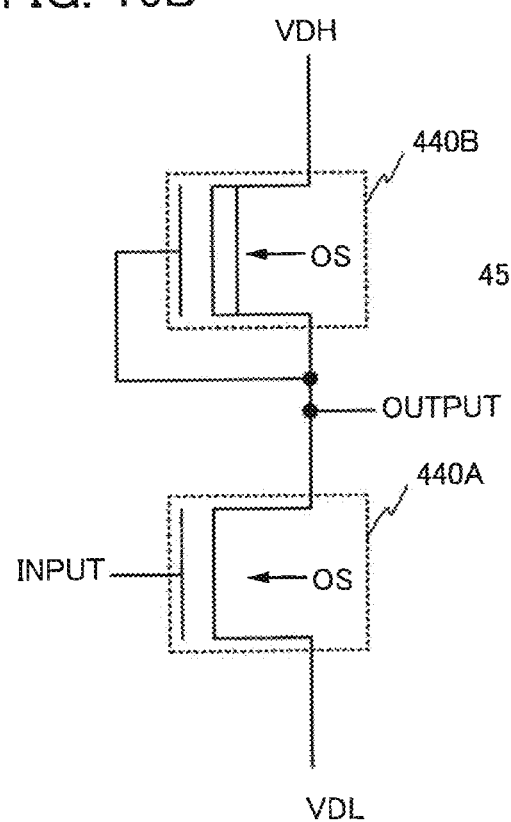
Figure 16C:
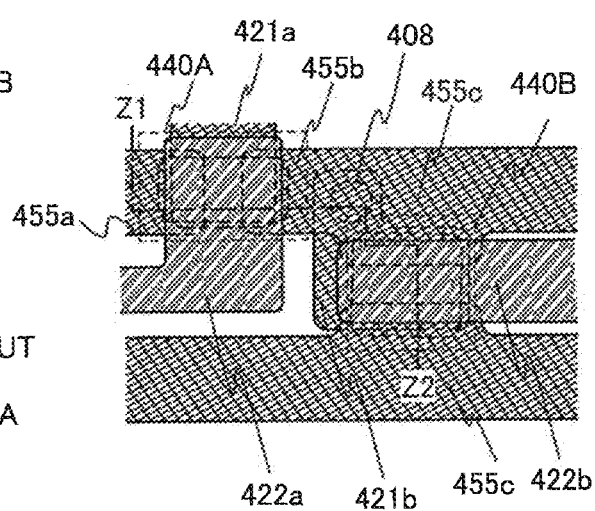

FIG. 16C is a top view of the inverter circuit of the driver circuit. In FIG. 16C, a cross section taken along chain line Z1-Z2 corresponds to FIG. 16A.

An equivalent circuit of the EDMOS circuit is illustrated in FIG. 16B. The circuit connection in FIG. 16A corresponds to FIG. 16B. An example in which the first transistor 440A is an enhancement type n-channel transistor and the second transistor 440B is a depletion type n-channel transistor is illustrated. The term "OS" in FIG. 16B indicates a thin film transistor in which an oxide semiconductor is used In this embodiment, in order to control the threshold voltages of the first transistor 440A and the second transistor 440B, electrodes formed using the third conductive layer are provided over the channel formation regions of the highly purified oxide semiconductor layers with an insulating film interposed therebetween. Specifically, voltages are applied to the electrode 422a and the electrode 422b so that the first transistor 440A can be an enhancement type transistor and the second transistor 440B can be a depletion type transistor.

Note that an example in which the second wiring 410b is directly connected to the gate electrode 421b through the contact hole 408 formed in the first insulating layer 402 is illustrated in FIGS. 16A and 16C; however, a connection electrode may be additionally provided, thereby electrically connecting the second wiring 410b and the gate electrode 421b without being particularly limited to the above example.

As described above, the inverter circuit can be formed to have a structure in which the threshold value of the transistor is controlled by providing an electrode layer over the channel formation region of the oxide semiconductor layer with the insulating film therebetween. The threshold value of the transistor is controlled with a dual gate structure, whereby an enhancement type transistor and the depletion type transistor can be formed over one substrate without forming oxide semiconductor films separately; thus, the manufacturing process is simple.

Further, with use of a transistor with high field effect mobility in which the highly purified oxide semiconductor is included and a copper wiring having high conductivity, an inverted circuit with excellent dynamic characteristics can be provided.

This embodiment can be freely combined with any of the other embodiments.

Embodiment 5

In this embodiment, an example in which a pixel portion, a transistor disposed in the pixel portion, and at least part of a driver circuit for driving the pixel portion are manufactured over one substrate will be described below.

A pixel portion and a transistor disposed in the pixel portion are formed according to any of Embodiments 1 to 3. Further, the transistors described in Embodiments 1 to 3 are each an n-channel transistor, and thus a part of a driver circuit that can be formed of re-channel transistors among driver circuits is formed over the same substrate as the transistor of the pixel portion.

Figure 17A:
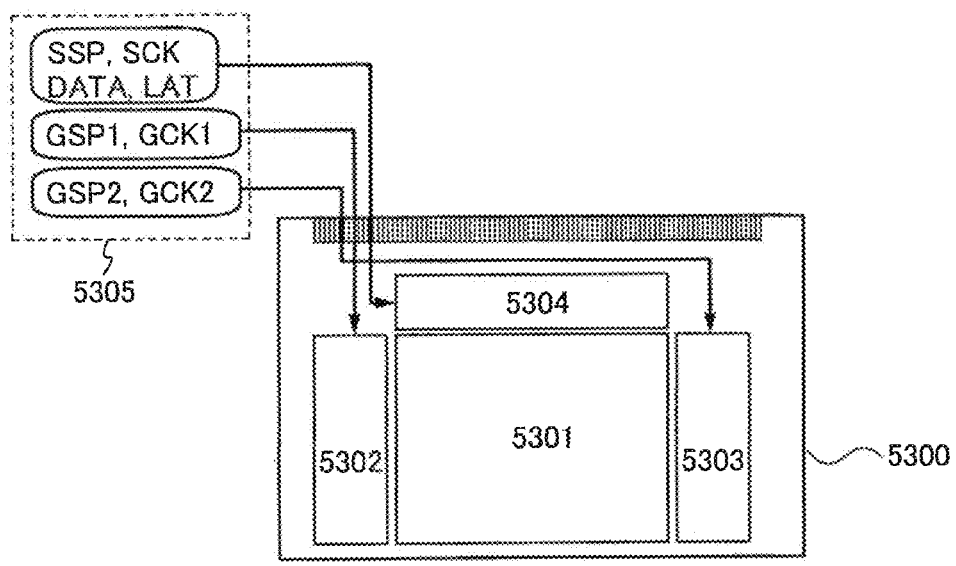
FIGS. 17A and 17B are block diagrams of display devices.

FIG. 17A is an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 are arranged and a plurality of scan lines extended from the first scan line driver circuit 5302 and the second scan line driver circuit 5303 are arranged. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a flexible printed circuit (FPC).

In FIG. 17A, the first scan line driver circuit 5302, the second scan line driver circuit 5303, and the signal line driver circuit 5304 are formed over the same substrate 5300 as the pixel portion 5301. Accordingly, the number of components of a drive circuit which is provided outside and the like are reduced, so that reduction in cost can be achieved. Further, if the driver circuit is provided outside the substrate 5300, wirings would need to be extended and the number of connections of wirings would be increased. However, by providing the driver circuit over the substrate 5300, the number of connections of the wirings can be reduced. Accordingly, the reliability or yield can be improved.

Note that as an example, the timing control circuit 5305 supplies a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Note that each clock signal may be a plurality of clock signals whose periods are different or may be supplied together with an inverted clock signal (CKB). Note that one of the first scan line driver circuit 5302 and the second scan line driver circuit 5303 can be omitted.

Figure 17B:
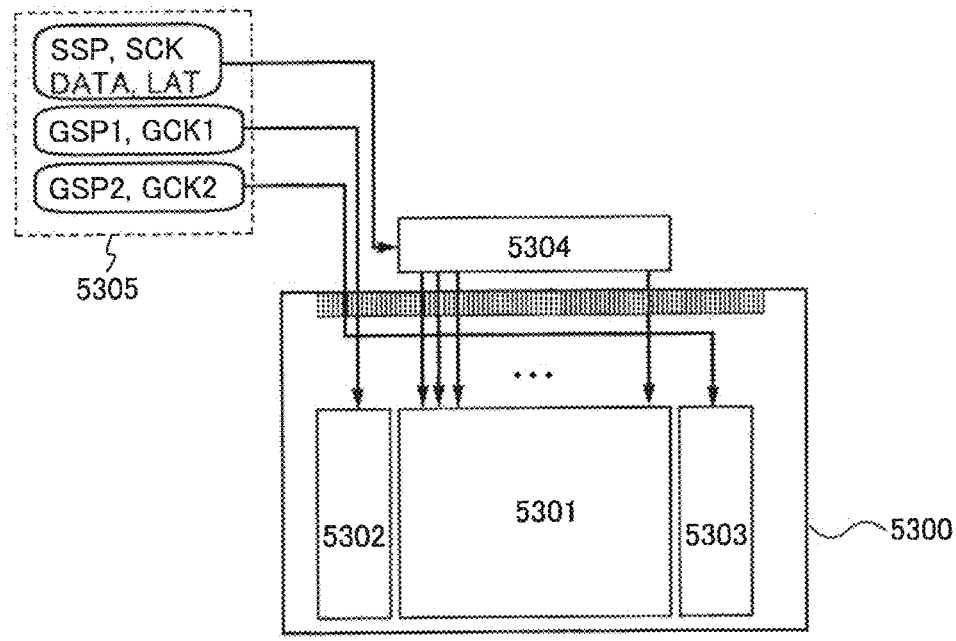

FIG. 17B illustrates a structure in which circuits with low driving frequency (e.g., the first scan line driver circuit 5302 and the second scan line driver circuit 5303) are formed over the same substrate 5300 as the pixel portion 5301 and the signal line driver circuit 5304 is formed over a different substrate from the pixel portion 5301. With this structure, the driver circuits formed over the substrate 5300 can be formed using transistors having lower field-effect mobility than those formed using single crystal semiconductor. Accordingly, increase in the size of the display device, reduction in the number of steps, reduction in cost, improvement in yield, or the like can be achieved.

The transistors described in Embodiments 1 to 3 are n-channel transistors. An example of a structure and operation of a signal line driver circuit including the n-channel TFT will be described with reference to FIGS. 18A and 18B.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of transistors 5603_1 to 5603_k (k is a natural number). An example in which the transistors 5603_1 to 5603_k are n-channel TFTs will be described.

A connection relation of the signal line driver circuit will be described by using the switching circuit 5602_1 as an example. Respective first terminals of the transistors 5603_1 to 5603_k are connected to corresponding wirings 5604_1 to 5604_k. Second terminals of the transistors 5603_1 to 5603_k are connected to signal wirings S1 to Sk, respectively. Gates of the transistors 5603_1 to 5603_k are connected to a wiring 5605_1.

The shift register 5601 has a function of outputting an H level signal (also referred to as a H signal or a high power supply potential level) to the wirings 5605_1 to 5605_N in order and selecting the switching circuits 5602_1 to 5602_N in order.

The switching circuit 5602_1 has a function of controlling conduction states between the wirings 5604_1 to 5604_k and the signal lines S1 to Sk (electrical continuity between the first terminal and the second terminal), that is, a function of controlling whether the potentials of the wirings 5604_1 to 5604_k are supplied or not to the signal lines S1 to Sk. In this manner, the switching circuit 5602_1 functions as a selector. Further, the transistors 5603_1 to 5603_k have a function of controlling conduction between the wirings 5604_1 to 5604_k and the signal lines S1 to Sk, that is, a function of supplying potentials of the wirings 5604_1 to 5604_k to the signal lines Si to Sk. Thus, the transistors 5603_1 to 5603_k each function as a switch.

Note that video signal data (DATA) is inputted to each of the wirings 5604_1 to 5604_k. The video signal data (DATA) is an analog signal corresponding to image data or image signals in many cases.

Figure 18A:
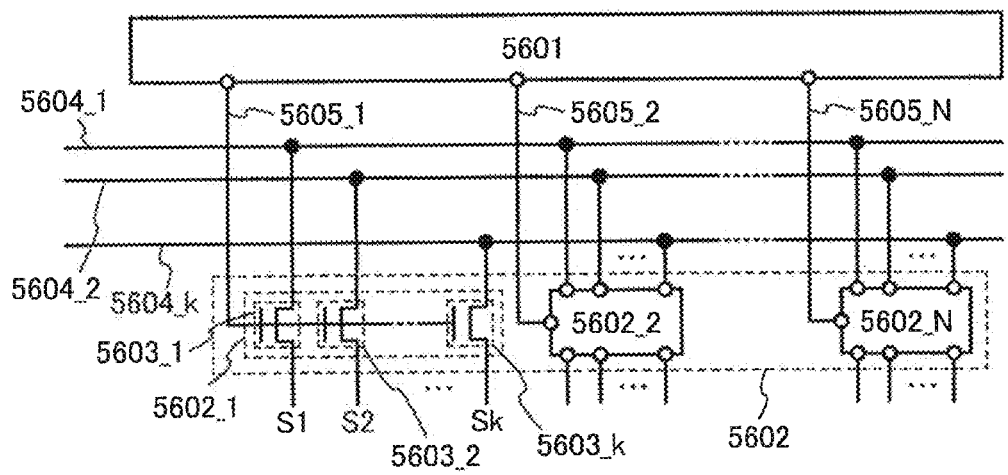
FIG. 18A is a configuration of a signal line driver circuit and FIG. 18B is a timing chart describing operation of the signal line driver circuit.
Figure 18B:
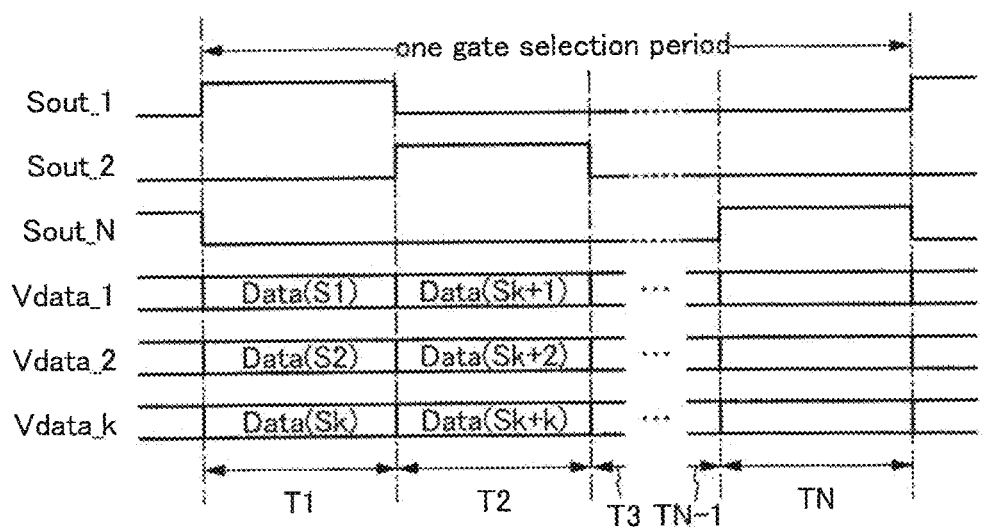

Next, operation of the signal line driver circuit shown in FIG. 18A is described with reference to a timing chart of FIG. 18B. Examples of signals Sout_1 to Sout_N and signals Vdata_1 to Vdata_k are shown in FIG. 18B. The signals Sout_1 to Sout_N are examples of output signals of the shift register 5601, and the signals Vdata_1 to Vdata_k are examples of signals which are input to the wirings 5604_1 to 5604_k. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

In the periods T1 to TN, the shift register 5601 sequentially outputs H level signals to the wirings 5605_1 to 5605_N. For example, in the period Ti, the shift register 5601 outputs an H level signal to the wiring 5605_1. Then, the transistors 5603_1 to 5603_k are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in the first to k-th columns in the selected row through the transistors 5603_1 to 5603_k. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, connections to an external circuit can be reduced. By writing video signals to pixels of every plurality of columns, writing time can be extended and insufficient writing of video signals can be prevented.

Note that a circuit including the transistor described in any of Embodiments 1 to 3 can be used as the shift register 5601 and the switching circuit 5602.

Further, a structure of a scan line driver circuit is described. The scan line driver circuit includes a shift register. Additionally, the scan line driver circuit may include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line must be turned on all at once, a buffer which can supply a large current is used.

One mode of the shift register used for part of the scan line driver circuit and/or the signal line driver circuit is described with reference to FIGS. 19A to 19C and FIGS. 20A and 20B.

A shift register of a scan line driver circuit and/or a signal line driver circuit is described with reference to FIGS. 19A to 19C and FIGS. 20A and 20B. The shift register includes first to N-th pulse output circuits 10_1 to 10_N (N is a natural number which is 3 or more) (see FIG. 19A). A first clock signal CK1, a second clock signal CK2, a third clock signal CK3, and a fourth clock signal CK4 are supplied to the first to N-th pulse output circuits 10_1 to 10_N of the shift register shown in FIG. 19A from a first wiring 11, a second wiring 12, a third wiring 13, and a fourth wiring 14, respectively. A start pulse SP1 (a first start pulse) from a fifth wiring 15 is input to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2) is input. To the first pulse output circuit 10_1, a signal from the third pulse output circuit 10_3 of the stage following the next stage is input. Similarly, to the nth pulse output circuit 10_n of the second or its subsequent stage, a signal from the (n+2)th pulse output circuit 10_(n+2) of the stage following the next stage (such a signal is referred to as a subsequent-stage signal OUT(n+

Figure 19A:
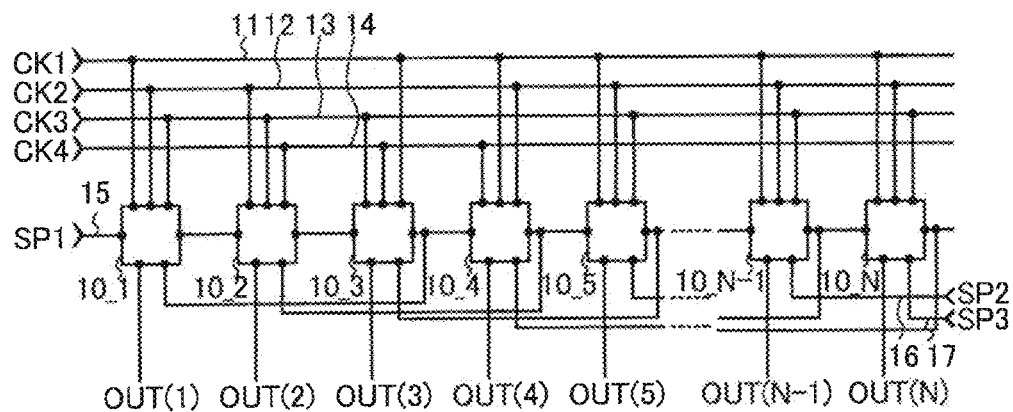
FIGS. 19A to 19C are circuit diagrams showing a structure of a shift register.

2)) is input. Therefore, the pulse output circuits of the respective stages output first output signals OUT(1)(SR) to OUT(N)(SR) to be input to the pulse output circuit of the subsequent stage and/or the pulse output circuit of the stage before the preceding stage and second output signals OUT (1) to OUT(N) to be input to another circuit or the like. Note that since the subsequent-stage signal OUT(n+2) is not input to the last two stages of the shift register as illustrated in FIG. 19A, a second start pulse SP2 and a third start pulse SP3 may be additionally inputted from a sixth wiring 16 and a seventh wiring 17, respectively, to the pulse output circuits of the last two stages, for example. Alternatively, a signal which is additionally generated in the shift register may be used. For example, an (N+1)-th pulse output circuit 10_(N+1) and an (N+2)-th pulse output circuit 10_(N+2) which do not contribute to output of pulses to the pixel portion (such circuits are also referred to as dummy stages) may be provided so that signals corresponding to the second start pulse (SP2) and the third start pulse (SP3) are generated in the dummy stages.

Note that a clock signal (CK) is a signal which oscillates between an H level and an L level (referred to as an L signal or a low power supply potential level) at a constant cycle. The first to the fourth clock signals (CK1) to (CK4) are delayed by ¼ period sequentially. In this embodiment, by using the first to fourth clock signals (CK1) to (CK4), control of driving of a pulse output circuit is performed. Note that the clock signal is also called GCK or SCK in accordance with an driver circuit to which the clock signal is input; however, description is made using CK as the clock signal.

A first input terminal 21, a second input terminal 22, and a third input terminal 23 are electrically connected to any of the first to fourth wirings 11 to 14. For example, in FIG. 19A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 19B:
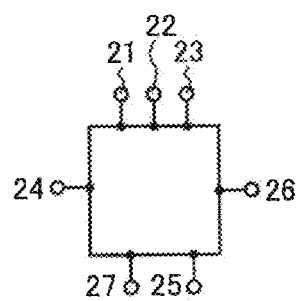

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 19B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Next, an example of a specific circuit structure of the pulse output circuit is described with reference to FIG. 19C.

Figure 19C:
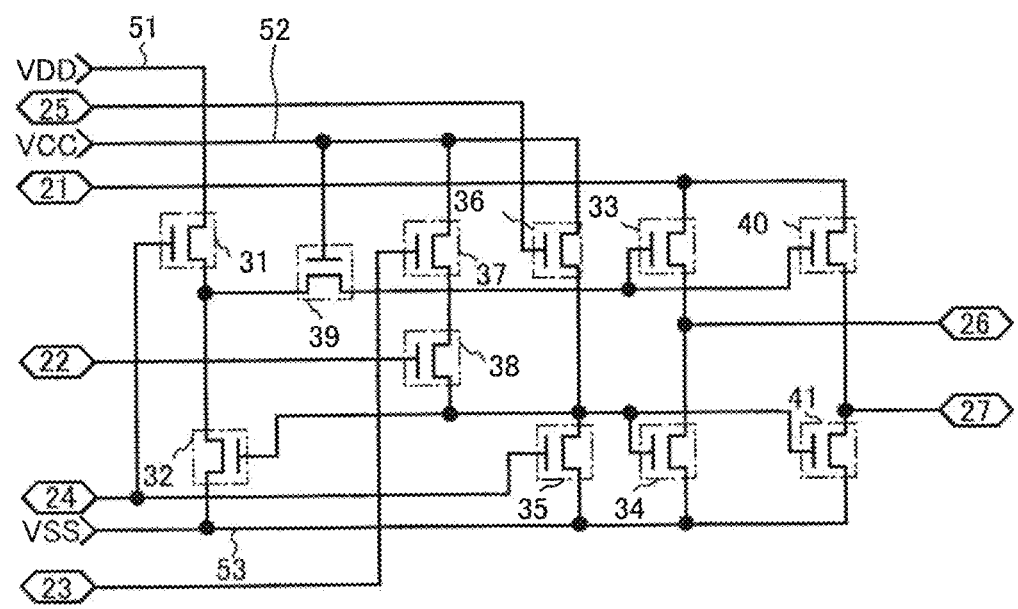

The first pulse output circuit 10_1 includes first to eleventh transistors 31 to 41 (see FIG. 19C). A signal or a power source potential is supplied to the first transistor 31 to the eleventh transistor 41 from a power supply line 51 to which a first high power source potential VDD is supplied, a power supply line 52 to which a second high power source potential VCC is supplied, and a power supply line 53 to which a low power source potential VSS is supplied, in addition to the first input terminal 21 to the fifth input terminal 25, the first output terminal 26, and the second output terminal 27, which are described above. The relation of the power supply potentials of the power supply lines in FIG. 19C is as follows: the first high power supply potential VDD is higher than or equal to the second high power supply potential VCC, and the second high power supply potential VCC is higher than the third low power supply potential VSS. The first to fourth clock signals (CK1) to (CK4) are signals which become H-level signals and L-level signals repeatedly at a regular interval. The potential is VDD when the clock signal is at the H level, and the potential is VSS when the clock signal is at the L level. By making the potential VCC of the power supply line 52 lower than the potential VDD of the power supply line 51, a potential applied to a gate electrode of a transistor can be lowered, shift in threshold voltage of the transistor can be reduced, and deterioration of the transistor can be suppressed without an adverse effect on the operation of the transistor.

In FIG. 19C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and the gate electrode of the eleventh transistor 41 is electrically connected to the gate electrode of the second transistor 32 and the gate electrode of the fourth transistor 34.

In FIG. 19C, the point at which the gate electrode of the third transistor 33, the gate electrode of the tenth transistor 40, and the second terminal of the ninth transistor 39 are connected is referred to as a node A. Further, the point at which the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 20A).

Note that a transistor is an element having at least three terminals of a gate, a drain, and a source. The transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, a region functioning as source and drain is not called the source or the drain in some cases. In such a case, for example, one of the source and the drain may be referred to as a first terminal and the other thereof may be referred to as a second terminal.

Figure 20A:
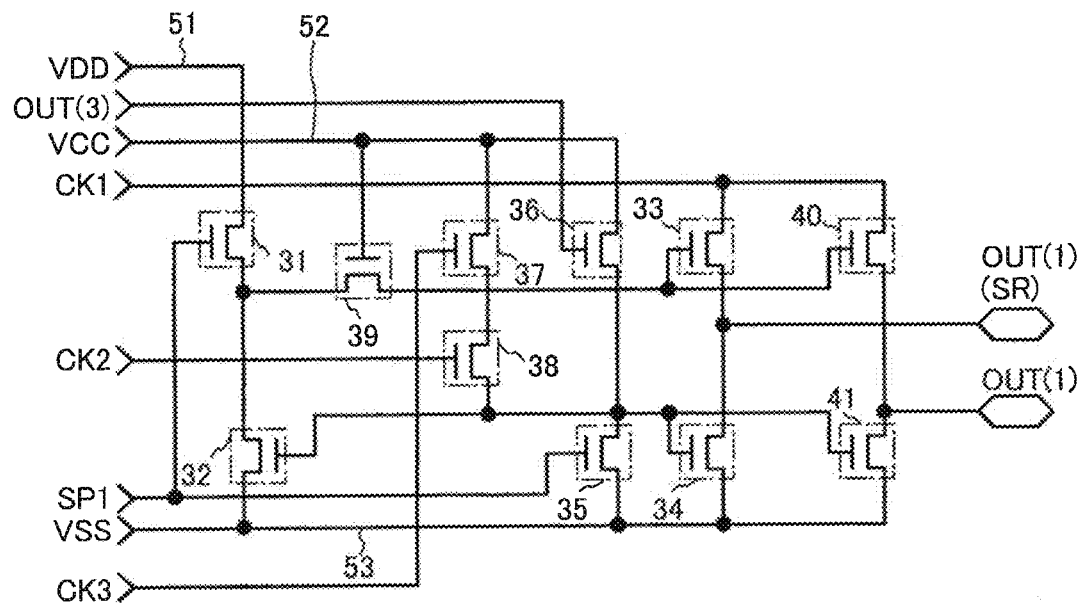
FIG. 20A is a circuit diagram of a shift register and FIG. 20B is a timing chart describing operation of the shift register.
Figure 20B:
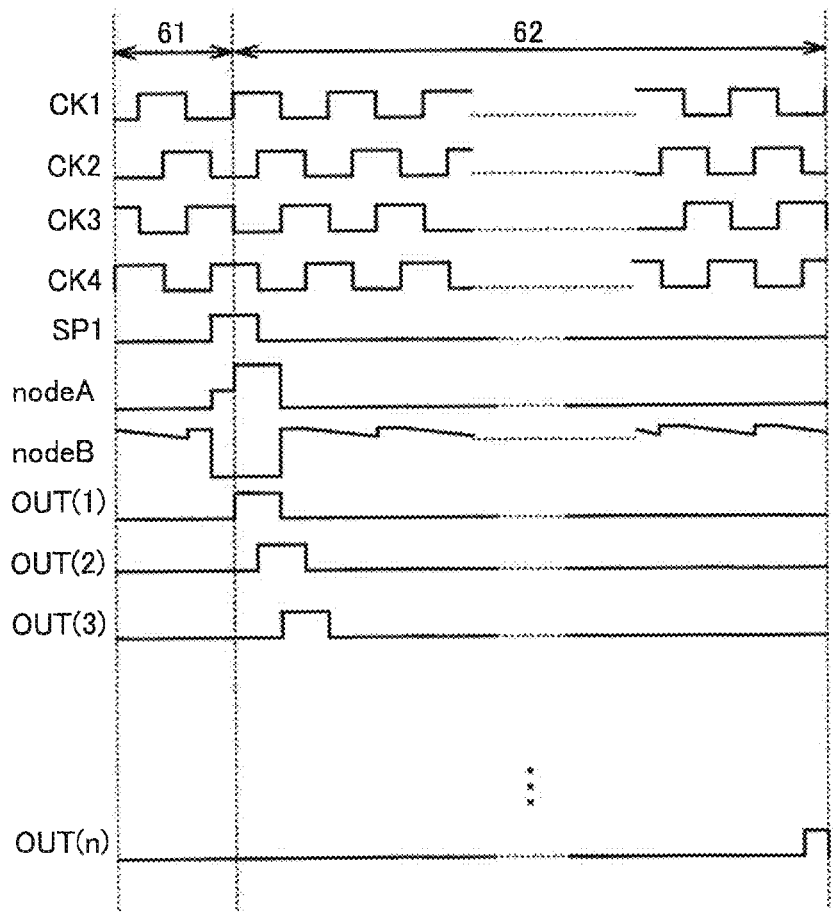

FIG. 20B shows a timing chart of the shift register including a plurality of pulse output circuits shown in FIG. 20A. In the case where the shift register is a scan line driver circuit, a period 61 in FIG. 20B is a vertical retrace period and a period 62 is a gate selection period.

When the ninth transistor 39 having the gate to which the second power supply potential VCC is applied is provided as shown in FIG. 20A, the following advantage can be obtained before and after the bootstrap operation.

In the case where the ninth transistor 39 having the gate electrode to which the second potential VCC is applied is not provided, when the potential at the node A is increased due to the bootstrap operation, the potential of a source which is the second terminal of the first transistor 31 increases to a value higher than the first power supply potential VDD. Then, the first terminal of the first transistor 31, namely the power supply line 51, becomes to serve as the source thereof. Therefore, in the first transistor 31, a large bias voltage is applied and thus significant stress is applied between the gate and the source and between the gate and the drain, which can cause deterioration in the transistor. By providing the ninth transistor 39 whose gate is supplied with the second power supply potential VCC, the potential of the node A is raised by the bootstrap operation, but at the same time, an increase in the potential of the second terminal of the first transistor 31 can be prevented. In other words, by providing the ninth transistor 39, a negative bias voltage applied between the gate and the source of the first transistor 31 can be reduced. Accordingly, with a circuit structure in this embodiment, a negative bias voltage applied between the gate and the source of the first transistor 31 can be reduced, so that deterioration in the first transistor 31, which is due to stress, can further be restrained.

Note that the ninth transistor 39 is provided so as to be connected between the second terminal of the first transistor 31 and the gate of the third transistor 33 through the first terminal and the second terminal thereof. In the case of employing a shift register including a plurality of pulse output circuits of this embodiment, the ninth transistor 39 may be omitted in a signal line driver circuit in which the number of stages is larger than that of a scan line driver circuit, in order to reduce the number of transistors.

Note that when oxide semiconductors are used for semiconductor layers for the first to the eleventh transistors 31 to 41, the off-state current of the transistors can be reduced, the on-state current and the field effect mobility can be increased, and the degree of deterioration can be reduced, whereby malfunction of a circuit can decrease. Compared with a transistor formed using amorphous silicon, the degree of deterioration of the transistor, which is formed using an oxide semiconductor, due to the application of a high potential to the gate electrode is low. Therefore, even when the first power supply potential VDD is supplied to a power supply line to which the second power supply potential VCC is supplied, a similar operation can be performed, and the number of power supply lines which are provided in a circuit can be reduced, so that the circuit can be miniaturized.

Note that a similar effect is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 may be supplied from the second input terminal 22 and the third input terminal 23, respectively. Note that in the shift register shown in FIG. 20A, if the state where the seventh transistor 37 and the eighth transistor 38 are both on is changed through the state where the seventh transistor 37 is off and the eighth transistor 38 is on to the state where the seventh transistor 37 is off and the eighth transistor 38 is off, potential reduction at the node B, which is caused by potential reduction of the second input terminal 22 and the third input terminal 23, is caused twice due to the potential reduction of the gate electrode of the seventh transistor 37 and the potential reduction of the gate electrode of the eighth transistor 38. On the contrary, if the shift register shown in FIG. 20A is driven so that the state where the seventh transistor 37 and the eighth transistor 38 are both on is changed through the state where the seventh transistor 37 is on and the eighth transistor 38 is off to the state where the seventh transistor 37 is off and the eighth transistor 38 is off, potential reduction at the node B, which is caused by potential reduction of the second input terminal 22 and the third input terminal 23, is caused only once due to the potential reduction of the gate electrode of the eighth transistor 38. Consequently, the connection relation, in which the clock signal is supplied from the third input terminal 23 to the gate electrode of the seventh transistor 37 and the clock signal is supplied from the second input terminal 22 to the gate electrode of the eighth transistor 38, is preferable. That is because the number of times of change in the potential of the node B can be reduced, whereby the noise can be decreased.

In this way, in a period during which the potentials of the first output terminal 26 and the second output terminal 27 are held at the L level, the H level signal is regularly supplied to the node B; therefore, malfunction of a pulse output circuit can be suppressed.

Embodiment 6

In this embodiment, as an example of a semiconductor device of the present invention, a semiconductor device having a display function (also referred to as a display device) and comprising, in a pixel portion and further in a driver circuit, a transistor formed in a manner similar to that of Embodiment 1 or 3 is described. Further, part or whole of a driver circuit can be formed over a substrate where a pixel portion is also provided, using a transistor formed in a manner similar to Embodiment 1 or 3, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Note that the display device includes a panel in which the display element is sealed, and a module in which an IC or the like including a controller is mounted on the panel. One embodiment of the present invention relates to one mode of an element substrate before the display element is completed in a process for manufacturing the display device, and the element substrate is provided with a means for supplying current to the display element in each of a plurality of pixels. As for the element substrate, specifically, such a state may be employed that only a pixel electrode layer of the display element is formed, or a conductive film to be a pixel electrode layer has been deposited and the conductive film is not etched yet to form a pixel electrode layer. Alternatively, any other mode may be applied to the element substrate.

Note that a display device in this specification includes an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, the appearance and a cross section of a liquid crystal display panel, which is one embodiment of the semiconductor device of the present invention, will be described with reference to FIGS. 21A1, 21A2, and 21B. FIGS. 21A1 and 21A2 are each a top view of a panel in which a transistor 4010, a transistor 4011, and a liquid crystal element 4013 formed over a first substrate 4001 are sealed between the first substrate 4001 and a second substrate 4006 with a sealant 4005. FIG. 21B is a cross-sectional view taken along line M-N of FIGS. 21A1 and 21A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001 and the second substrate 4006. A signal line driver circuit 4003 which is formed using a single crystal semiconductor film or a polycrystalline semiconductor film over a substrate and which is separately prepared may be mounted in a region that is different from the region surrounded by the sealant 4005 over the first substrate 4001.

Note that there is no particular limitation on the connection method of a driver circuit which is separately formed, and COG, wire bonding, TAB, or the like can be used. FIG. 21A1 illustrates an example of mounting the signal line driver circuit 4003 by COG, and FIG. 21A2 illustrates an example of mounting the signal line driver circuit 4003 by TAB.

The pixel portion 4002 and the scan line driver circuit 4004 provided over the first substrate 4001 include a plurality of transistors. FIG. 21B illustrates the transistor 4010 included in the pixel portion 4002 and the transistor 4011 included in the scan line driver circuit 4004, as an example. An insulating layer 4020 and an insulating layer 4021 are provided over the transistor 4010 and the transistor 4011.

As each of the transistors 4010 and 4011, the transistor described in Embodiment 1 or 3 can be used, for example. In this embodiment, the transistors 4010 and 4011 are re-channel transistors.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a poly(vinyl fluoride) (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. The counter electrode layer 4031 is electrically connected to a common potential line provided over the substrate where the 4010 is also provided, through conductive particles. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. A blue phase appears only within narrow temperature range; therefore, the liquid crystal layer 4008 is formed using a liquid crystal composition in which a chiral agent of 5 wt. % or more is mixed in order to expand the temperature range.

The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

Note that this embodiment shows an example of a transmissive liquid crystal display device; however, one embodiment of the present invention can be applied to a reflective liquid crystal display device or a semi-transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce the influence caused by the surface roughness of the transistor and to improve the reliability of the transistor, the transistor obtained in Embodiment 1 or 3 is covered with insulating layers (the insulating layers 4020 and 4021) serving as a protective film and a planarization insulating film. Note that the protective film is provided to prevent entry of contaminant impurities such as organic substance, metal, or moisture existing in air and is preferably a dense film. The protective film may be formed by a sputtering method as a single layer of a silicon nitride film or as a stacked layer of a silicon oxide film with a silicon oxynitride film, a silicon nitride oxide film, an aluminum oxide film, an aluminum nitride film, an aluminum oxynitride film, and/or an aluminum nitride oxide film by a sputtering method. Although an example in which the protective film is formed by a sputtering method is described in this embodiment, the present invention is not limited to this method and a variety of methods may be employed.

Further, after the protective film is formed, the oxide semiconductor layer containing indium, gallium, and zinc may be subjected to annealing (300° C. to 400° C.).

The insulating layer 4021 is formed as the planarization insulating film. As the insulating layer 4021, an organic material having heat resistance such as a polyimide, an acrylic resin, a benzocyclobutene-based resin, a polyamide, or an epoxy resin can be used. Other than such organic materials, it is also possible to use a low-dielectric constant material (a low-k material), a siloxane-based resin, PSG (phosphosilicate glass), BPSG (borophosphosilicate glass), or the like. A siloxane-based resin may include, as a substituent, an organic group (e.g., an alkyl group, and an aryl group) or a fluoro group. In addition, the organic group may include a fluoro group. Note that the insulating layer 4021 may be formed by stacking a plurality of insulating films formed of these materials.

Note that the siloxane-based resin corresponds to a resin including a Si—O—Si bond formed using a siloxane-based material as a starting material.

The method for the formation of the insulating layer 4021 is not limited to a particular method, and the following method can be used depending on the material: a sputtering method, an SOG method, spin coating, dip coating, spray coating, a droplet discharge method (e.g., an inkjet method, screen printing, or offset printing), or the like. In the case of forming the insulating layer 4021 using a material solution, annealing (300° C. to 400° C.) of the oxide semiconductor layer containing indium, gallium, and zinc may be performed at the same time as a baking step. The baking step of the insulating layer 4021 also serves as annealing of the oxide semiconductor layer containing indium, gallium, and zinc, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode layer formed using the conductive composition has preferably a sheet resistance of less than or equal to 10000 Ω/square and a transmittance of greater than or equal to 70% at a wavelength of 550 nm. Further, the resistivity of the conductive high molecule included in the conductive composition is preferably less than or equal to 0.1 Ω·cm.

As the conductive macromolecule, a so-called π-electron conjugated conductive macromolecule can be used. For example, polyaniline or a derivative thereof, polypyrrole or a derivative thereof, polythiophene or a derivative thereof, a copolymer of two or more kinds of them, and the like can be given.

A variety of signals and potentials are supplied from an FPC 4018 to the signal line driver circuit 4003 which is formed separately, the scan line driver circuit 4004, and the pixel portion 4002.

In this embodiment, a connection terminal electrode 4015 is formed using the same conductive film that is used for the pixel electrode layer 4030 included in the liquid crystal element 4013, and a terminal electrode 4016 is formed using the same conductive film that is used for the source and drain electrode layers of the transistors 4010 and 4011.

The connection terminal electrode 4015 is electrically connected to a terminal included in the FPC 4018 via an anisotropic conductive film 4019.

Note that FIGS. 21A1 and 21A2 each illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 22:
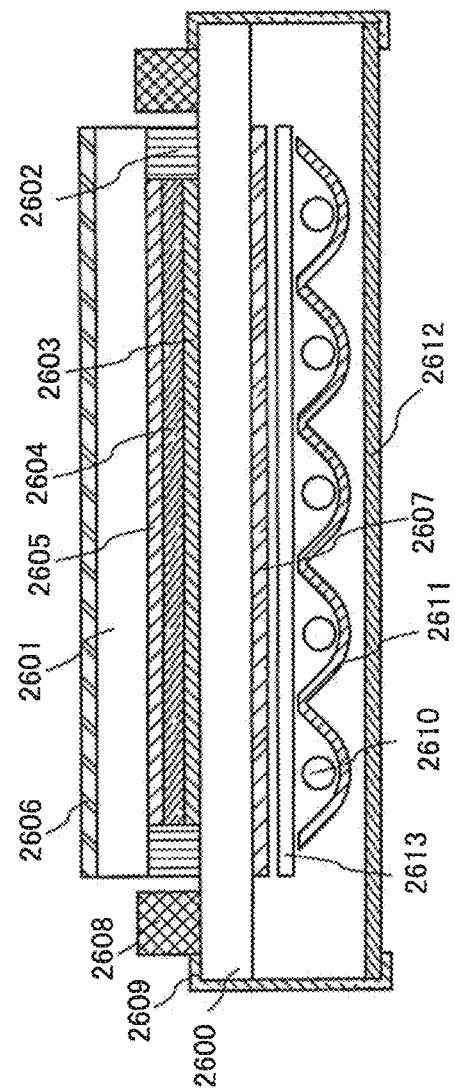
FIG. 22 illustrates a semiconductor device according to one embodiment.

FIG. 22 illustrates an example of a liquid crystal display module which is formed as a semiconductor device by using a TFT substrate 2600 manufactured using an embodiment of the present invention.

FIG. 22 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates 2600 and 2601 to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a display device mounted with a transistor which is excellent in operation stability can be manufactured. A liquid crystal display device of this embodiment is mounted with a transistor which is excellent in operation stability, and thus has high reliability.

According to this embodiment, by using a conductive layer including copper as a main component, a display device in which the wiring resistance is reduced can be provided. In a display device with a large screen or a display device with high definition to which this embodiment is applied, delay of signal transmission to an end portion of a signal line, drop in voltage of a power supply line, or the like is hardly caused. As a result, a display device in which deterioration of display quality such as display unevenness or a defect in grayscale is suppressed to improve display quality can be provided.

In addition, by using an oxide semiconductor layer which is highly purified to have a carrier concentration lower than $1\times10^{12}$ cm$^{-3}$, off current of $1\times10^{-13}$ A or lower, which is extremely small, can be achieved. As a result, a power-saving display device in which leakage current is suppressed can be provided. Further, a display device with a high ratio between the on current and the off current can be provided. Further, a display device with high contrast and high display quality can be provided.

The display device of this embodiment is provided with a transistor with high electron field-effect mobility in which a highly purified oxide semiconductor is used; thus, the transistor can operate at high speed and achieve display characteristics of moving images and high definition.

Further, since a wiring including copper as a main component is sealed with nitride films, diffusion of copper is suppressed, so that a semiconductor device with higher reliability can be provided.

This embodiment can be implemented in appropriate combination with the structures described in the other embodiments.

Embodiment 7

In this embodiment, a light-emitting display device will be described as an example of a semiconductor device of the present invention. As a display element included in a display device, a light-emitting element utilizing electroluminescence will be described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, so that current flows. Then, recombination of these carriers (the electrons and holes) makes the light-emitting organic compound to form an excited state and to emit light when it returns from the excited state to a ground state. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 23:
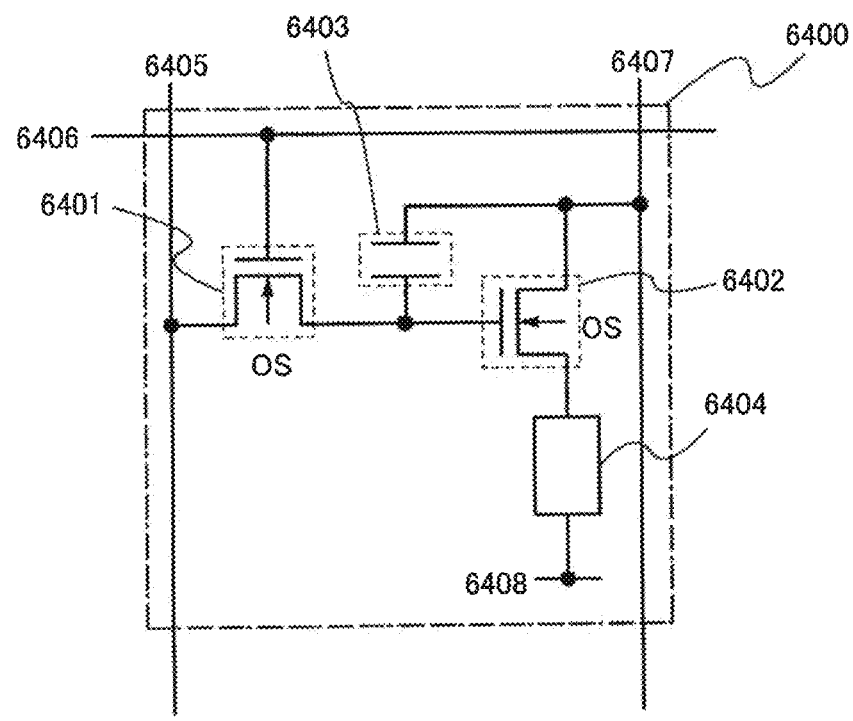
FIG. 23 illustrates a pixel equivalent circuit of a semiconductor device according to one embodiment.

FIG. 23 shows an example of a pixel structure to which digital time grayscale driving can be applied, as an example of a semiconductor device according to one embodiment of the present invention. The term "OS" in the drawing indicates a thin film transistor in which an oxide semiconductor is used.

A structure and operation of a pixel to which digital time grayscale driving can be applied are described. In this embodiment, an example is described in which one pixel includes two n-channel transistors including an oxide semiconductor layer (an In—Ga—Zn—O-based semiconductor layer) for a channel formation region which are described in Embodiment 1 or 2.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode layer) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying the relation that low power supply potential is lower than the high power supply potential (low power supply potential <high power supply potential) with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404. Note that the common electrode 6408 may be set to a high power supply potential, and the power supply line 6407 may be set to a low power supply potential. In that case, the structure of the light-emitting element 6404 may be modified as appropriate because the current in the light-emitting element 6404 flows reversely.

Note that gate capacitor of the driver transistor 6402 may be used as a substitute for the capacitor 6403, so that the capacitor 6403 can be omitted. The gate capacitor of the driving transistor 6402 may be formed between a channel formation region and the gate electrode layer.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line+$V_{th}$ of the driver transistor 6402) is applied to the signal line 6405.

In the case of using analog grayscale driving instead of the digital time ratio grayscale driving, the pixel structure the same as that of FIG. 23 can be employed by inputting signals in a different way.

In the case of performing analog grayscale driving, a voltage higher than or equal to (forward voltage of the light-emitting element 6404+$V_{th}$ of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that a pixel structure of the present invention is not limited to that shown in FIG. 23. For example, a switch, a resistor, a capacitor, a transistor, a logic circuit, or the like may be added to the pixel shown in FIG. 23.

Next, structures of the light-emitting element will be described with reference to FIGS. 24A to 24C. In this embodiment, a cross-sectional structure of a pixel will be described by taking an n-channel driving TFT as an example. Each of TFTs 7011, 7021, and 7001, which are driver TFTs used for semiconductor devices in FIGS. 24A to 24C can be manufactured in a manner similar to the transistor described in Embodiment 1 or 3.

In order to extract light emitted from the light-emitting element, at least one of an anode and a cathode is required to transmit light. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure of an embodiment of the present invention can be applied to a light-emitting element having any of these emission structures.

A light-emitting element having a bottom emission structure will be described with reference to FIG. 24A.

Figure 24A:
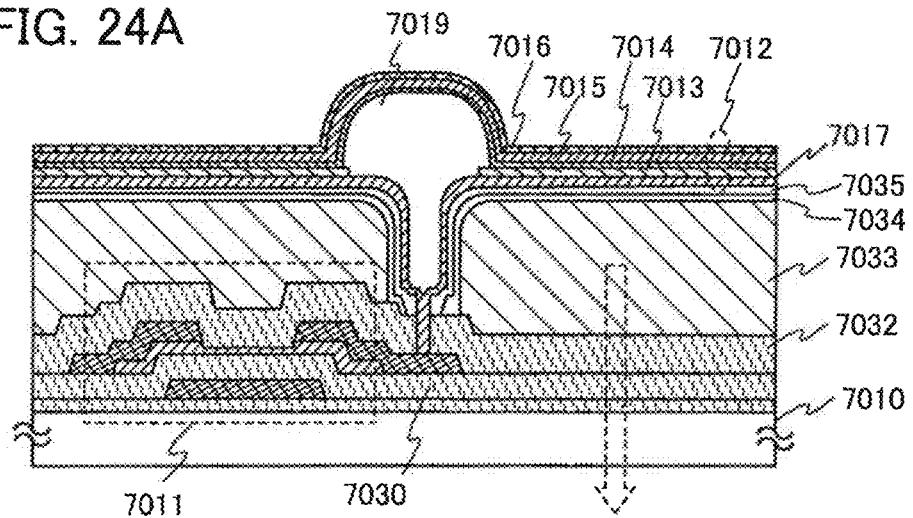
FIGS. 24A to 24C each illustrate a semiconductor device according to an embodiment.

FIG. 24A is a cross-sectional view of a pixel in the case where the driving TFT 7011 is an n-channel TFT and light is emitted from a light-emitting element 7012 to a first electrode 7013 side. In FIG. 24A, the first electrode 7013 of the light-emitting element 7012 is formed over a conductive film 7017 transmitting visible light which is electrically connected to a source or drain electrode layer of the driving TFT 7011, and an EL layer 7014 and a second electrode 7015 are stacked in this order over the first electrode 7013.

As the conductive film 7017 transmitting visible light, a conductive film transmitting visible light such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Any of a variety of materials can be used for the first electrode 7013 of the light-emitting element. For example, in the case where the first electrode 7013 is used as a cathode, it is preferable to use a material having a low work function, such as an alkali metal such as Li or Cs, an alkaline-earth metal such as Mg, Ca, or Sr, an alloy containing any of these metals (Mg:Ag, Al:Li, or the like), or a rare-earth metal such as Yb or Er. In FIG. 24A, the first electrode 7013 is formed to have a thickness enough to transmit visible light (preferably, approximately 5 nm to 30 nm). For example, an aluminum film having a thickness of 20 nm is used for the first electrode 7013.

Note that the conductive film transmitting visible light and the aluminum film may be stacked and then selectively etched to form the conductive film 7017 transmitting visible light and the first electrode 7013; in this case, etching can be performed using the same mask, which is preferable.

Further, the periphery of the first electrode 7013 is covered with a partition 7019. The partition 7019 is formed using an organic resin film of a polyimide, an acrylic resin, a polyamide, an epoxy resin, or the like, an inorganic insulating film, or an organic polysiloxane. It is particularly preferable that the partition 7019 be formed using a photosensitive resin material to have an opening over the first electrode 7013 so that a sidewall of the opening is formed to have an inclined surface with continuous curvature. In the case where a photosensitive resin material is used for the partition 7019, a step of forming a resist mask can be omitted.

As the EL layer 7014 formed over the first electrode 7013 and the partition 7019, an EL layer including at least a light-emitting layer is acceptable. The EL layer 7014 may be formed to have either a single-layer structure or a stacked-layer structure. When the EL layer 7014 is formed using a plurality of layers and the first electrode 7013 functions as a cathode, an electron-injection layer, an electron-transport layer, a light-emitting layer, a hole-transport layer, and a hole-injection layer are stacked in the order presented over the first electrode 7013. It is not necessary to form all of these layers.

The stacking order is not limited to the above stacking order. The first electrode 7013 may function as an anode, and a hole-injection layer, a hole-transport layer, a light-emitting layer, an electron-transport layer, and an electron-injection layer may be stacked in that order over the anode. However, considering power consumption, it is preferable that the first electrode 7013 serve as a cathode and an electron-injection layer, an electron-transport layer, a light-emitting layer, a hole-transport layer, and a hole-injection layer be stacked in the order presented over the first electrode 7013 because an increase in voltage of a driver circuit portion can be prevented and power consumption can be reduced more effectively.

Any of a variety of materials can be used for the second electrode 7015 formed over the EL layer 7014. For example, in the case where the second electrode 7015 is used as an anode, a material having a high work function (specifically, 4.0 eV or more), for example, ZrN, Ti, W, Ni, Pt, Cr, or the like; or a transparent conductive material such as ITO, IZO, or ZnO is preferable. Further, a blocking film 7016, for example, a metal which blocks light, a metal which reflects light, or the like is provided over the second electrode 7015. In this embodiment, an ITO film is used as the second electrode 7015, and a Ti film is used as the blocking film 7016.

The light-emitting element 7012 corresponds to a region where the EL layer 7014 including the light-emitting layer is sandwiched between the first electrode 7013 and the second electrode 7015. In the case of the element structure illustrated in FIG. 24A, light is emitted from the light-emitting element 7012 to the first electrode 7013 side as indicated by an arrow.

Note that in FIG. 24A, light emitted from the light-emitting element 7012 passes through a color filter layer 7033, an insulating layer 7032, a gate insulating layer 7030, and a substrate 7010 to be emitted.

The color filter layer 7033 is formed by a droplet discharge method such as an inkjet method, a printing method, an etching method with the use of a photolithography technique, or the like.

The color filter layer 7033 is covered with an overcoat layer 7034, and also covered with a protective insulating layer 7035. Although the overcoat layer 7034 is illustrated to have a small thickness in FIG. 24A, the overcoat layer 7034 has a function of reducing unevenness caused by the color filter layer 7033 with use of a resin material such as an acrylic resin.

A contact hole reaching the source or drain electrode is formed in the protective insulating layer 7035 and the insulating layer 7032 to overlap with the partition 7019.

Next, a light-emitting element having a dual emission structure is described with reference to FIG. 24B.

Figure 24B:
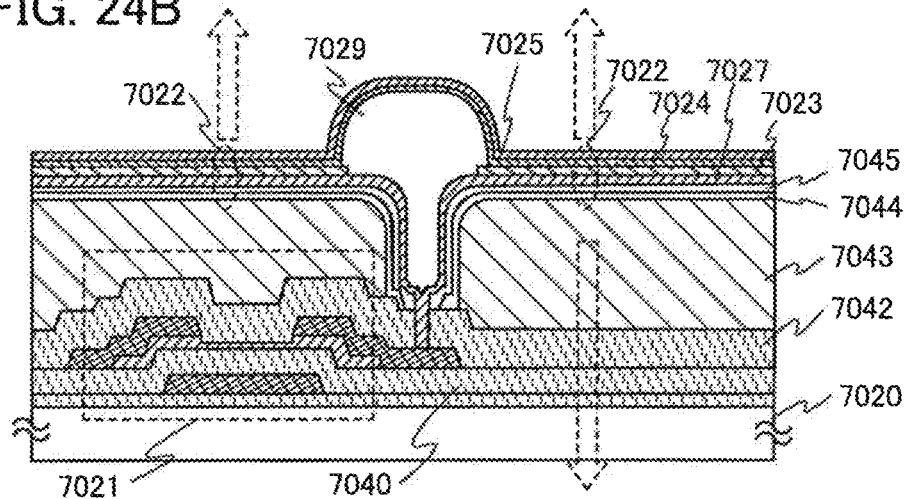

In FIG. 24B, a first electrode 7023 of a light-emitting element 7022 is formed over a conductive film 7027 transmitting visible light which is electrically connected to a source or drain electrode layer of the driver TFT 7021, and an EL layer 7024 and a second electrode 7025 are stacked in the order presented over the first electrode 7023.

For the conductive film 7027 transmitting visible light, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

Any of a variety of materials can be used for the first electrode 7023. For example, in the case where the first electrode 7023 is used as a cathode, the first electrode 7023 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. If the first electrode 7023 is formed using a metal film, the metal film has a thickness enough to transmit visible light (preferably, approximately 5 nm to 30 nm). For example, an aluminum film having a thickness of 20 nm is used for the first electrode 7023.

Note that the conductive film transmitting visible light and the light-transmitting metal film may be stacked and then selectively etched, whereby the conductive film 7027 transmitting visible light and the first electrode 7023 may be formed. In this case, etching can be performed with the use of the same mask, which is preferable.

Further, the periphery of the first electrode 7023 is covered with a partition 7029. The partition 7029 is formed using: an organic resin film of a polyimide, an acrylic resin, a polyamide, an epoxy resin, or the like; an inorganic insulating film, or an organic polysiloxane. It is particularly preferable that the partition 7029 be formed using a photosensitive resin material to have an opening portion over the first electrode 7023 so that a sidewall of the opening portion is formed as a tilted surface with continuous curvature. In the case where a photosensitive resin material is used for the partition 7029, a step of forming a resist mask can be omitted.

As the EL layer 7024 formed over the first electrode 7023 and the partition 7029, an EL layer including a light-emitting layer is acceptable. Further, the EL layer 7024 may be formed to have either a single-layer structure or a stacked-layer structure. When the EL layer 7024 is formed using a plurality of layers and the first electrode 7023 functions as a cathode, an electron-injection layer, an electron-transport layer, a light-emitting layer, a hole-transport layer, and a hole-injection layer are stacked in the order presented over the first electrode 7023. It is not necessary to form all of these layers.

The stacking order is not limited to the above. When the first electrode 7023 functions as an anode, a hole-injection layer, a hole-transport layer, a light-emitting layer, an electron-transport layer, and an electron-injection layer may be stacked in this order over the first electrode 7023. However, when power consumption is compared, it is preferable that the first electrode 7023 serve as a cathode and an electron-injection layer, an electron-transport layer, a light-emitting layer, a hole-transport layer, and a hole-injection layer be stacked in that order over the first electrode 7023 because voltage rise in the driver circuit portion can be suppressed and power consumption can be decreased.

Further, any of a variety of materials can be used for the second electrode 7025 formed over the EL layer 7024. For example, in the case where the second electrode 7025 is used as an anode, a material having a high work function, for example, a transparent conductive material such as ITO, IZO, or ZnO is preferable. In this embodiment, an ITO film including silicon oxide is used as the second electrode 7025 which serves as an anode.

The light-emitting element 7022 corresponds to a region where the EL layer 7024 including the light-emitting layer is sandwiched between the first electrode 7023 and the second electrode 7025. In the case of the element structure illustrated in FIG. 24B, light is emitted from the light-emitting element 7022 to both the second electrode 7025 side and the first electrode 7023 side as indicated by arrows.

Note that in FIG. 24B, light emitted from the light-emitting element 7022 to the first electrode 7023 side passes through a color filter layer 7043, an insulating layer 7042, a gate insulating layer 7040, and a substrate 7020 to be emitted.

The color filter layer 7043 is formed by a droplet discharge method such as an inkjet method, a printing method, an etching method with the use of a photolithography technique, or the like.

The color filter layer 7043 is covered with the overcoat layer 7044, and also covered with a protective insulating layer 7045.

A contact hole which is formed in the protective insulating layer 7045 and the insulating layer 7042 and reaches the drain electrode layer is provided in a portion which overlaps with the partition 7029.

Note that in the case where the light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure is described with reference to FIG. 24C.

Figure 24C:
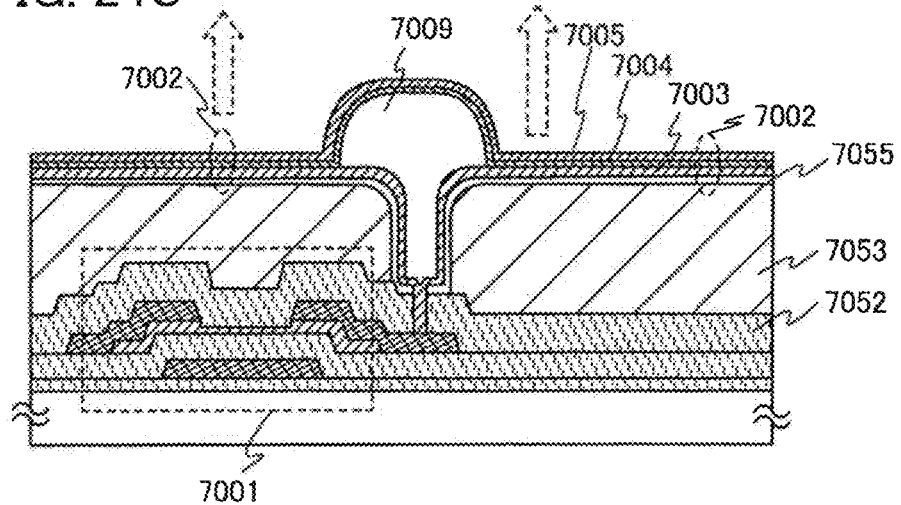

FIG. 24C is a cross-sectional view of a pixel in the case where the driving TFT 7001 is an n-channel transistor and light is emitted from a light-emitting element 7002 to a second electrode 7005 side. In FIG. 24C, a first electrode 7003 of the light-emitting element 7002 which is electrically connected to a source or drain electrode layer of the driving TFT 7001 is formed, and an EL layer 7004 and the second electrode 7005 are stacked in this order over the first electrode 7003.

Any of a variety of materials can be used for the first electrode 7003. The first electrode 7003 can be formed using any of a variety of materials; for example, when the first electrode 7003 is used as a cathode, it is preferable to use a material having a low work function, such as an alkali metal such as Li or Cs, an alkaline earth metal such as Mg, Ca, or Sr, an alloy containing any of these metals (e.g., Mg:Ag, Al:Li), or a rare earth metal such as Yb or Er.

Further, the periphery of the first electrode 7003 is covered with a partition 7009. The partition 7009 is formed using an organic resin film of a polyimide, an acrylic resin, a polyamide, an epoxy resin, or the like, an inorganic insulating film, or an organic polysiloxane. It is particularly preferable that the partition 7009 be formed using a photosensitive resin material to have an opening over the first electrode 7003 so that a sidewall of the opening is formed to have an inclined surface with continuous curvature. In the case where a photosensitive resin material is used for the partition 7009, a step of forming a resist mask can be omitted.

As the EL layer 7004 formed over the first electrode 7003 and the partition 7009, an EL layer including at least a light-emitting element is acceptable. Further, the EL layer 7004 may be formed to have either a single-layer structure or a stacked-layer structure. When the EL layer 7004 is formed using a plurality of layers and the first electrode 7003 functions as a cathode, an electron-injection layer, an electron-transport layer, a light-emitting layer, a hole-transport layer, and a hole-injection layer are stacked in the order presented over the first electrode 7003. Note that all these layers are not necessarily provided.

The stacking order is not limited to the above; a hole-injection layer, a hole-transport layer, a light-emitting layer, an electron-transport layer, and an electron-injection layer may be stacked in this order over the first electrode 7003 which serves an anode.

For example, the first electrode 7003 having a stacked film in which a Ti film, an aluminum film, and a Ti film are formed in this order functions as an anode, and a hole-injection layer, a hole-transport layer, a light-emitting layer, an electron-transport layer, and an electron-injection layer are stacked in this order over the anode. Then thereover, a stacked layer of a Mg:Ag alloy thin film and an ITO film is formed.

Note that when the driver TFT 7001 is an n-channel transistor, it is preferable to stack an electron-injection layer, an electron-transport layer, a light-emitting layer, a hole-transport layer, and a hole-injection layer in this order over the first electrode 7003 because an increase in voltage of the driver circuit can be suppressed and thus power consumption can be reduced.

The second electrode 7005 is formed using a conductive film transmitting visible light, such as a film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

The light-emitting element 7002 corresponds to a region where the EL layer 7004 including the light-emitting layer is sandwiched between the first electrode 7003 and the second electrode 7005. In the case of the pixel illustrated in FIG. 24C, light is emitted from the light-emitting element 7002 to the second electrode 7005 side as indicated by arrows.

In FIG. 24C, the drain electrode layer of the driver TFT 7001 is electrically connected to the first electrode 7003 through a contact hole provided in a protective insulating layer 7052 and an insulating layer 7055. A planarization insulating layer 7053 can be formed using a resin material such as a polyimide, an acrylic, a benzocyclobutene-based resin, a polyamide, or an epoxy resin. In addition to such resin materials, it is also possible to use a low-dielectric constant material (low-k material), a siloxane-based resin, phosphosilicate glass (PSG), borophosphosilicate glass (BPSG), or the like. Note that the planarization insulating layer 7053 may be formed by stacking a plurality of insulating films formed of these materials. There is no particular limitation on the method for forming the planarization insulating layer 7053, and the planarization insulating layer 7053 can be formed, depending on the material, by a method such as a sputtering method, an SOG method, spin coating, dip coating, spray coating, a droplet discharge method (such as an inkjet method, screen printing, offset printing, or the like), or the like.

The partition 7009 is provided so as to insulate the first electrode 7003 and a first electrode 7008 (not shown) of an adjacent pixel. The partition 7009 is formed using an organic resin film of a polyimide, an acrylic resin, a polyamide, an epoxy resin, or the like, an inorganic insulating film, or an organic polysiloxane. It is particularly preferable that the partition 7009 be formed using a photosensitive resin material to have an opening over the first electrode 7003 so that a sidewall of the opening is formed to have an inclined surface with continuous curvature. In the case where a photosensitive resin material is used for the partition 7009, a step of forming a resist mask can be omitted.

In the structure in FIG. 24C, when full color display is performed, for example, the light-emitting element 7002 is used as a green light-emitting element, one of the adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

In the structure of FIG. 24C, a light-emitting display device capable of full color display may be manufactured in such a way that all of a plurality of light-emitting elements to be provided are white light-emitting elements and a sealing substrate having a color filter or the like is arranged on the light-emitting element 7002. A material which exhibits a single color such as white or blue is formed and combined with a color filter or a color conversion layer, whereby full color display can be performed.

Needless to say, display of monochromatic light can also be performed. For example, a lighting system may be formed with use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

A semiconductor device described in this embodiment is not limited to the structures illustrated in FIGS. 24A to 24C and can be modified in various ways based on the spirit of techniques according to the present invention.

Next, the appearance and the cross section of a light-emitting display panel (also referred to as a light-emitting panel) which corresponds to one embodiment of a semiconductor device to which the transistor described in Embodiment 1 or 3 is applied are described with reference to FIGS. 25A and 25B. FIG. 25A is a top view of a panel in which transistors and a light-emitting element, which are formed over a first substrate, are sealed between the first substrate and a second substrate with a sealant. FIG. 25B corresponds to a cross-sectional view taken along line H-I of FIG. 25A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b formed over the first substrate 4501 each include a plurality of transistors, and the transistor 4510 included in the pixel portion 4502 and the transistor 4509 included in the signal line driver circuit 4503a are illustrated as an example in FIG. 25B.

For each of the transistors 4509 and 4510, a highly reliable transistor including an oxide semiconductor layer (an In—Ga—Zn—O-based semiconductor layer) as described in Embodiment 1 or 3 can be applied. In this embodiment, the transistors 4509 and 4510 are n-channel transistors.

Over an insulating layer 4544, a conductive layer 4540 is provided in a position overlapping with a channel formation region of an oxide semiconductor layer of the transistor 4509 used for a driver circuit. By providing the conductive layer 4540 so as to overlap with the channel formation region of the oxide semiconductor layer, the shift in the threshold voltage of the transistor 4509 can be suppressed. Further, potential of the conductive layer 4540 may be the same as or different from that of a gate electrode layer of the transistor 4509. The conductive layer 4540 can function also as a second gate electrode layer. Alternatively, the potential of the conductive layer 4040 may be GND or 0 V, or the conductive layer 4040 may be in a floating state.

Reference numeral 4511 denotes a light-emitting element. A first electrode layer 4517 which is a pixel electrode included in the light-emitting element 4511 is electrically connected to a source or drain electrode layer of the transistor 4510. Note that a structure of the light-emitting element 4511 is a stacked-layer structure of the first electrode layer 4517, the electroluminescent layer 4512, and the second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or an organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive film that is used for the first electrode layer 4517 included in the light-emitting element 4511. A terminal electrode 4516 is formed using the same conductive film that is used for the source and drain electrode layers included in the transistors 4509 and 4510.

The connection terminal electrode 4515 is electrically connected to a terminal included in the FPC 4518a via an anisotropic conductive film 4519.

The second substrate located in the direction in which light is extracted from the light-emitting element 4511 needs to have a light-transmitting property with respect to visible light. In that case, a material having a light-transmitting property with respect to visible light, such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (poly(vinyl chloride)), an acrylic resin, a polyimide, an epoxy resin, a silicone resin, PVB (poly(vinyl butyral)), or EVA (ethylene vinyl acetate copolymer) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. In addition, only the signal line driver circuits or part thereof, or the scan line driver circuits or part thereof may be separately formed and mounted. This embodiment is not limited to the structure illustrated in FIGS. 25A and 25B.

The light-emitting display device of this embodiment is mounted with a transistor which is excellent in operation stability, and thus has high reliability.

In this embodiment, by using a conductive layer including copper as a main component, a display device in which the wiring resistance is reduced can be provided. In a display device with a large screen or a display device with high definition to which this embodiment is applied, delay of signal transmission to an end portion of a signal line, drop in voltage of a power supply line, or the like is hardly caused. As a result, a display device in which deterioration of display quality such as display unevenness or a defect in grayscale is suppressed to improve display quality can be provided.

In addition, by using an oxide semiconductor layer which is highly purified to have a carrier concentration lower than $1\times10^{12}$ cm$^{-3}$, off current of $1\times10^{-13}$ A or lower, which is extremely small, can be achieved. As a result, a power-saving display device in which leakage current is suppressed can be provided. Further, a display device with a high ratio between the on current and the off current can be provided. Further, a display device with high contrast and high display quality can be provided.

The display device of this embodiment is provided with a transistor with high electron field-effect mobility in which a highly purified oxide semiconductor is used; thus, the transistor can operate at high speed and achieve display characteristics of moving images and high definition.

Further, since a wiring including copper as a main component is sealed with nitride films, diffusion of copper is suppressed, so that a semiconductor device with higher reliability can be provided.

Note that the structure described in this embodiment can be combined with any of the structures described in the other embodiments as appropriate.

Embodiment 8

In this embodiment, an example of electronic paper will be described as a display device which is an example of a semiconductor device of the present invention.

Figure 26:
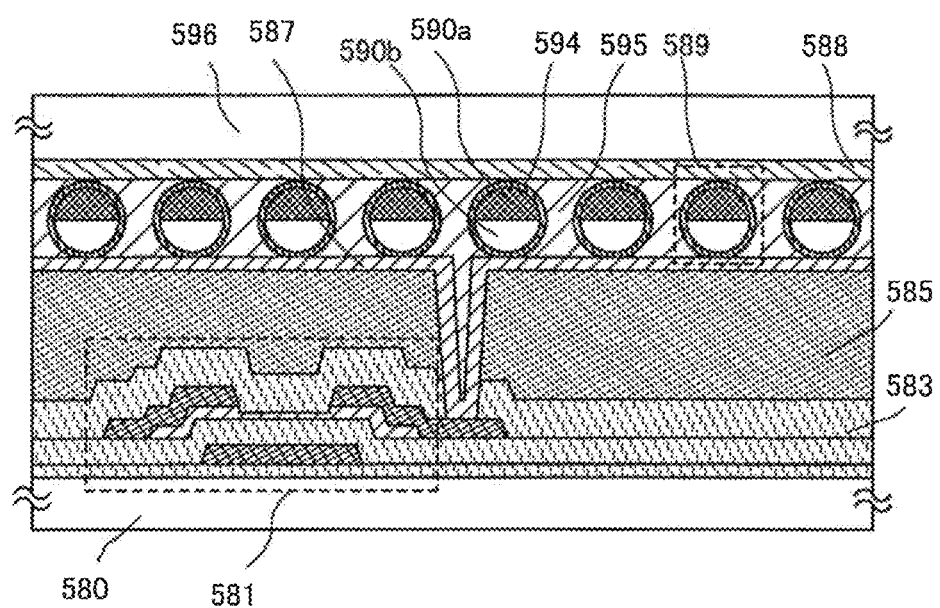
FIG. 26 illustrates a semiconductor device according to one embodiment.

FIG. 26 illustrates active matrix type electronic paper device as an example of a display device according to one embodiment of the present invention. A transistor 581 used in the display device can be manufactured in a manner similar to that of Embodiment 1 or 3.

The electronic paper in FIG. 26 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The source electrode layer or the drain electrode layer of the transistor 581 is in contact with and electrically connected to a first electrode layer 587 through an opening formed in an insulating layer 585. Between the first electrode layer 587 and a second electrode layer 588, spherical particles 589 each having a black region 590*a*, a white region 590*b*, and a cavity 594 around the black region 590*a* and the white region 590*b* which is filled with liquid are provided. A space around the spherical particles 589 is filled with a filler 595 such as a resin (see FIG. 26). Note that in FIG. 26, reference numeral 580 denotes a substrate, reference numeral 583 denotes an interlayer insulating film, and reference numeral 596 denotes a substrate.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move to opposite directions to each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. Furthermore, an image which is displayed once can be retained even when power is not supplied to the display portion. Accordingly, a displayed image can be stored even though a semiconductor device having a display function (which is also referred to simply as a display device or a semiconductor device provided with a display device) is disconnected from a power supply.

Electronic paper of this embodiment has high reliability since it is mounted with a transistor which is excellent in operation stability.

In this embodiment, by using a conductive layer including copper as a main component, a display device in which the wiring resistance is reduced can be provided. In a display device with a large screen or a display device with high definition to which this embodiment is applied, delay of signal transmission to an end portion of a signal line, drop in voltage of a power supply line, or the like is hardly caused. As a result, a display device in which deterioration of display quality such as display unevenness or a defect in grayscale is suppressed to improve display quality can be provided.

In addition, by using an oxide semiconductor layer which is highly purified to have a carrier concentration lower than $1\times10^{12}$ cm$^{-3}$, off current of $1\times10^{-13}$ A or lower, which is extremely small, can be achieved. As a result, a power-saving display device in which leakage current is suppressed can be provided. Further, a display device with a high ratio between the on current and the off current can be provided. Further, a display device with high contrast and high display quality can be provided.

Further, since a wiring including copper as a main component is sealed with nitride films, diffusion of copper is suppressed, so that a semiconductor device with higher reliability can be provided.

This embodiment can be combined with any content of Embodiment 1 or 3 as appropriate.

Embodiment 9

A display device according to one embodiment of the present invention can be applied as electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. Examples of such electronic devices are illustrated in FIGS. 27A and 27B and FIG. 28.

Figure 27A:
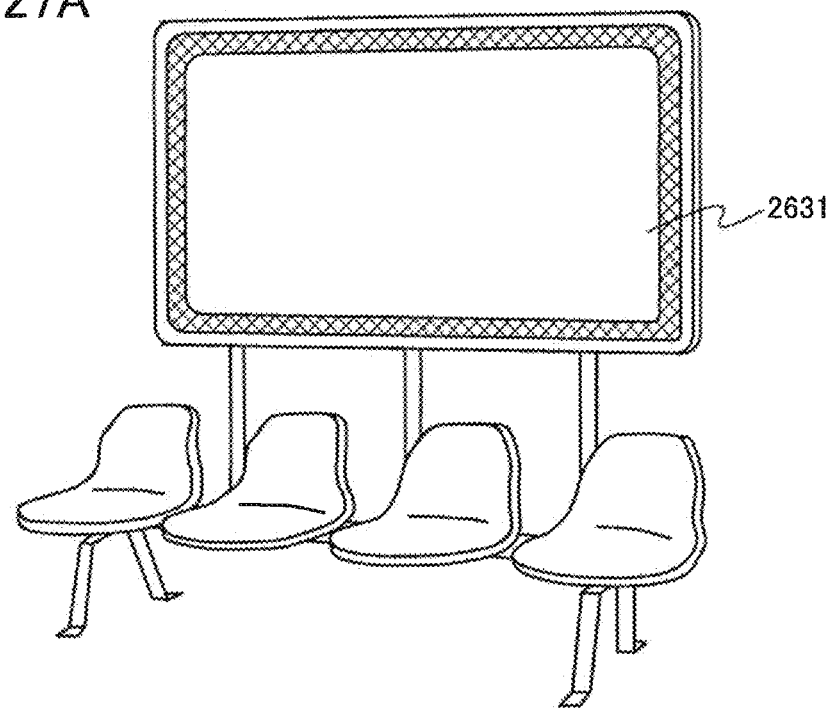
FIGS. 27A and 27B each illustrate an example of applications of electronic paper.
Figure 28:
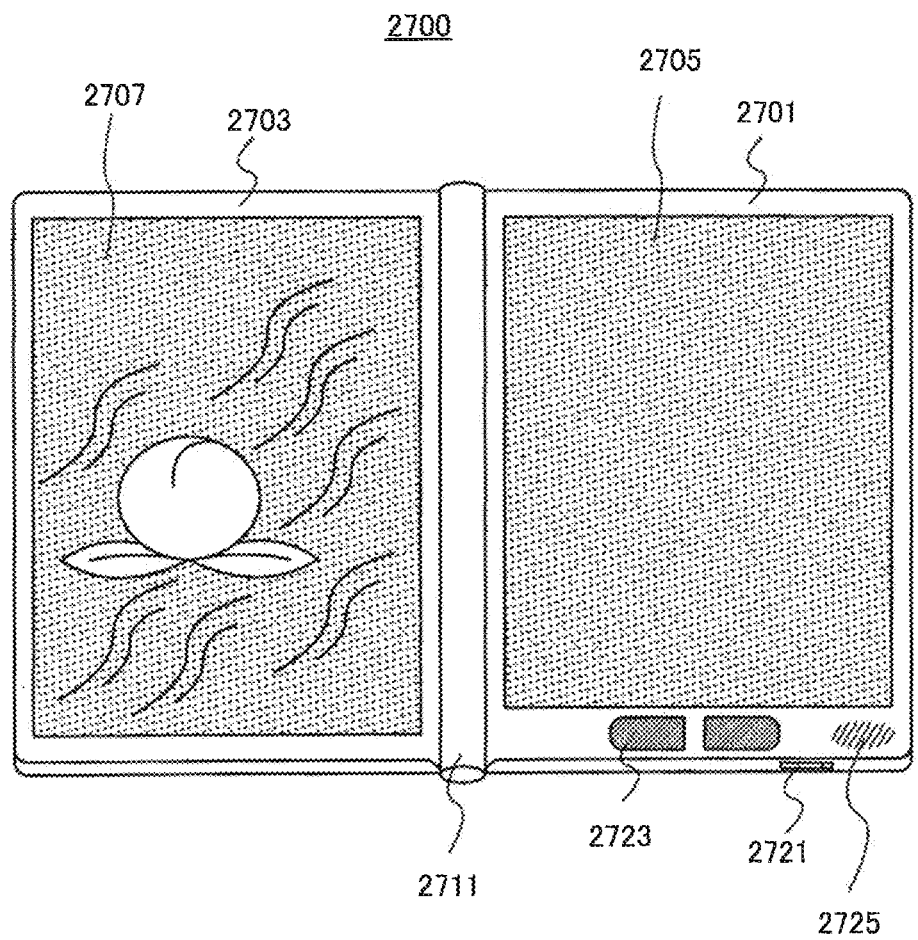
FIG. 28 illustrates an external view of an example of an electronic book device.

FIG. 27A illustrates a poster 2631 formed using electronic paper. If the advertizing medium is printed paper, the advertisement is replaced by manpower; however, when electronic paper according to one embodiment of the present invention is used, the advertisement display can be changed in a short time. Furthermore, stable images can be obtained without display defects. Note that the poster may have a configuration capable of wirelessly transmitting and receiving data.

Figure 27B:
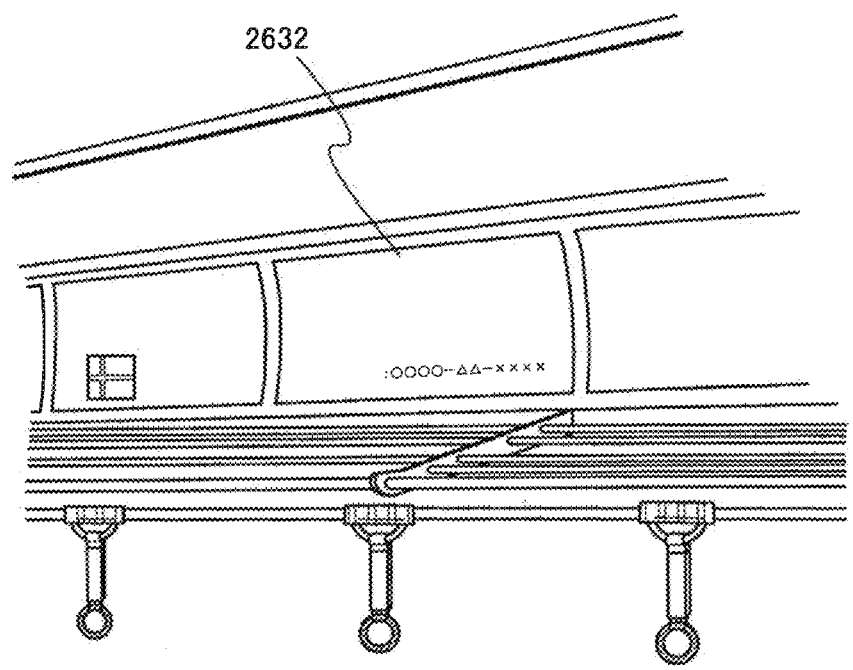

FIG. 27B illustrates an advertisement 2632 in a vehicle such as a train. If the advertizing medium is printed paper, the advertisement is replaced by manpower; however, when electronic paper according to one embodiment of the present invention is used, the advertisement display can be changed in a short time without much manpower.

Furthermore, stable images can be obtained without display defects. Note that the advertisement in a vehicle may have a configuration capable of wirelessly transmitting and receiving data.

FIG. 28 illustrates an example of an electronic book device. For example, an electronic book device 2700 includes two housings, a housing 2701 and a housing 2703. The housings 2701 and 2703 are bound with each other by an axis portion 2711, along which the electronic book device 2700 is opened and closed. With such a structure, the electronic book device 2700 can operate like a paper book.

A display portion 2705 and a display portion 2707 are incorporated in the housing 2701 and the housing 2703, respectively. The display portion 2705 and the display portion 2707 may display one image or different images. When the display portions display different images, text can be displayed on the right display portion (the display portion 2705 in FIG. 28) and an image can be displayed on the left display portion (the display portion 2707 in FIG. 28), for example.

Further, FIG. 28 illustrates an example where the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book device 2700 may have a function of an electronic dictionary.

The electronic book device 2700 may have a configuration capable of wirelessly transmitting and receiving data. Through wireless communication, desired book data or the like can be purchased and downloaded from an electronic book server.

Since a transistor excellent in operation stability is mounted, the aforementioned display devices have high reliability.

Embodiment 10

A semiconductor device according to one embodiment of the present invention can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 29A:
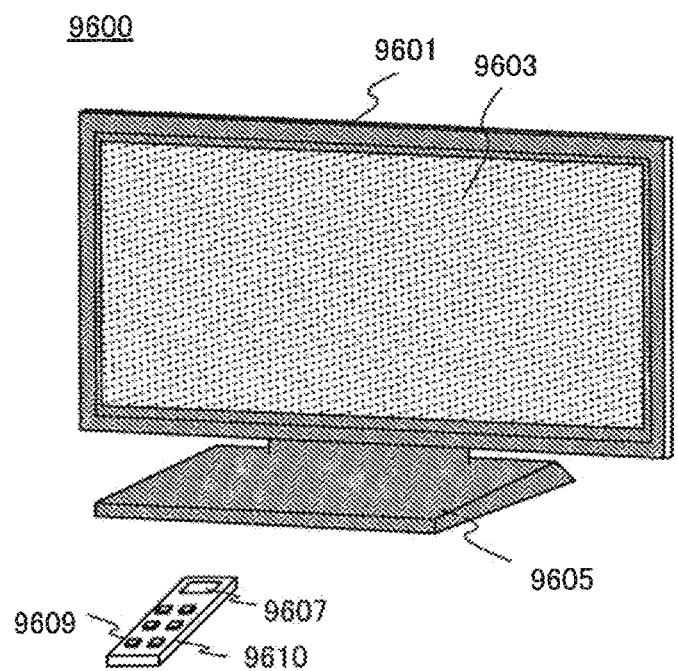
FIG. 29A illustrates an external view of an example of a television set and FIG. 29B illustrates an external view of an example of a digital photo frame.

FIG. 29A illustrates an example of a television set. In a television set 9600, a display portion 9603 is incorporated in a housing 9601. The display portion 9603 can display images. The housing 9601 is supported by a stand 9605 in this embodiment.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 29B:
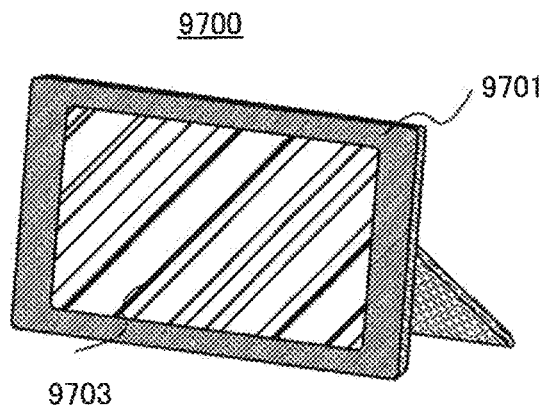

FIG. 29B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may transmit and receive data wirelessly. The structure may be employed in which desired image data is transferred wirelessly to be displayed.

Figure 30A:
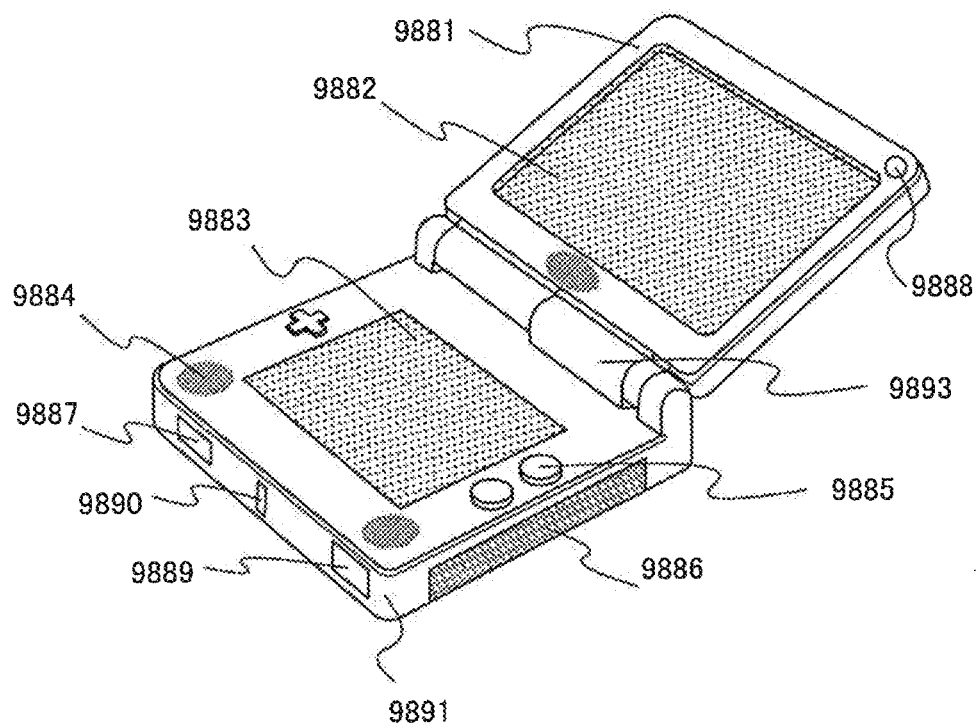
FIGS. 30A and 30B are external views of examples of amusement machines.

FIG. 30A illustrates a portable game machine including a housing 9881 and a housing 9891 which are jointed with a connection portion 9893 so as to be able to open and close. A display portion 9882 and a display portion 9883 are incorporated in the housing 9881 and the housing 9891, respectively. The portable game machine illustrated in FIG. 30A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), and a microphone 9889), and the like. Needless to say, the structure of the portable game machine is not limited to the above, and may be any structure as long as a semiconductor device according to one embodiment of the present invention is provided. Moreover, another accessory may be provided as appropriate. The portable game machine illustrated in FIG. 30A has a function of reading out a program or data stored in a storage medium to display it on the display portion and a function of sharing information with another portable game machine by wireless communication. The functions of the portable game machine illustrated in FIG. 30A are not limited to these, and the portable game machine can have a variety of functions.

Figure 30B:
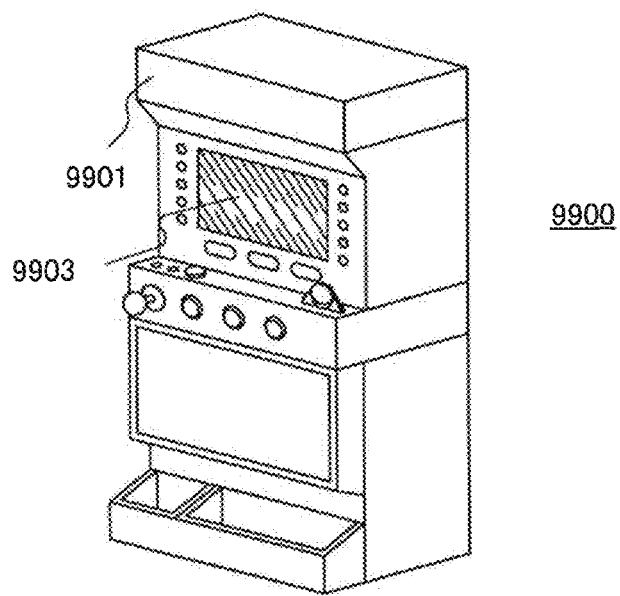

FIG. 30B illustrates an example of a slot machine which is a large game machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 31:
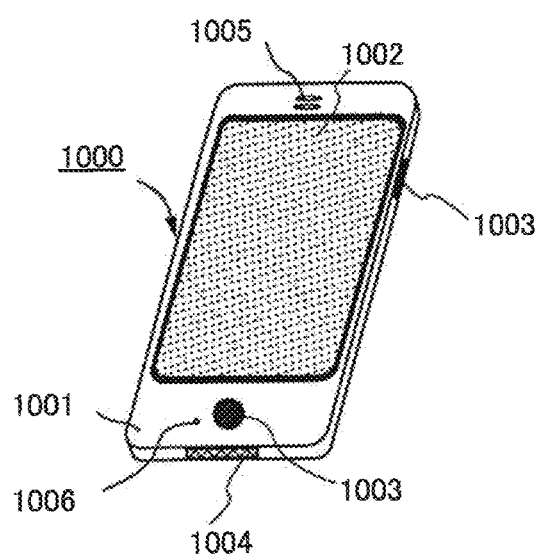
FIG. 31 illustrates an external view of an example of a mobile phone.

FIG. 31 illustrates an example of a mobile phone. A mobile phone 1000 includes a display portion 1002 incorporated in a housing 1001, operation buttons 1003, an external connection port 1004, a speaker 1005, a microphone 1006 and the like.

When the display portion 1002 of the mobile phone 1000 illustrated in FIG. 31 is touched with a finger or the like, data can be input into the mobile phone 1000. Users can make a call or text messaging by touching the display portion 1002 with their fingers or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a phone call or composing a mail, the display portion 1002 is set to a text input mode where text input is mainly performed, and text input operation can be performed on a screen. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

As described above, a display device mounted with a transistor which is excellent in operation stability can be manufactured. Since the electronic device includes the transistor whose operation stability is excellent, the reliability is high.

Embodiment 11

In this embodiment, an example of a liquid crystal display device will be described as one embodiment of a display device with reference to FIG. 32, FIG. 33, FIG. 34, and FIG. 35, which includes the transistor described in Embodiment 1 or 3 and a liquid crystal element as a semiconductor element. The transistor described in Embodiment 1 can be used for TFTs 628 and 629, which are used for the liquid crystal display device illustrated in FIG. 32, FIG. 33, FIG. 34, and FIG. 35. Further, the TFTs 628 and 629 can be manufactured through a process similar to that of Embodiment 2, and have high electric characteristics and high reliability. The TFTs 628 and 629 are transistors in each of which a channel formation region is formed in an oxide semiconductor layer. With reference to FIG. 32, FIG. 33, FIG. 34, and FIG. 35, an example in which the transistor which can be manufactured in a manner similar to that of the transistor illustrated in FIG. 1B is described as an example, but an embodiment of the present invention is not limited thereto.

Hereinafter, a vertical alignment (VA) mode liquid crystal display device is described. The VA is a method to control the alignment of liquid crystal molecules of a liquid crystal display panel. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 32:
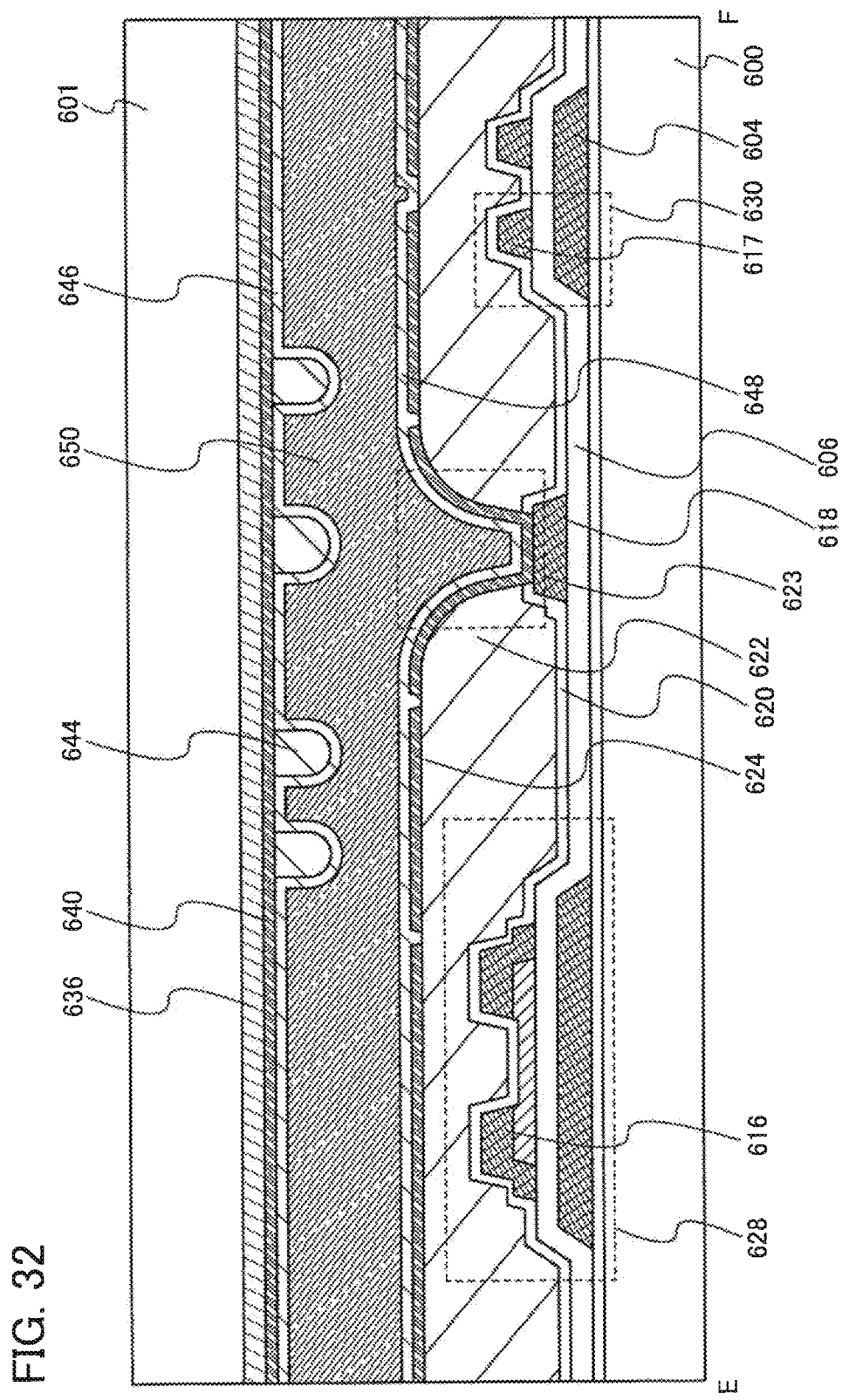
FIG. 32 illustrates a semiconductor device according to one embodiment.
Figure 33:
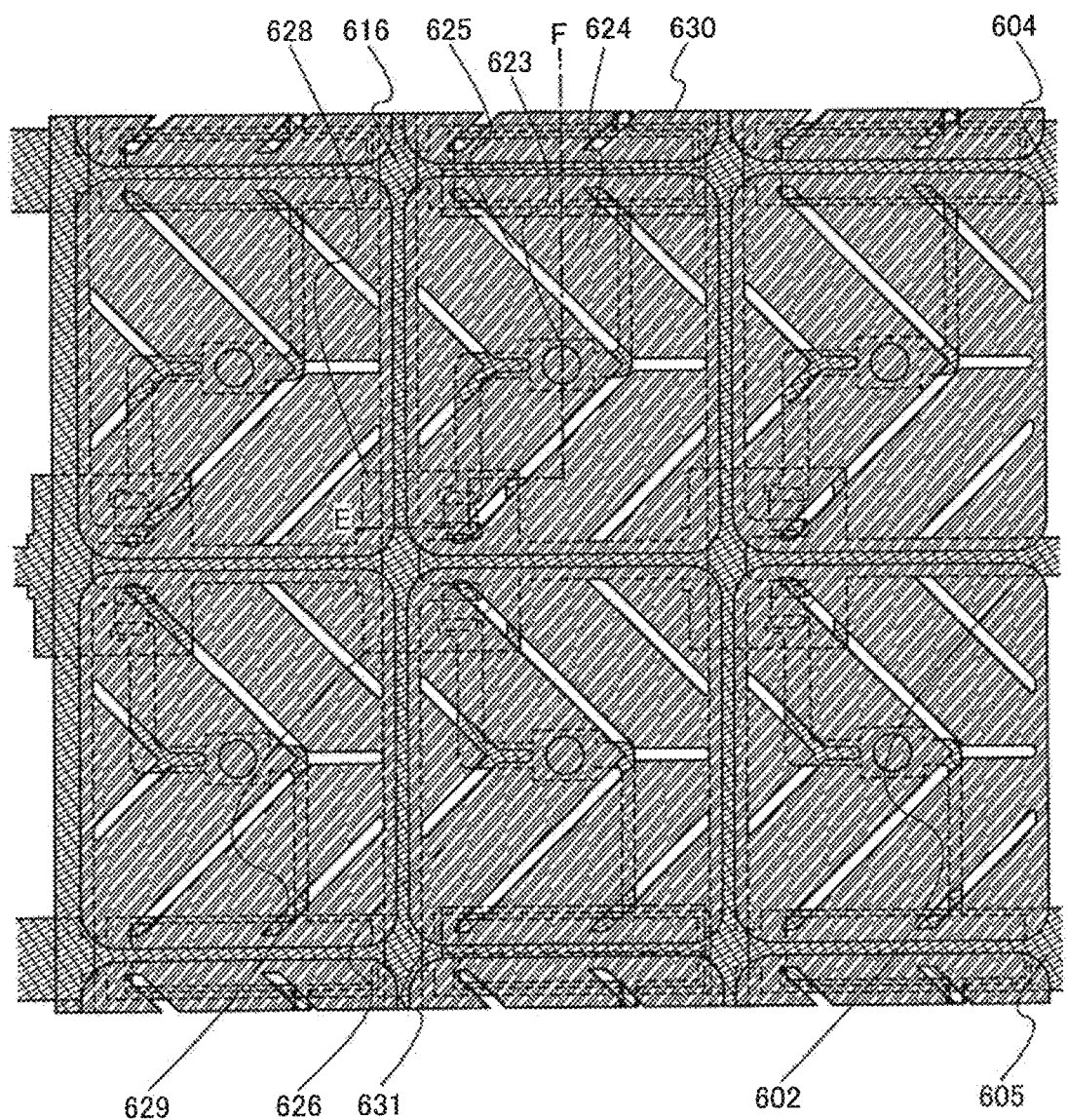
FIG. 33 illustrates a semiconductor device according to one embodiment.
Figure 34:
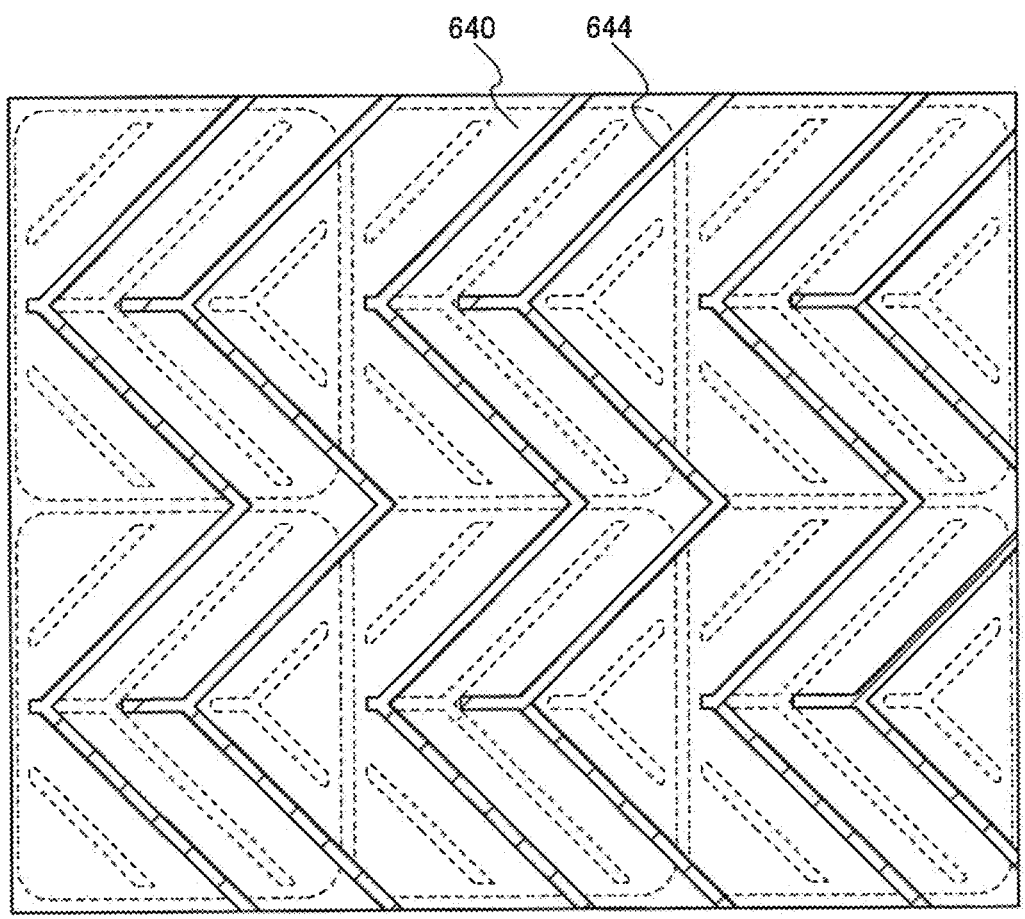
FIG. 34 illustrates a semiconductor device according to one embodiment.

FIGS. 33 and 34 illustrate a pixel electrode and a counter electrode, respectively. FIG. 33 is a top view showing the substrate side where the pixel electrode is formed. FIG. 32 illustrates a cross-sectional structure taken along section line E-F in FIG. 33. FIG. 34 is a top plan view of a side of a substrate on which a counter electrode is formed. Hereinafter, description is made with reference to these drawings.

FIG. 32 illustrates a state in which a substrate 600 provided with a TFT 628, a pixel electrode 624 connected to the TFT 628, and a storage capacitor portion 630 overlaps with a counter substrate 601 provided with a counter electrode 640 and the like, and liquid crystal is injected therebetween.

The counter substrate 601 is provided with a coloring layer 636 and the counter electrode 640, and projections 644 are formed on the counter electrode 640. An alignment film 648 is formed over the pixel electrode 624, and an alignment film 646 is similarly formed on the counter electrode 640 and the projections 644. A liquid crystal layer 650 is formed between the substrate 600 and the counter substrate 601.

The TFT 628, the pixel electrode 624 connected to the TFT 628, and the storage capacitor portion 630 are formed over the substrate 600. The pixel electrode 624 is connected to a wiring 618 in a contact hole 623. The contact hole 623 penetrates an insulating layer 620 covering the TFT 628, the wiring 618, and the storage capacitor portion 630, and further penetrates a third insulating layer 622 covering the insulating layer 620. As the TFT 628, the transistor described in Embodiment 1 or 3 can be used as appropriate. Further, the storage capacitor portion 630 includes a first capacitor wiring 604 which is formed at the same time as a gate wiring 602 of the TFT 628; a gate insulating layer 606; and a second capacitor wiring 617 which is formed at the same time as the wirings 616 and 618.

The pixel electrode 624, the liquid crystal layer 650, and the counter electrode 640 overlap with each other, so that a liquid crystal element is formed.

FIG. 33 illustrates a structure over the substrate 600. The pixel electrode 624 can be formed using a light-transmitting conductive material such as indium oxide containing tungsten oxide, an indium zinc oxide containing tungsten oxide, an indium oxide containing titanium oxide, an indium tin oxide containing titanium oxide, indium tin oxide (hereinafter referred to as ITO), indium zinc oxide, indium tin oxide to which a silicon oxide is added, or the like.

The pixel electrode 624 can be formed using a conductive composition including a conductive macromolecule (also referred to as a conductive polymer). The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Slits 625 are formed in the pixel electrode 624. The slits 625 are formed to control alignment of the liquid crystals.

The TFT 629, a pixel electrode 626 connected to the TFT 629, and a storage capacitor portion 631 illustrated in FIG. 33 can be formed in a similar manner to the TFT 628, the pixel electrode 624, and the storage capacitor portion 630, respectively. Both the TFTs 628 and 629 are connected to the wiring 616. A pixel of this liquid crystal display panel includes the pixel electrodes 624 and 626. The pixel electrodes 624 and 626 are subpixels.

FIG. 34 illustrates a structure of a counter substrate side. It is preferable to use the same material as that of the pixel electrode 624 to form the counter electrode 640. The projections 644 that control alignment of liquid crystals are formed over the counter electrode 640.

Figure 35:
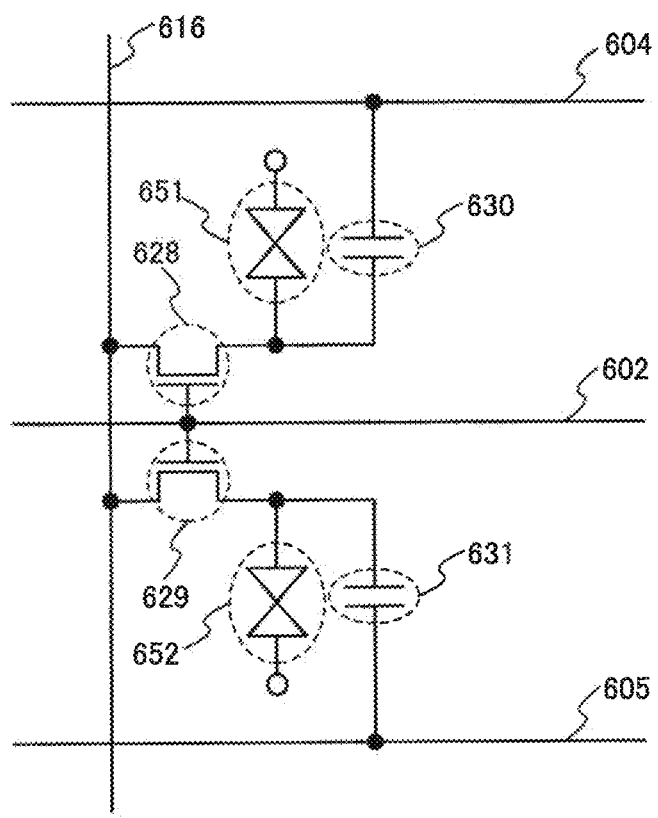
FIG. 35 illustrates a semiconductor device according to one embodiment.

FIG. 35 illustrates an equivalent circuit of this pixel structure. Both the TFTs 628 and 629 are connected to the gate wiring 602 and the wiring 616. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When a voltage is applied to the pixel electrode 624 provided with the slits 625, a distorted electric field (an oblique electric field) is generated in the vicinity of the slits 625. The slit 625 and the projection 644 on the counter substrate 601 side are alternately arranged in an engaging manner, and thus, an oblique electric field is effectively generated to control alignment of the liquid crystal, so that a direction of alignment of the liquid crystal varies depending on location. That is, a viewing angle of the liquid crystal display panel is increased by domain multiplication.

Next, another VA liquid crystal display device, which is different from the above, is described with reference to FIG. 36, FIG. 37, FIG. 38, and FIG. 39.

Figure 36:
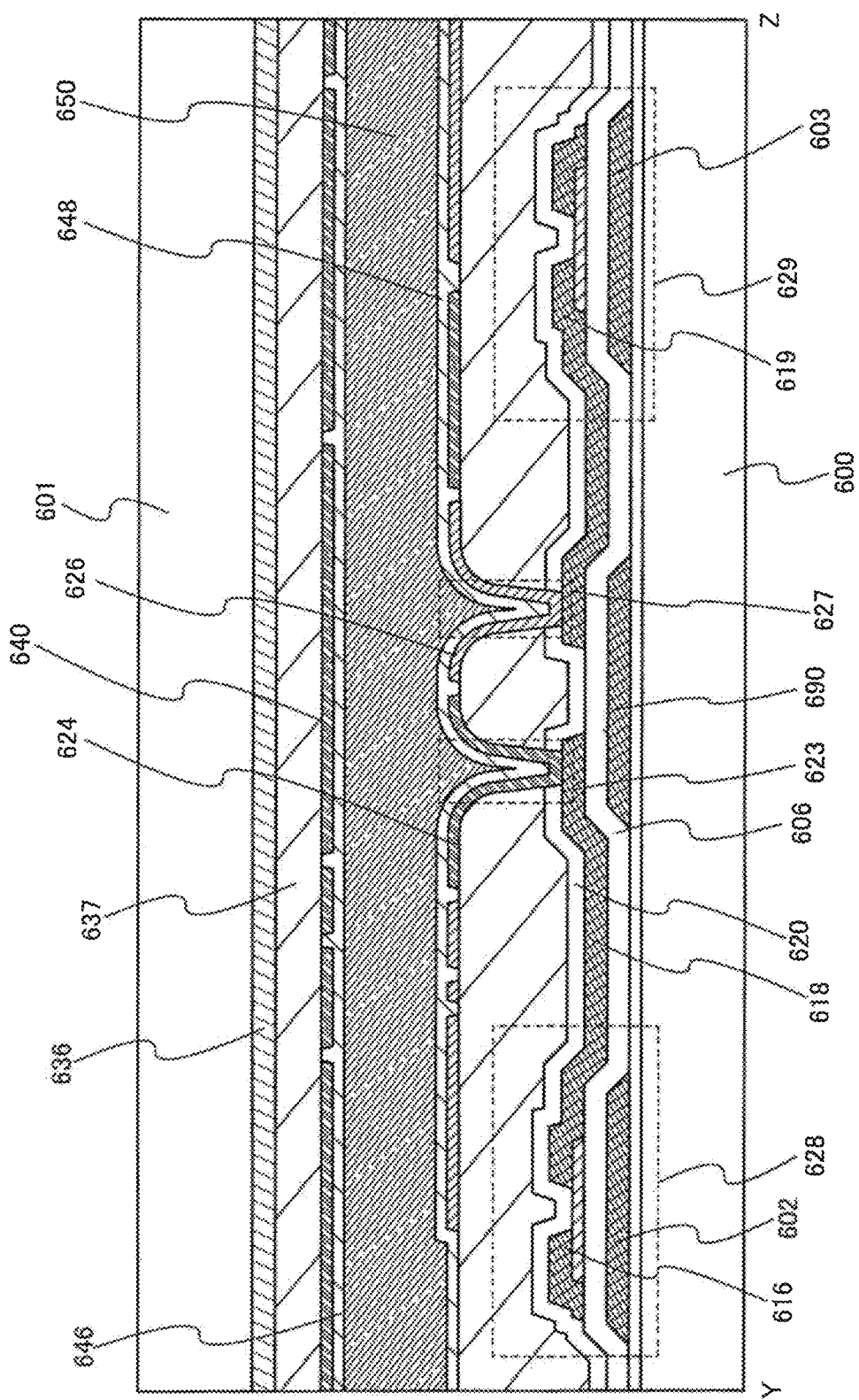
FIG. 36 illustrates a semiconductor device according to one embodiment.
Figure 37:
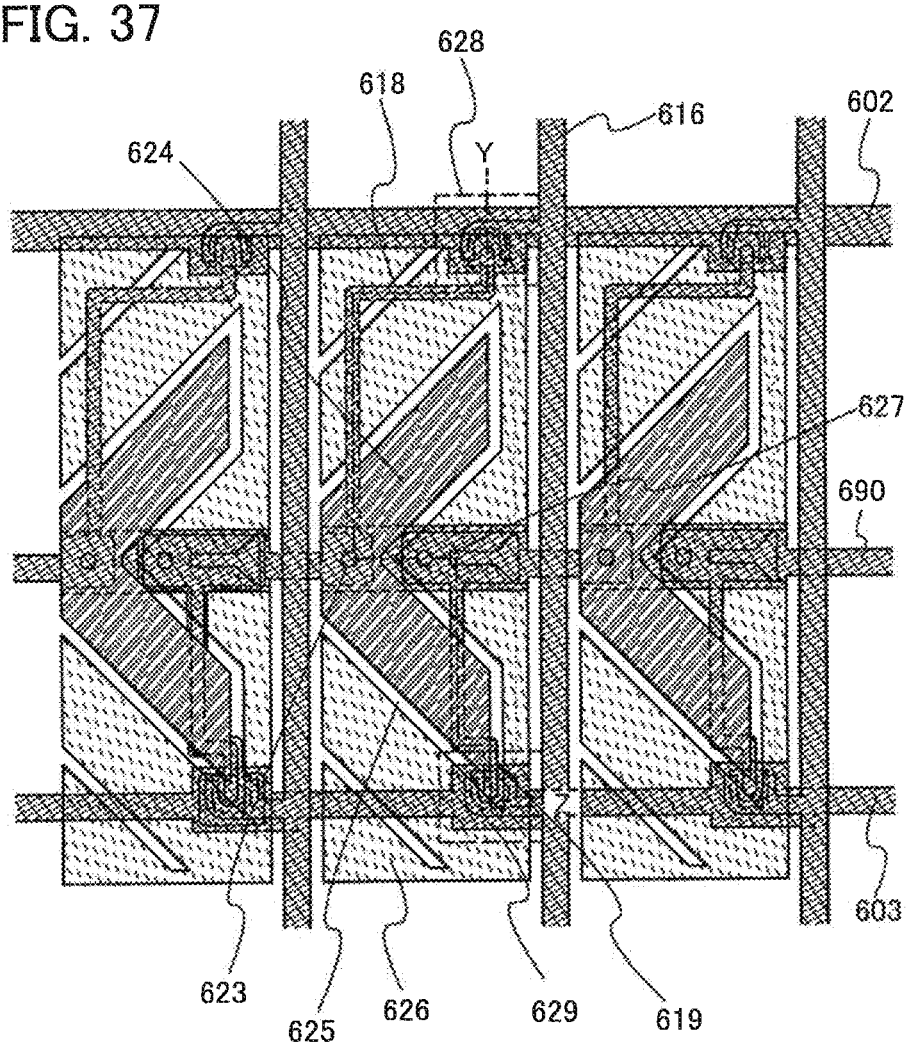
FIG. 37 illustrates a semiconductor device according to one embodiment.

FIGS. 36 and 37 each illustrate a pixel structure of a VA-mode liquid crystal display panel. FIG. 37 is a top view of the substrate 600. FIG. 36 is a view of a cross-sectional structure taken along section line Y-Z in FIG. 37. Description below will be given with reference to both the drawings.

In this pixel structure, a plurality of pixel electrodes are provided in one pixel, and a TFT is connected to each pixel electrode. The plurality of TFTs are constructed so as to be driven by different gate signals. That is, signals that are applied to individual pixel electrodes in a multi-domain pixel are controlled independently of each other.

Through the contact hole 623, the pixel electrode 624 is connected to the TFT 628 with the wiring 618. Through a contact hole 627, the pixel electrode 626 is connected to a TFT 629 with a wiring 619. The gate wiring 602 of the TFT 628 is separated from a gate wiring 603 of the TFT 629 so that different gate signals can be supplied. On the other hand, the wiring 616 serving as a data line is shared by the TFTs 628 and 629. As each of the TFTs 628 and 629, the transistor described in Embodiment 1 or 3 can be used as appropriate. Also, a capacitor wiring 690 is provided.

Figure 39:
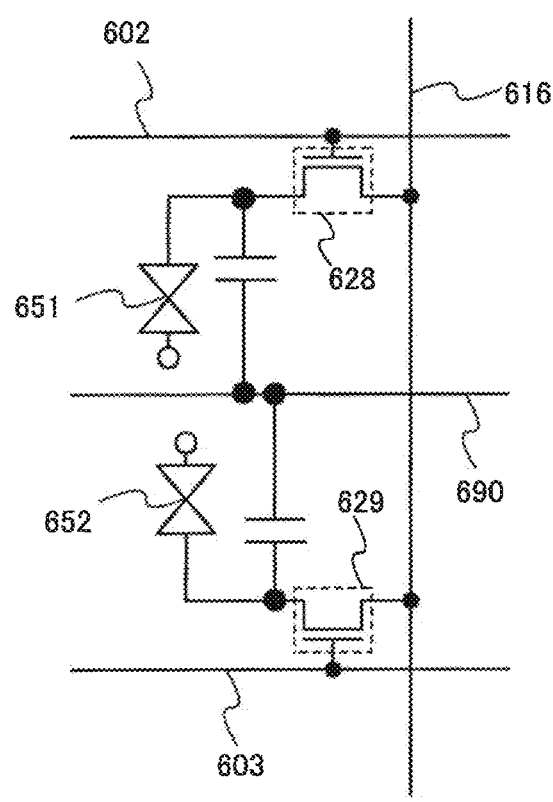
FIG. 39 illustrates a semiconductor device according to one embodiment.

The shape of the pixel electrode 624 is different from that of the pixel electrode 626, and the pixel electrodes are separated by slits. The pixel electrode 626 surrounds the pixel electrode 624, which has a V-shape. The TFTs 628 and 629 make the timing of applying voltages to the pixel electrodes 624 and 626 different from each other, thereby controlling alignment of liquid crystals. FIG. 39 shows an equivalent circuit of this pixel structure. The TFT 628 is connected to the gate wiring 602, and the TFT 629 is connected to the gate wiring 603. If different gate signals are supplied to the gate wirings 602 and 603, operation timing of the TFTs 628 and 629 can be different.

Figure 38:
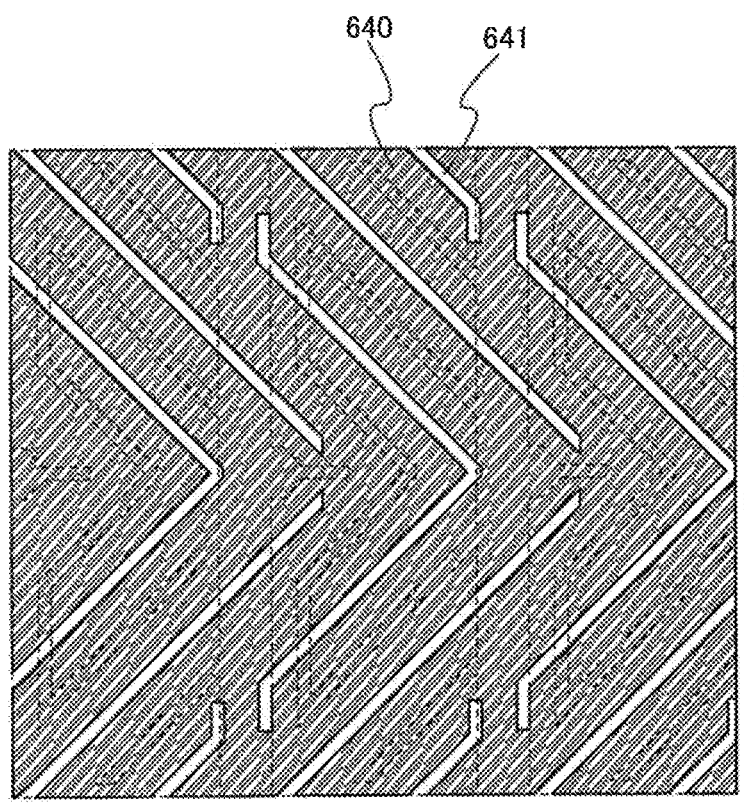
FIG. 38 illustrates a semiconductor device according to one embodiment.

A counter substrate 601 is provided with the coloring layer 636 and the counter electrode 640. A planarization layer 637 is formed between the coloring layer 636 and the counter electrode 640 to prevent alignment disorder of the liquid crystals. FIG. 38 illustrates a structure on the counter substrate side. The counter electrode 640 is shared by plural pixels, and slits 641 are formed in the counter electrode 640. The slit 641 and the slit 625 on the pixel electrodes 624 and 626 side are alternately arranged in an engaging manner; thus, an oblique electric field is effectively generated, and alignment of the liquid crystal can be controlled. Accordingly, the orientation of the liquid crystals can be varied in different places, so that the viewing angle is widened.

The pixel electrode 624, the liquid crystal layer 650, and the counter electrode 640 overlap with each other, so that a first liquid crystal element is formed. Further, the pixel electrode 626, the liquid crystal layer 650, and the counter electrode 640 overlap with each other, so that a second liquid crystal element is formed. Furthermore, the multi-domain structure is employed in which the first liquid crystal element and the second liquid crystal element are provided for one pixel.

Although the VA-mode liquid crystal display device is described in this embodiment as a liquid crystal display device including the transistor described in Embodiment 1 or 3, the transistor described in Embodiment 1 or 3 can be applied to an IPS-mode liquid crystal display device, a TN-mode liquid crystal display device, or the like.

In the case where a transistor in a pixel portion of the above-described liquid crystal display device is manufactured using the manufacturing method of a transistor described in Embodiment 2, display unevenness due to variations in the threshold voltage of transistors of respective pixels can be suppressed.

Embodiment 12

In this embodiment, one embodiment of a substrate provided with a circuit of a display device whose structure is different from that of Embodiment 1 or 3 will be described with reference to FIG. 40.

Figure 40:
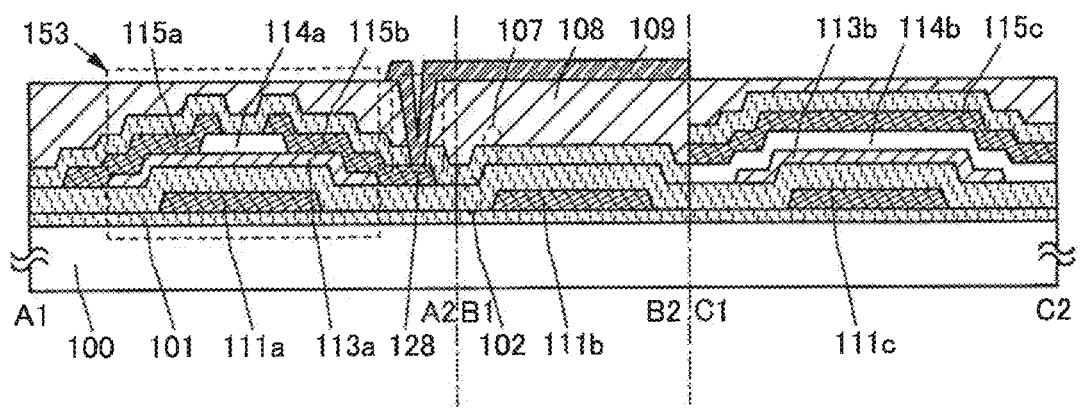
FIG. 40 illustrates a semiconductor device according to one embodiment.

FIG. 40 illustrates a pixel structure provided in the display device. FIG. 40 is a cross-sectional view illustrating a stacked structure of the pixel.

In cross section A1-A2, a stacked structure of a transistor 153 used in the pixel portion is illustrated. The transistor 153 is one embodiment of a transistor having a bottom gate structure.

In cross section B1-B2, a stacked structure of a capacitor formed in the pixel portion is illustrated.

Further, in cross section C1-C2, a stacked structure in an intersection portion of a gate wiring and a source wiring is illustrated.

In the substrate provided with a circuit of a display device of this embodiment, a channel protective layer is provided in the transistor, which is a difference from the substrate provided with a circuit of a display device described in Embodiment 1. In addition, the structure of the intersection portion of the gate wiring and the source wiring is different.

Specifically, a fourth insulating layer 114a functioning as a channel protective layer is provided over the channel formation region of the oxide semiconductor layer 113a in the transistor 153. Further, in the intersection portion of the gate wiring and the source wiring, a fourth insulating layer 114b is interposed between the gate wiring 111c formed using a first conductive layer and the source wiring 115c formed using a second conductive layer.

The substrate provided with a circuit of a display device described in this embodiment has the same structure as the substrate provided with a circuit of a display device described in Embodiment 1, except for provision of the fourth insulating layer 114a and the fourth insulating layer 114b; thus, the detailed description is omitted.

In this embodiment, the fourth insulating layer is formed using a silicon oxide ($SiO_x$ (x>0)) layer to have a thickness of 300 nm. Other than silicon oxide, the fourth insulating layer can be formed using one kind of an oxide, a nitride, an oxynitride, and a nitride oxide of aluminum, tantalum, yttrium, or hafnium; or a compound including at least two or more kinds of the above.

In this embodiment, the fourth insulating layer is formed after the oxide semiconductor layer is highly purified. As a method for forming the fourth insulating layer, a method by which an impurity such as water or hydrogen is not incorporated (e.g., a sputtering method or the like) is selected so as not to contaminate the highly purified oxide semiconductor layer.

In the case where the fourth insulating layer in contact with the oxide semiconductor layer is formed using a silicon oxide ($SiO_x$ (x>0)) layer with a thickness of 1 nm or more, a silicon target is preferably used. A silicon oxide film formed by sputtering in an oxygen and rare gas atmosphere by using the silicon target contains a large number of dangling bonds of silicon atoms or oxygen atoms.

The impurity left in the oxide semiconductor layer diffuses into the fourth insulating layer including a large number of dangling bonds of silicon atoms or oxygen atoms and is fixed. Specifically, a hydrogen atom, a compound including a hydrogen atom such as $H_2O$, or the like in the oxide semiconductor layer is likely to diffuse and move into the fourth insulating layer and fixed in the fourth insulating layer.

The fourth insulating layer is deposited by a pulsed DC sputtering method using a columnar polycrystalline silicon target doped with boron (the resistivity is 0.01 Ωcm) with a purity of 6 N under conditions where the distance between the substrate and the target (T-S distance) is 89 mm, the pressure is 0.4 Pa, the direct-current (DC) power is 6 kW, and the atmosphere is an oxygen atmosphere (the proportion of the oxygen flow is 100%).

The substrate temperature in film formation may be higher than or equal to room temperature and lower than or equal to 300° C. and in this embodiment, is 100° C.

Deposition of a silicon oxide film is performed by a sputtering method with use of a high-purity gas and a sputtering apparatus provided with a cryopump. The sputtering method can be carried out in a rare gas (typically argon) atmosphere, an oxygen atmosphere, or an atmosphere including a rare gas (typically argon) and oxygen. Note that the oxide insulating film formed by a sputtering method is distinctively dense and even a single layer of the oxide insulating film can be used as a protective film for suppressing a phenomenon in which an impurity is diffused into a layer in contact therewith.

As a target, a silicon oxide target or a silicon target may be used. In addition, a target doped with phosphorus (P) or boron (B) can be used so that phosphorus (P) or boron (B) is added to the oxide insulating film.

Next, by a photolithography method, an inkjet method, or the like, a mask is formed over the fourth insulating layer, and etching is performed with use of the mask, so that the fourth insulating layer 114a and the fourth insulating layer 114b are formed.

In this embodiment, the fourth insulating layer formed using an oxide insulating layer is formed to be in contact with the highly purified oxide semiconductor layer. The impurity left in the oxide semiconductor layer diffuses into the fourth insulating layer and is fixed therein. Further, oxygen is supplied to the oxide semiconductor layer from the oxide insulating layer included in the fourth insulating layer, whereby oxygen deficiency in the oxide semiconductor layer can be reduced.

Further, the oxide semiconductor layer and the oxide insulating layer are interposed between the gate wiring and the source wiring at the intersection portion, whereby the distance between the wirings is increased; thus, capacitance generated between the wirings at the intersection portion can be reduced.

This embodiment can be freely combined with any of the other embodiments in this specification.

This application is based on Japanese Patent Application serial no. 2009-270784 filed with Japan Patent Office on Nov. 27, 2009, the entire contents of which are hereby incorporated by reference.

EXPLANATION OF REFERENCE

10: pulse output circuit, 11: wiring, 12: wiring, 13: wiring, 14: wiring, 15: wiring, 16: wiring, 17: wiring. 21: input terminal, 22: input terminal. 23: input terminal, 24: input terminal, 25: input terminal, 26: output terminal, 27: output terminal, 31: transistor, 32: transistor, 33: transistor, 34: transistor, 35: transistor, 36: transistor, 37: transistor. 38: transistor, 39: transistor, 40: transistor. 41: transistor, 51: power supply line, 52: power supply line, 53: power supply line, 61: period, 62: period, 100: substrate, 101: base film, 102: insulating layer, 102a: insulating layer, 102b: insulating layer, 103: oxide semiconductor film, 107: insulating layer, 107a: insulating layer, 107b: insulating layer, 108: insulating layer, 109: pixel electrode, 11a: gate electrode, 11b: capacitor wiring 11c: gate wiring, 113a: oxide semiconductor layer, 113b: oxide semiconductor layer, 114a: insulating layer, 114b: insulating layer, 115a: electrode, 115b: electrode, 115c: source wiring, 128: contact hole, 151: transistor, 152: transistor, 153: transistor, 200: substrate, 400: substrate, 402: insulating layer, 404a: oxide semiconductor layer, 404b: oxide semiconductor layer, 408: contact hole, 410a: wiring, 410b: wiring. 410c: wiring. 421a: gate electrode, 421b: gate electrode, 422a: electrode, 422b: electrode, 428: insulating layer, 440A: transistor, 440B: transistor, 455a: electrode, 455b: electrode, 455c: electrode, 455d: electrode, 581: transistor, 585: insulating layer, 587: electrode layer, 588: electrode layer, 589: spherical particle, 590a: black region, 590b: white region, 594: cavity, 595: filler, 600 substrate, 601: counter substrate. 602: gate wiring. 603: gate wiring, 604: capacitor wiring, 605: capacitor wiring, 606: gate insulating layer, 616: wiring. 617: capacitor wiring, 618: wiring, 619: wiring, 620. insulating layer, 622: insulating layer, 623: contact hole, 624: pixel electrode, 625: slit. 626: pixel electrode, 627: contact hole, 628: TFT, 629: TFT, 630: storage capacitor portion, 631: storage capacitor portion, 636: coloring layer, 637: planarization layer, 640: counter electrode, 641: slit, 644: projection, 646: alignment film, 648: alignment film, 650. liquid crystal layer, 651: liquid crystal element, 652: liquid crystal element, 690. capacitor wiring. 1000: mobile phone, 1001: housing, 1002: display portion, 1003: operation button, 1004: external connection port, 1005: speaker, 1006: microphone, 2600: TFT substrate, 2601: counter substrate. 2602: sealant, 2603: pixel portion, 2604: display element, 2605: coloring layer, 2606: polarizing plate, 2607: polarizing plate, 2608: wiring circuit board, 2609: flexible wiring board. 2610: cold cathode tube. 2611: reflective plate. 2612: circuit board, 2613: diffusion plate. 2631: poster, 2632: advertisement, 2700: electronic book device, 2701: housing, 2703: housing. 2705: display portion. 2707: display portion, 2711: axis portion. 2721: power switch, 2723: operation key, 2725: speaker, 4001: substrate, 4002: pixel portion. 4003: signal line driver circuit, 4004: scan line driver circuit, 4005: sealant, 4006: substrate, 4008: liquid crystal layer. 4010: transistor. 4011: transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4040: conductive layer, 4501: substrate, 4502: pixel portion, 4503a: signal line driver circuit, 4504a: scan line driver circuit, 4505: sealant, 4506: substrate. 4507: filler, 4509: transistor, 4510: transistor, 4511: light-emitting element, 4512: electroluminescent layer, 4513: electrode layer, 4515: connection terminal electrode, 4516: terminal electrode, 4517: electrode layer, 4518a: FPC, 4519: anisotropic conductive film, 4520: partition, 4540: conductive layer. 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: transistor, 5604: wiring. 5605: wiring. 6400: pixel. 6401: switching transistor, 6402: driver transistor, 6403: capacitor, 6404: light-emitting element, 6405: signal line, 6406: scan line, 6407: power supply line, 6408: common electrode, 7001: driver TFT, 7002: light-emitting element, 7003: electrode, 7004: EL layer, 7005: electrode, 7008: electrode, 7009: partition, 7010: substrate, 7011: driver TFT, 7012: light-emitting element, 7013: electrode. 7014: EL layer, 7015: electrode, 7016: blocking film, 7017: conductive film, 7019: partition, 7020: substrate, 7021: driver TFT, 7022: light-emitting element, 7023: electrode, 7024: EL layer, 7025: electrode, 7026: electrode, 7027: conductive film, 7029: partition, 7030: gate insulating layer, 7032: insulating layer, 7033: color filter layer, 7034: overcoat layer, 7035: protective insulating layer, 7040: gate insulating layer, 7042: insulating layer, 7043: color filter layer, 7044: overcoat layer, 7045: protective insulating layer, 7052: protective insulating layer, 7053: planarization insulating layer, 7055: insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing. 9882: display portion, 9883: display portion, 9884: speaker portion, 9885: operation key, 9886: storage medium inserting portion, 9887: connection terminal, 9888: sensor, 9889: microphone, 9890: LED lamp, 9891: housing, 9893: connection portion, 9900 slot machine, 9901: housing, 9903: display portion

The invention claimed is:

1. A semiconductor device comprising:
   a gate electrode;
   a first insulating layer over the gate electrode;
   a semiconductor layer over the first insulating layer and comprising a region overlapping with the gate electrode;
   a first electrode and a second electrode each over and electrically connected to the semiconductor layer; and
   a second insulating layer over the first electrode and the second electrode,
   wherein:
   each of the first electrode and the second electrode comprises:
   a first conductive barrier layer; and
   a conductive layer comprising copper and comprising a region in contact with an upper surface of the first conductive barrier layer;

the semiconductor layer comprises:
a first region not overlapping with any of the first electrode and the second electrode;
a second region overlapping with the first electrode; and
a third region overlapping with the second electrode;
the first region of the semiconductor layer is positioned between the second region of the semiconductor layer and the third region of the semiconductor layer;
the first region of the semiconductor layer comprises a region in contact with the second insulating layer;
the first region of the semiconductor layer is thinner than the second region of the semiconductor layer and the third region of the semiconductor layer;
a lower end portion of the first conductive barrier layer of the first electrode and a lower end portion of the first conductive barrier layer of the second electrode face each other;
a lower end portion of the conductive layer of the first electrode and a lower end portion of the conductive layer of the second electrode face each other;
a distance between the lower end portion of the first conductive barrier layer of the first electrode and the lower end portion of the first conductive barrier layer of the second electrode is shorter than a distance between the lower end portion of the conductive layer of the first electrode and the lower end portion of the conductive layer of the second electrode;
the second electrode comprises:
a first region overlapping with the gate electrode; and
a second region not overlapping with the gate electrode;
the lower end portion of the first conductive barrier layer of the first electrode is in contact with an upper end portion of the second region of the semiconductor layer; and
the lower end portion of the first conductive barrier layer of the second electrode is in contact with an upper end portion of the third region of the semiconductor layer.

2. The semiconductor device claim 1, wherein each of the first electrode and the second electrode comprises a region in contact with an upper surface of the semiconductor layer.

3. The semiconductor device claim 1, wherein the first conductive barrier layer is capable of suppressing diffusion of copper.

4. The semiconductor device claim 1, wherein the first conductive barrier layer comprises titanium.

5. The semiconductor device claim 1, wherein the first conductive barrier layer comprises a metal nitride.

6. The semiconductor device claim 1, wherein each of the first electrode and the second electrode comprises a second conductive barrier layer comprising a region in contact with an upper surface of the conductive layer.

7. The semiconductor device claim 1, wherein each of the first electrode and the second electrode comprises a region in contact with an end portion of the semiconductor layer.

8. The semiconductor device claim 1, wherein the semiconductor layer is an oxide semiconductor layer.

9. The semiconductor device claim 1, wherein the first insulating layer comprises:
a first layer comprising a silicon nitride; and
a second layer over the first layer and comprising a silicon oxide.

10. The semiconductor device claim 1, wherein the second insulating layer comprises:
a first layer comprising a silicon oxide; and
a second layer over the first layer and comprising a silicon nitride.

11. A semiconductor device comprising:
a gate electrode;
a first insulating layer over the gate electrode;
a semiconductor layer over the first insulating layer and comprising a region overlapping with the gate electrode;
a first electrode and a second electrode each over and electrically connected to the semiconductor layer;
a second insulating layer over the first electrode and the second electrode;
an organic resin layer over the second insulating layer; and
a pixel electrode over the organic resin layer and electrically connected to the second electrode,
wherein:
each of the first electrode and the second electrode comprises:
a first conductive barrier layer; and
a conductive layer comprising copper and comprising a region in contact with an upper surface of the first conductive barrier layer;
the semiconductor layer comprises:
a first region not overlapping with any of the first electrode and the second electrode;
a second region overlapping with the first electrode; and
a third region overlapping with the second electrode;
the first region of the semiconductor layer is positioned between the second region of the semiconductor layer and the third region of the semiconductor layer;
the first region of the semiconductor layer comprises a region in contact with the second insulating layer;
the first region of the semiconductor layer is thinner than the second region of the semiconductor layer and the third region of the semiconductor layer;
a lower end portion of the first conductive barrier layer of the first electrode and a lower end portion of the first conductive barrier layer of the second electrode face each other;
a lower end portion of the conductive layer of the first electrode and a lower end portion of the conductive layer of the second electrode face each other;
a distance between the lower end portion of the first conductive barrier layer of the first electrode and the lower end portion of the first conductive barrier layer of the second electrode is shorter than a distance between the lower end portion of the conductive layer of the first electrode and the lower end portion of the conductive layer of the second electrode; and
the second electrode comprises:
a first region overlapping with the gate electrode;
a second region overlapping with the pixel electrode; and
a third region not overlapping with any of the gate electrode and the pixel electrode.

12. The semiconductor device claim 11, wherein each of the first electrode and the second electrode comprises a region in contact with an upper surface of the semiconductor layer.

13. The semiconductor device claim 11, wherein the first conductive barrier layer is capable of suppressing diffusion of copper.

14. The semiconductor device claim 11, wherein the first conductive barrier layer comprises titanium.

15. The semiconductor device claim 11, wherein the first conductive barrier layer comprises a metal nitride.

16. The semiconductor device claim 11, wherein each of the first electrode and the second electrode comprises a second conductive barrier layer comprising a region in contact with an upper surface of the conductive layer.

17. The semiconductor device claim 11, wherein each of the first electrode and the second electrode comprises a region in contact with an end portion of the semiconductor layer.

18. The semiconductor device claim 11, wherein the semiconductor layer is an oxide semiconductor layer.

19. The semiconductor device claim 11, wherein the first insulating layer comprises:
a first layer comprising a silicon nitride; and
a second layer over the first layer and comprising a silicon oxide.

20. The semiconductor device claim 11, wherein the second insulating layer comprises:
a first layer comprising a silicon oxide; and
a second layer over the first layer and comprising a silicon nitride.

21. A semiconductor device comprising:
a gate electrode;
a first insulating layer over the gate electrode;
a semiconductor layer over the first insulating layer and comprising a region overlapping with the gate electrode;
a first electrode and a second electrode each over and electrically connected to the semiconductor layer;
a second insulating layer over the first electrode and the second electrode;
an organic resin layer over the second insulating layer; and
a pixel electrode over the organic resin layer and electrically connected to the second electrode,
wherein:
each of the first electrode and the second electrode comprises:
a first conductive barrier layer; and
a conductive layer comprising copper and comprising a region in contact with an upper surface of the first conductive barrier layer;
the semiconductor layer comprises:
a first region not overlapping with any of the first electrode and the second electrode;
a second region overlapping with the first electrode; and
a third region overlapping with the second electrode;
the first region of the semiconductor layer is positioned between the second region of the semiconductor layer and the third region of the semiconductor layer;
the first region of the semiconductor layer comprises a region in contact with the second insulating layer;
the first region of the semiconductor layer is thinner than the second region of the semiconductor layer and the third region of the semiconductor layer;
a lower end portion of the first conductive barrier layer of the first electrode and a lower end portion of the first conductive barrier layer of the second electrode face each other;
a lower end portion of the conductive layer of the first electrode and a lower end portion of the conductive layer of the second electrode face each other;
a distance between the lower end portion of the first conductive barrier layer of the first electrode and the lower end portion of the first conductive barrier layer of the second electrode is shorter than a distance between the lower end portion of the conductive layer of the first electrode and the lower end portion of the conductive layer of the second electrode;
the second electrode comprises:
a first region overlapping with the gate electrode;
a second region overlapping with the pixel electrode; and
a third region not overlapping with any of the gate electrode and the pixel electrode;
the first electrode comprises a first region and a second region each overlapping with the semiconductor layer; and
at least part of the second electrode is positioned between the first region of the first electrode and the second region of the first electrode.

22. The semiconductor device claim 21, wherein each of the first electrode and the second electrode comprises a region in contact with an upper surface of the semiconductor layer.

23. The semiconductor device claim 21, wherein the first conductive barrier layer is capable of suppressing diffusion of copper.

24. The semiconductor device claim 21, wherein the first conductive barrier layer comprises titanium.

25. The semiconductor device claim 21, wherein the first conductive barrier layer comprises a metal nitride.

26. The semiconductor device claim 21, wherein each of the first electrode and the second electrode comprises a second conductive barrier layer comprising a region in contact with an upper surface of the conductive layer.

27. The semiconductor device claim 21, wherein each of the first electrode and the second electrode comprises a region in contact with an end portion of the semiconductor layer.

28. The semiconductor device claim 21, wherein the semiconductor layer is an oxide semiconductor layer.

29. The semiconductor device claim 21, wherein the first insulating layer comprises:
a first layer comprising a silicon nitride; and
a second layer over the first layer and comprising a silicon oxide.

30. The semiconductor device claim 21, wherein the second insulating layer comprises:
a first layer comprising a silicon oxide; and
a second layer over the first layer and comprising a silicon nitride.

* * * * *